(12) United States Patent
Takahashi et al.

(10) Patent No.: US 11,215,682 B2
(45) Date of Patent: Jan. 4, 2022

(54) MAGNETIC SENSOR DEVICE HAVING A SOFT MAGNETIC STRUCTURE

(71) Applicant: TDK CORPORATION, Tokyo (JP)

(72) Inventors: Hirokazu Takahashi, Tokyo (JP); Kazuya Watanabe, Tokyo (JP)

(73) Assignee: TDK CORPORATION, Tokyo (JP)

( * ) Notice: Subject to any disclaimer, the term of this patent is extended or adjusted under 35 U.S.C. 154(b) by 80 days.

(21) Appl. No.: 16/694,129

(22) Filed: Nov. 25, 2019

(65) Prior Publication Data
US 2020/0209327 A1  Jul. 2, 2020

(30) Foreign Application Priority Data

Dec. 28, 2018 (JP) .............................. JP2018-248475

(51) Int. Cl.
*G01R 33/09* (2006.01)
(52) U.S. Cl.
CPC ......... *G01R 33/093* (2013.01); *G01R 33/091* (2013.01)
(58) Field of Classification Search
CPC .............. G11B 5/3932; G01R 33/0011; G01R 33/091; G01R 33/093
See application file for complete search history.

(56) References Cited

U.S. PATENT DOCUMENTS

| 5,581,427 A * | 12/1996 | Feng ................. G11B 5/00 360/327.1 |
| 2012/0200292 A1 | 8/2012 | Sugihara et al. |
| 2016/0341843 A1 | 11/2016 | Hull et al. |
| 2020/0209326 A1 * | 7/2020 | Watanabe .......... G01R 33/0206 |

FOREIGN PATENT DOCUMENTS

JP     H07-249518 A     9/1995

OTHER PUBLICATIONS

Jun. 30, 2020 Office Action issued in Japanese Patent Application No. 2018-248475.

* cited by examiner

*Primary Examiner* — Alesa Allgood
(74) *Attorney, Agent, or Firm* — Oliff PLC

(57) ABSTRACT

A magnetic sensor device includes a magnetic sensor, and a soft magnetic structure disposed near the magnetic sensor. The magnetic sensor and the soft magnetic structure are configured so that when an external magnetic field including a detection-target magnetic field is applied to the magnetic sensor, the external magnetic field is also applied to the soft magnetic structure, and when the soft magnetic structure has a magnetization, a magnetic field based on the magnetization of the soft magnetic structure is applied to the magnetic sensor. The soft magnetic structure has a stripe domain structure.

9 Claims, 25 Drawing Sheets

MAGNETIC SENSOR DEVICE HAVING A SOFT MAGNETIC STRUCTURE

BACKGROUND OF THE INVENTION

1. Field of the Invention

The present invention relates to a magnetic sensor device including a magnetic sensor and a soft magnetic structure.

2. Description of the Related Art

Magnetic sensors have been used for a variety of purposes. Some known magnetic sensors use a plurality of magnetic detection elements provided on a substrate. Examples of the magnetic detection elements include magnetoresistive elements.

US 2012/0200292 A1 discloses a geomagnetic sensor in which an X-axis magnetic sensor, a Y-axis magnetic sensor, and a Z-axis magnetic sensor are provided on a base. In this geomagnetic sensor, the Z-axis magnetic sensor includes magnetoresistive elements and soft magnetic bodies. The soft magnetic bodies convert vertical magnetic field components, which are in a direction parallel to the Z-axis, into horizontal magnetic field components in a direction perpendicular to the Z-axis, and supply the horizontal magnetic field components to the magnetoresistive elements.

JP H07-249518A describes a magnetic head including a soft magnetic thin film having a stripe domain structure. JP H07-249518A describes that even with a magnetic head including a soft magnetic thin film that is easy to exhibit uniaxial anisotropy within the film plane, a high radio-frequency permeability in all directions can be achieved by employing the stripe domain structure for the soft magnetic thin film.

Now, consider a magnetic sensor device including a first magnetic sensor for detecting a horizontal magnetic field component and a soft magnetic structure disposed horizontally close to the first magnetic sensor. The soft magnetic structure is formed of a soft magnetic material. The soft magnetic structure is not a component of the first magnetic sensor. An example of such a magnetic sensor device is the aforementioned geomagnetic sensor described in US 2012/0200292 A1. In the geomagnetic sensor disclosed therein, the X-axis magnetic sensor and the Y-axis magnetic sensor correspond to the first magnetic sensor, and the soft magnetic bodies of the Z-axis magnetic sensor correspond to the soft magnetic structure.

The foregoing magnetic sensor device has a problem that if the soft magnetic structure has a magnetic hysteresis characteristic, the magnetic hysteresis characteristic causes the detection value of the first magnetic sensor to exhibit a hysteresis characteristic, thereby causing a drop in the detection accuracy of the first magnetic sensor. This will be described in detail below. If the soft magnetic structure has a magnetic hysteresis characteristic, once the soft magnetic structure has been magnetized by an external magnetic field, a certain amount of magnetization remains in the soft magnetic structure even after the external magnetic field becomes zero. A magnetic field based on such magnetization is applied to the first magnetic sensor. As a result, the detection value of the first magnetic sensor at a zero external magnetic field differs from the ideal value. The direction and magnitude of the magnetization remaining in the soft magnetic structure at a zero external magnetic field vary depending on the direction and magnitude of the external magnetic field before the external magnetic field becomes zero. The detection value of the first magnetic sensor at a zero external magnetic field thus varies depending on the direction and magnitude of the external magnetic field before the external magnetic field becomes zero. This gives the detection value of the first magnetic sensor a hysteresis characteristic.

To improve the detection accuracy of the first magnetic sensor of the foregoing magnetic sensor device, no consideration has heretofore been given to optimizing the magnetic characteristics of the soft magnetic structure which is not a component of the first magnetic sensor.

As discussed above, JP H07-249518A describes a magnetic head including a soft magnetic thin film having a stripe domain structure. The soft magnetic thin film is a component of the magnetic head. Thus, the relationship between the magnetic head and the soft magnetic thin film in JP H07-249518A differs from the relationship between the first magnetic sensor and the soft magnetic structure in the foregoing magnetic sensor device.

SUMMARY OF THE INVENTION

It is an object of the present invention to provide a magnetic sensor device that can prevent a magnetic sensor from being degraded in the detection accuracy due to a magnetic hysteresis characteristic of a soft magnetic structure disposed near the magnetic sensor.

A magnetic sensor device of the present invention includes a first magnetic sensor for generating a first detection value corresponding to a first detection-target magnetic field, and a soft magnetic structure formed of a soft magnetic material. The first magnetic sensor and the soft magnetic structure are configured so that when the soft magnetic structure has a magnetization, a magnetic field based on the magnetization of the soft magnetic structure is applied to the first magnetic sensor. At least part of the soft magnetic structure has a stripe domain structure.

The magnetic sensor device of the present invention may further include a second magnetic sensor for generating a second detection value corresponding to a second detection-target magnetic field. In such a case, the first detection-target magnetic field may be a component of an external magnetic field and in a direction parallel to a first direction, and the second detection-target magnetic field may be a component of the external magnetic field and in a direction parallel to a second direction. The soft magnetic structure may be arranged not to overlap the first magnetic sensor but to overlap the second magnetic sensor as viewed in a direction parallel to the second direction.

The soft magnetic structure may include a magnetic field converter configured to receive the second detection-target magnetic field and output an output magnetic field component that is in a direction intersecting the second direction. The output magnetic field component has a strength having a correspondence with a strength of the second detection-target magnetic field. The second magnetic sensor may be configured to detect the strength of the output magnetic field component. The soft magnetic structure may further include at least one soft magnetic layer. The first direction and the second direction may be orthogonal to each other. Note that in the present invention, the "output magnetic field component" corresponds to a component of an output magnetic field vector, which is a vector representation of an output magnetic field outputted by the magnetic field converter, obtained by projecting the output magnetic field vector in a certain direction. To "output an output magnetic field component" is based on the fact that the output magnetic field contains an output magnetic field component which is a component in a certain direction.

When the magnetic sensor device of the present invention includes the second magnetic sensor, the magnetic sensor device may further include a third magnetic sensor for generating a third detection value corresponding to a third detection-target magnetic field. The third detection-target magnetic field may be a component of the external magnetic field and in a direction parallel to a third direction. The third magnetic sensor and the soft magnetic structure may be configured so that when the soft magnetic structure has a magnetization, a magnetic field based on the magnetization of the soft magnetic structure is applied to the third magnetic sensor. In such a case, the first to third directions may be orthogonal to each other.

In the magnetic sensor device of the present invention, the first magnetic sensor and the soft magnetic structure may be configured so that when an external magnetic field including the first detection-target magnetic field is applied to the first magnetic sensor, the external magnetic field is also applied to the soft magnetic structure. The external magnetic field may have a strength varying within a predetermined variable range.

In an orthogonal coordinate system having two orthogonal axes for representing an applied field strength and a magnetization-corresponding value, coordinates representing the applied field strength and the magnetization-corresponding value may move within a region enclosed by a major loop as the strength of the external magnetic field varies within the predetermined variable range. Here, the applied field strength is the strength of a magnetic field applied to the soft magnetic structure in a direction parallel to a predetermined direction, and the magnetization-corresponding value is a value corresponding to a component of the magnetization of the soft magnetic structure, the component being in the direction parallel to the predetermined direction. The major loop is, among loops traced by a path of the coordinates representing the applied field strength and the magnetization-corresponding value in the orthogonal coordinate system as the applied field strength is varied, a loop that is the largest in terms of area of the region enclosed by the loop. The predetermined variable range may be a range not more than 21.6 Oe in absolute value. Note that a magnetic flux density corresponding to a magnetic field having a strength of 1 Oe is 0.1 mT.

According to the magnetic sensor device of the present invention, at least part of the soft magnetic structure has a stripe domain structure. This makes it possible to prevent the first magnetic sensor from being degraded in the detection accuracy due to a magnetic hysteresis characteristic of the soft magnetic structure.

Other and further objects, features and advantages of the present invention will appear more fully from the following description.

DETAILED DESCRIPTION OF THE PREFERRED EMBODIMENT

Figure 1:
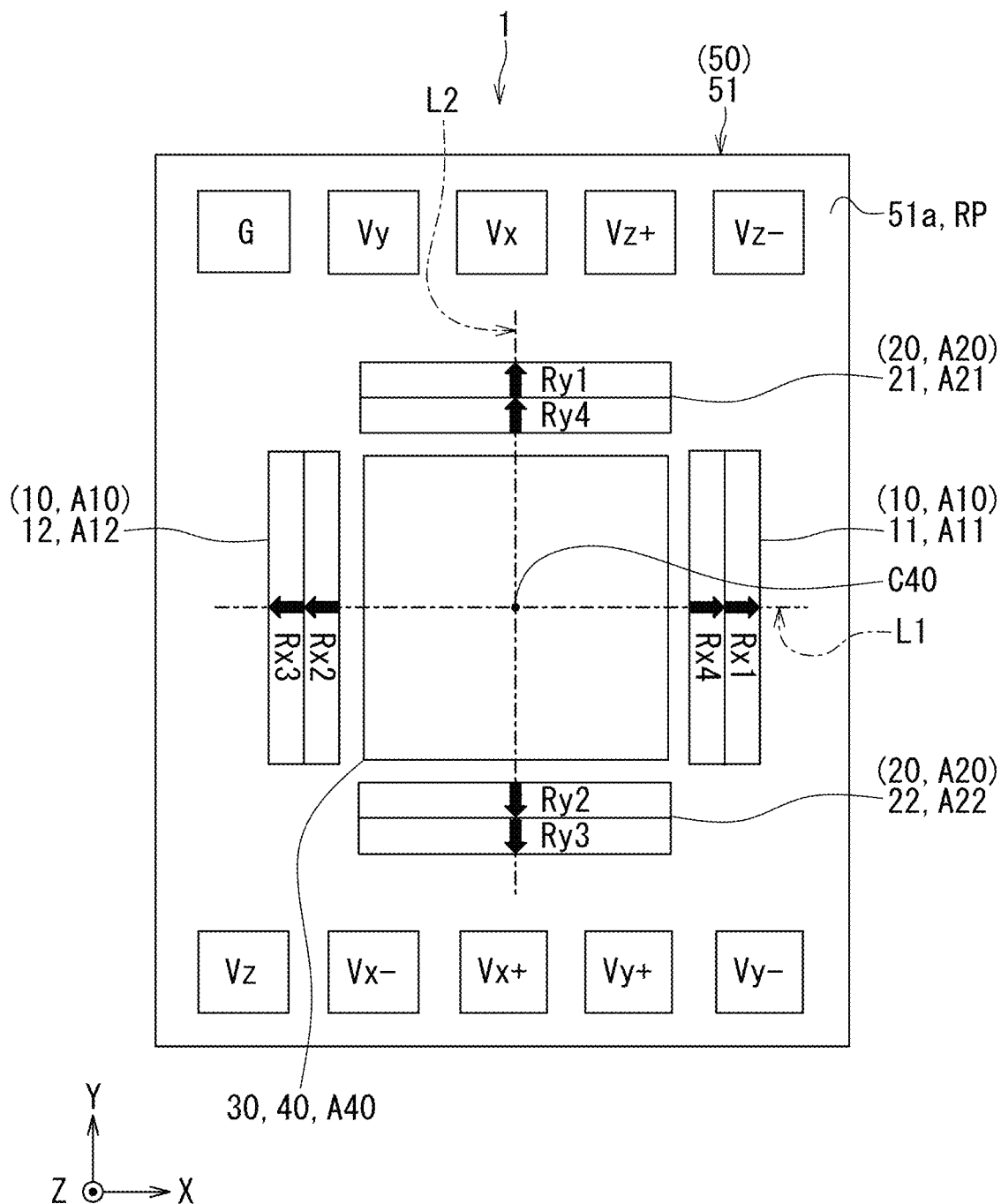
FIG. 1 is a plan view showing a schematic configuration of a magnetic sensor device according to an embodiment of the invention.

A preferred embodiment of the present invention will now be described in detail with reference to the drawings. First, reference is made to FIG. 1 to describe a schematic configuration of a magnetic sensor device according to the embodiment of the invention. The magnetic sensor device 1 according to the present embodiment is a device for detecting components of an external magnetic field that are in three mutually orthogonal directions.

The magnetic sensor device 1 includes three magnetic sensors 10, 20 and 30, a soft magnetic structure 40 formed of a soft magnetic material, and a support 50. Each of the magnetic sensors 10, 20 and 30 includes at least one magnetic detection element. The support 50 is a structure supporting the magnetic sensors 10, 20 and 30 and the soft magnetic structure 40. The support 50 includes a substrate 51 having a top surface 51a and a bottom surface opposite to each other.

X, Y, and Z directions are defined here as shown in FIG. 1. The X, Y and Z directions are mutually orthogonal directions. The X and Y directions are parallel to the top surface 51a of the substrate 51. The Z direction is perpendicular to the top surface 51a of the substrate 51 and directed from the bottom surface of the substrate 51 to the top surface 51a of the substrate 51. The opposite directions to the X, Y, and Z directions are defined as −X, −Y, and −Z directions, respectively. As used herein, the term "above" refers to positions located forward of a reference position in the Z direction, and "below" refers to positions opposite from the "above" positions with respect to the reference position. For each component of the magnetic sensor device 1, the term "top surface" refers to a surface of the component lying at the end thereof in the Z direction, and "bottom surface" refers to a surface of the component lying at the end thereof in the −Z direction.

The magnetic sensor 10 detects a detection-target magnetic field Hx and generates a detection value Sx corresponding to the detection-target magnetic field Hx. The detection-target magnetic field Hx has a direction parallel to a predetermined direction. In the present embodiment, specifically, the detection-target magnetic field Hx is a component of an external magnetic field and is in a direction parallel to the X direction. The X direction corresponds to the first direction in the present invention. The detection-target magnetic field Hx corresponds to the first detection-target magnetic field in the present invention. In the present embodiment, the strength of the detection-target magnetic field Hx is expressed as a positive value if the detection-target magnetic field Hx is in the X direction, and as a negative value if the detection-target magnetic field Hx is in the −X direction. The detection value Sx corresponds to the first detection value in the present invention.

The magnetic sensor 20 detects a detection-target magnetic field Hy and generates a detection value Sy corresponding to the detection-target magnetic field Hy. The detection-target magnetic field Hy is a component of the external magnetic field and is in a direction parallel to the Y direction. The Y direction corresponds to the third direction in the present invention. The detection-target magnetic field Hy corresponds to the third detection-target magnetic field in the present invention. In the present embodiment, the strength of the detection-target magnetic field Hy is expressed as a positive value if the detection-target magnetic field Hy is in the Y direction, and as a negative value if the detection-target magnetic field Hy is in the −Y direction. The detection value Sy corresponds to the third detection value in the present invention.

The magnetic sensor 30 detects a detection-target magnetic field Hz and generates a detection value Sz corresponding to the detection-target magnetic field Hz. The detection-target magnetic field Hz is a component of the external magnetic field and is in a direction parallel to the Z direction. The Z direction corresponds to the second direction in the present invention. The detection-target magnetic field Hz corresponds to the second detection-target magnetic field in the present invention. In the present embodiment, the strength of the detection-target magnetic field Hz is expressed as a positive value if the detection-target magnetic field Hz is in the Z direction, and as a negative value if the detection-target magnetic field Hz is in the −Z direction. The detection value Sz corresponds to the second detection value in the present invention.

Figure 5:
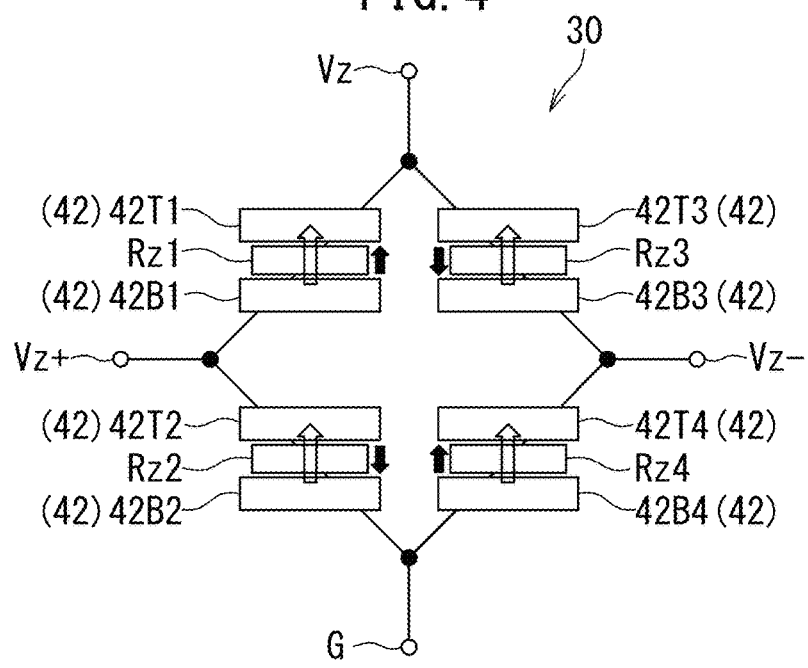
FIG. 5 is an explanatory diagram showing an example configuration of a magnetic field converter of the embodiment of the invention.
Figure 6:
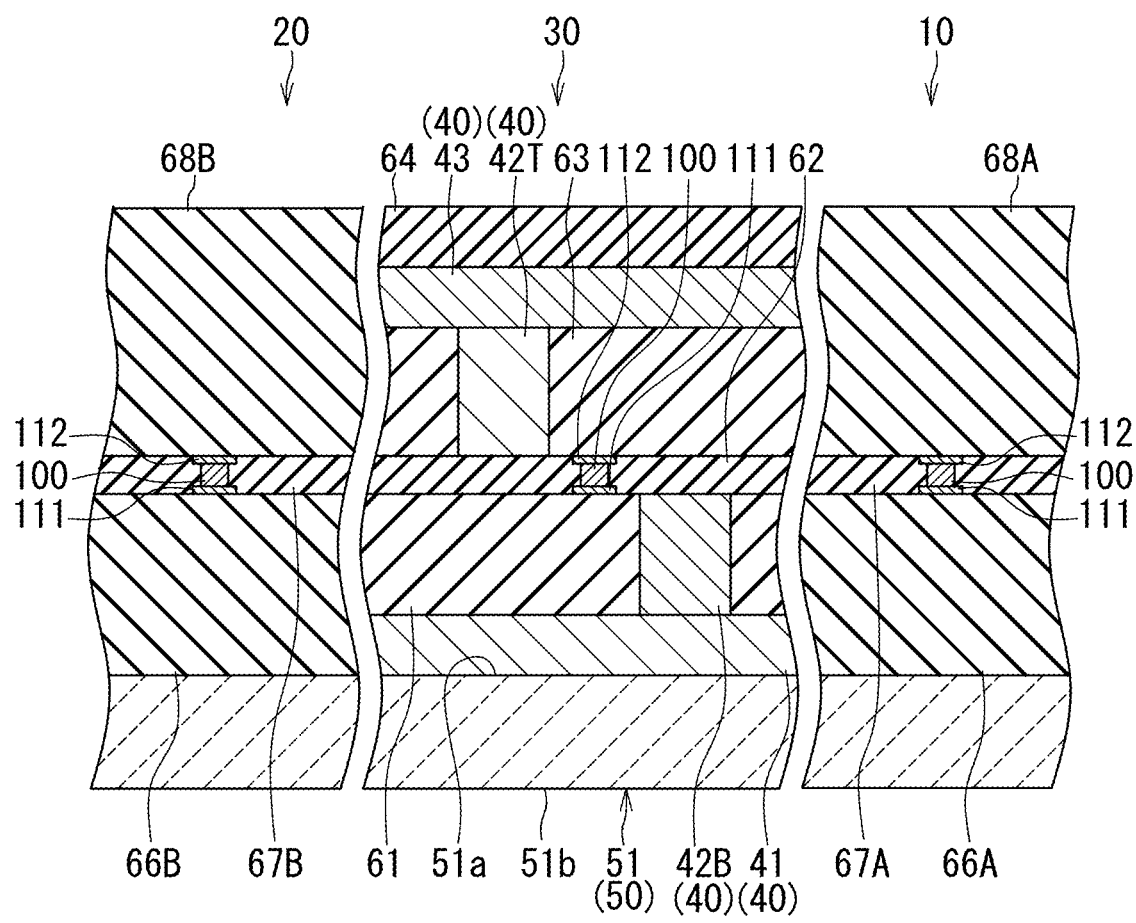
FIG. 6 is a cross-sectional view showing respective portions of three magnetic sensors and a soft magnetic structure of the embodiment of the invention.

The soft magnetic structure 40 includes a magnetic field converter 42 and at least one soft magnetic layer. The magnetic field converter 42 is shown in FIGS. 5 and 6, which will be described later. The magnetic field converter 42 is configured to receive the detection-target magnetic field Hz and output an output magnetic field component that is in a direction perpendicular to the Z direction. The strength of the output magnetic field component has a correspondence with the strength of the detection-target magnetic field Hz. The magnetic sensor 30 detects the strength of the detection-target magnetic field Hz by detecting the strength of the output magnetic field component. The soft magnetic structure 40 will be described in detail later. Note that in the present embodiment, the "output magnetic field component" corresponds to a component of an output magnetic field vector, which is a vector representation of an output magnetic field outputted by the magnetic field converter 42, obtained by projecting the output magnetic field vector in a direction perpendicular to the Z direction. To "output an output magnetic field component" is based on the fact that the output magnetic field contains an output magnetic field component which is a component in a direction perpendicular to the Z direction.

The magnetic sensors 10, 20 and 30 and the soft magnetic structure 40 are disposed on or above the top surface 51a of the substrate 51. The soft magnetic structure 40 is arranged not to overlap the magnetic sensor 10 or 20 but to overlap the magnetic sensor 30 as viewed in a direction parallel to the Z direction, e.g., as viewed from above.

The support 50 has a reference plane RP parallel to the X and Y directions. The reference plane RP is orthogonal to the Z direction. In the present embodiment, the reference plane RP is specifically the top surface 51a of the substrate 51.

The reference plane RP includes three different areas A10, A20, and A40. The area A10 is an area formed by vertically projecting the magnetic sensor 10 onto the reference plane RP. The area A20 is an area formed by vertically projecting the magnetic sensor 20 onto the reference plane RP. The area A40 is an area formed by vertically projecting the soft magnetic structure 40 onto the reference plane RP. Note that an area formed by vertically projecting the magnetic sensor 30 onto the reference plane RP coincides or substantially coincides with the area A40.

Here, two mutually orthogonal straight lines lying in the reference plane RP and passing through the centroid C40 of the area A40 will be referred to as a first straight line L1 and a second straight line L2. In the present embodiment, specifically, the first straight line L1 is parallel to the X direction, and the second straight line L2 is parallel to the Y direction.

In the present embodiment, the magnetic sensor 10 includes a first portion 11 and a second portion 12 located at different positions from each other. The area A10 includes a partial area A11 formed by vertically projecting the first portion 11 onto the reference plane RP, and a partial area A12 formed by vertically projecting the second portion 12 onto the reference plane RP. The partial areas A11 and A12 are located on two sides of the area A40 that are opposite to each other in a direction parallel to the first straight line L1.

The magnetic sensor 20 includes a first portion 21 and a second portion 22 located at different positions from each other. The area A20 includes a partial area A21 formed by vertically projecting the first portion 21 onto the reference plane RP, and a partial area A22 formed by vertically projecting the second portion 22 onto the reference plane RP. The partial areas A21 and A22 are located on two sides of the area A40 that are opposite to each other in a direction parallel to the second straight line L2.

In the present embodiment, both the partial areas A11 and A12 are located to be intersected by the first straight line L1. Both the partial areas A21 and A22 are located to be intersected by the second straight line L2.

It is preferred that no portion of the area A10 be intersected by the second straight line L2. Likewise, it is preferred that no portion of the area A20 be intersected by the first straight line L1.

In the present embodiment, in particular, the areas A10 and A20 as viewed from above have such a positional relationship that the area A10 coincides with the area A20 if the area A10 is rotated 90° around the centroid C40 of the area A40. In FIG. 1, if the partial areas A11 and A12 are rotated 90° counterclockwise around the centroid C40, the partial areas A11 and A12 coincide with the partial areas A21 and A22, respectively.

As shown in FIG. 1, the magnetic sensor device 1 further includes a plurality of terminals disposed on or above the top surface 51a of the substrate 51. The plurality of terminals include: a power supply terminal Vx and output terminals Vx+ and Vx− associated with the magnetic sensor 10; a power supply terminal Vy and output terminals Vy+ and Vy− associated with the magnetic sensor 20; a power supply terminal Vz and output terminals Vz+ and Vz− associated with the magnetic sensor 30; and a ground terminal G shared among the magnetic sensors 10, 20 and 30.

Figure 2:
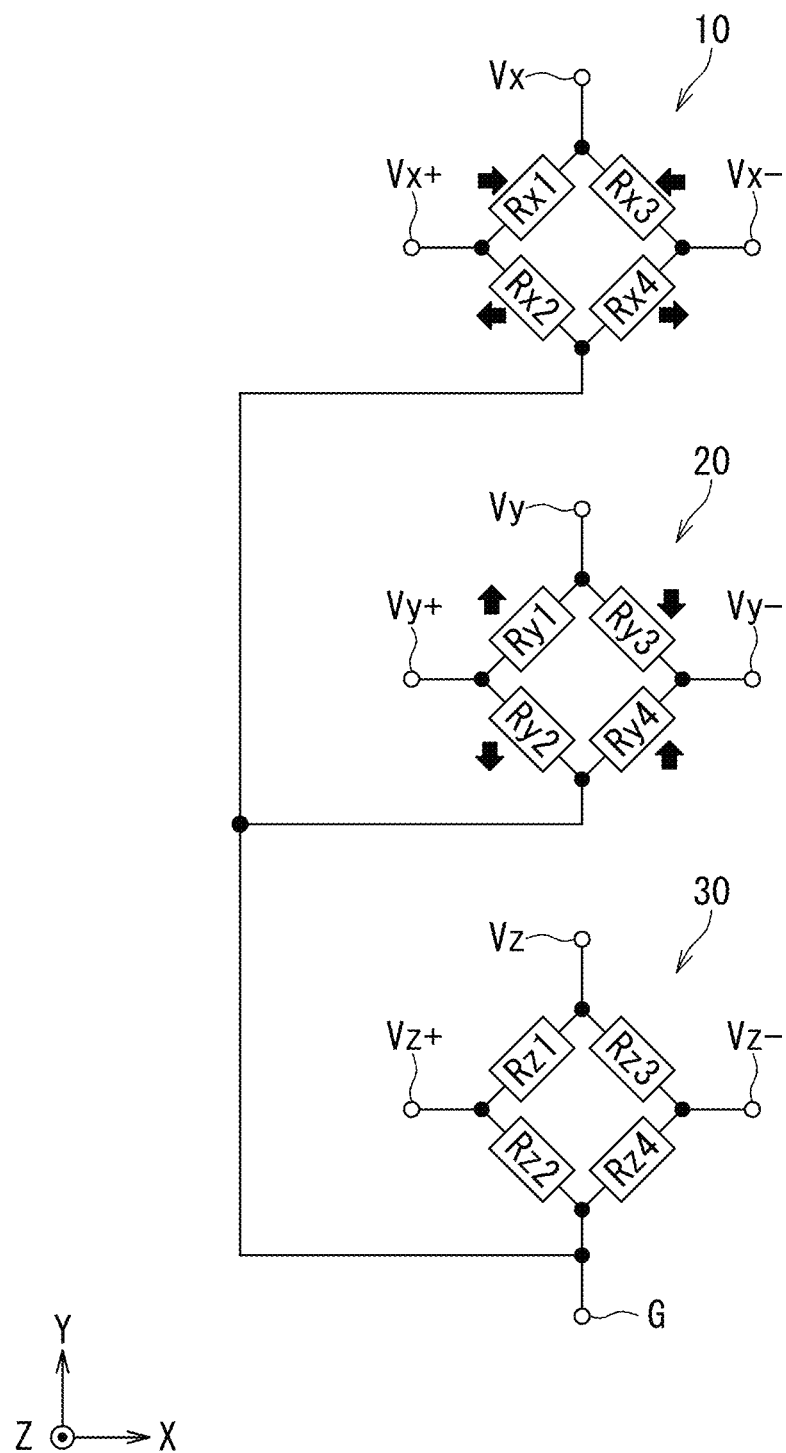
FIG. 2 is a circuit diagram showing an example circuit configuration of the magnetic sensor device according to the embodiment of the invention.

Reference is now made to FIG. 2 to describe an example circuit configuration of the magnetic sensor device 1. In this example, the magnetic sensor 10 includes four resistor sections Rx1, Rx2, Rx3, and Rx4 constituting a Wheatstone bridge circuit. Each of the resistor sections Rx1, Rx2, Rx3 and Rx4 has a resistance that varies depending on the detection-target magnetic field Hx. The resistor section Rx1 is provided between the power supply terminal Vx and the output terminal Vx+. The resistor section Rx2 is provided between the output terminal Vx+ and the ground terminal G. The resistor section Rx3 is provided between the power supply terminal Vx and the output terminal Vx−. The resistor section Rx4 is provided between the output terminal Vx− and the ground terminal G.

The magnetic sensor 20 includes four resistor sections Ry1, Ry2, Ry3, and Ry4 constituting a Wheatstone bridge circuit. Each of the resistor sections Ry1, Ry2, Ry3, and Ry4 has a resistance that varies depending on the detection-target magnetic field Hy. The resistor section Ry1 is provided between the power supply terminal Vy and the output terminal Vy+. The resistor section Ry2 is provided between the output terminal Vy+ and the ground terminal G. The resistor section Ry3 is provided between the power supply terminal Vy and the output terminal Vy−. The resistor section Ry4 is provided between the output terminal Vy− and the ground terminal G.

The magnetic sensor 30 includes four resistor sections Rz1, Rz2, Rz3, and Rz4 constituting a Wheatstone bridge circuit. Each of the resistor sections Rz1, Rz2, Rz3, and Rz4 has a resistance that varies depending on the output magnetic field component outputted from the magnetic field converter 42. The resistor section Rz1 is provided between the power supply terminal Vz and the output terminal Vz+. The resistor section Rz2 is provided between the output terminal Vz+ and the ground terminal G. The resistor section Rz3 is provided between the power supply terminal Vz and the output terminal Vz−. The resistor section Rz4 is provided between the output terminal Vz− and the ground terminal G.

Hereinafter, the term "resistor section R" is used to refer to any one of the resistor sections Rx1, Rx2, Rx3, Rx4, Ry1, Ry2, Ry3, Ry4, Rz1, Rz2, Rz3, and Rz4. Each resistor section R includes at least one magnetic detection element. In the present embodiment, the at least one magnetic detection element is specifically at least one magnetoresistive element. The magnetoresistive element will hereinafter be referred to as MR element.

In the present embodiment, the MR element is specifically a spin-valve MR element. The spin-valve MR element includes a magnetization pinned layer which is a magnetic layer having a magnetization whose direction is fixed, a free layer which is a magnetic layer having a magnetization whose direction is variable depending on the direction of an applied magnetic field, and a gap layer located between the magnetization pinned layer and the free layer. The spin-valve MR element may be a tunneling magnetoresistive (TMR) element or a giant magnetoresistive (GMR) element. In the TMR element, the gap layer is a tunnel barrier layer. In the GMR element, the gap layer is a nonmagnetic conductive layer. The resistance of the spin-valve MR element changes with the angle that the magnetization direction of the free layer forms with respect to the magnetization direction of the magnetization pinned layer. The resistance of the spin-valve MR element is at its minimum value when the foregoing angle is 0°, and at its maximum value when the foregoing angle is 180°. In each MR element, the free layer has a shape anisotropy that sets the direction of the magnetization easy axis to be orthogonal to the magnetization direction of the magnetization pinned layer.

In FIG. 2, the filled arrows indicate the magnetization directions of the magnetization pinned layers of the MR elements. In the example shown in FIG. 2, the magnetization pinned layers of the MR elements in the resistor sections Rx1 and Rx4 have magnetizations in the X direction, and the magnetization pinned layers of the MR elements in the resistor sections Rx2 and Rx3 have magnetizations in the −X direction.

The magnetization pinned layers of the MR elements in the resistor sections Ry1 and Ry4 have magnetizations in the Y direction, and the magnetization pinned layers of the MR elements in the resistor sections Ry2 and Ry3 have magnetizations in the −Y direction. A description will be given later as to the magnetization directions of the magnetization pinned layers of the MR elements in the resistor sections Rz1, Rz2, Rz3 and Rz4.

A potential difference between the output terminals Vx+ and Vx− has a correspondence with the detection-target magnetic field Hx. The magnetic sensor 10 generates the detection value Sx corresponding to the potential difference between the output terminals Vx+ and Vx−. The detection value Sx may be an amplitude-adjusted or offset-adjusted value of the potential difference between the output terminals Vx+ and Vx−. The potential difference between the output terminals Vx+ and Vx− may be converted into a numerical value representing a magnetic field strength, and the resulting value may be used as the detection value Sx.

A potential difference between the output terminals Vy+ and Vy− has a correspondence with the detection-target magnetic field Hy. The magnetic sensor 20 generates the detection value Sy corresponding to the potential difference between the output terminals Vy+ and Vy−. The detection value Sy may be an amplitude-adjusted or offset-adjusted value of the potential difference between the output terminals Vy+ and Vy−. The potential difference between the output terminals Vy+ and Vy− may be converted into a numerical value representing a magnetic field strength, and the resulting value may be used as the detection value Sy.

A potential difference between the output terminals Vz+ and Vz− has a correspondence with the detection-target magnetic field Hz. The magnetic sensor 30 generates the detection value Sz corresponding to the potential difference between the output terminals Vz+ and Vz−. The detection value Sz may be an amplitude-adjusted or offset-adjusted value of the potential difference between the output terminals Vz+ and Vz−. The potential difference between the output terminals Vz+ and Vz− may be converted into a numerical value representing a magnetic field strength, and the resulting value may be used as the detection value Sz.

Reference is now made to FIG. 1 to describe an example layout of the resistor sections Rx1, Rx2, Rx3, Rx4, Ry1, Ry2, Ry3, and Ry4. In this example, the first portion 11 of the magnetic sensor 10 includes the resistor sections Rx1 and Rx4, and the second portion 12 of the magnetic sensor 10 includes the resistor sections Rx2 and Rx3. The first portion 21 of the magnetic sensor 20 includes the resistor sections Ry1 and Ry4, and the second portion 22 of the magnetic sensor 20 includes the resistor sections Ry2 and Ry3.

In FIG. 1, the filled arrows indicate the magnetization directions of the magnetization pinned layers of the MR elements. In the example shown in FIG. 1, in each of the first portion 11 of the magnetic sensor 10, the second portion 12 of the magnetic sensor 10, the first portion 21 of the magnetic sensor 20, and the second portion 22 of the magnetic sensor 20, the magnetization pinned layers of the MR elements included therein have the same magnetization direction. Such an example makes it easy to set the magnetization directions of the magnetization pinned layers in a plurality of MR elements.

An example configuration of MR elements will now be described with reference to FIG. 3. An MR element 100 shown in FIG. 3 includes an antiferromagnetic layer 101, a magnetization pinned layer 102, a gap layer 103, and a free layer 104 which are stacked in this order, from closest to farthest from the substrate 51. The antiferromagnetic layer 101 is formed of an antiferromagnetic material, and is in exchange coupling with the magnetization pinned layer 102 to thereby pin the magnetization direction of the magnetization pinned layer 102.

Figure 3:
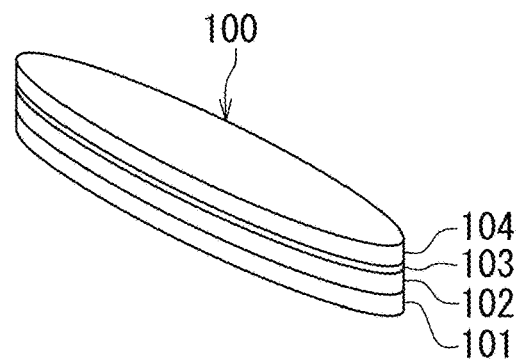
FIG. 3 is a perspective view of a magnetoresistive element of the embodiment of the invention.

It should be appreciated that the layers 101 to 104 of the MR element 100 may be stacked in the reverse order to that shown in FIG. 3. The magnetization pinned layer 102 need not necessarily be a single ferromagnetic layer but may have an artificial antiferromagnetic structure including two ferromagnetic layers and a nonmagnetic metal layer interposed between the two ferromagnetic layers. The MR element 100 may be configured without the antiferromagnetic layer 101. The magnetic detection element may be an element for detecting a magnetic field other than the MR element, such as a Hall element or a magnetic impedance element.

Figure 4:
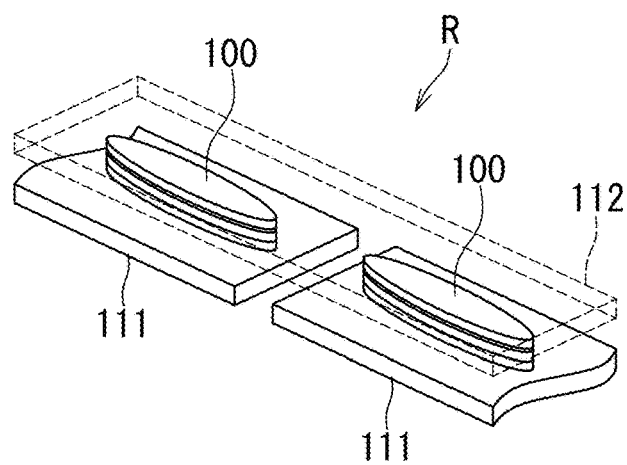
FIG. 4 is a perspective view of part of a resistor section of the embodiment of the invention.

Next, an example configuration of the resistor section R will be described with reference to FIG. 4. In this example, the resistor section R includes a plurality of MR elements 100 connected in series. The resistor section R further includes one or more connection layers for electrically connecting two MR elements 100 that are adjacent to each other in circuit configuration, so that the plurality of MR elements 100 are connected in series. In the example shown in FIG. 4 the resistor section R includes, as the one or more connection layers, one or more lower connection layers 111 and one or more upper connection layers 112. The lower connection layer 111 is in contact with the bottom surfaces of two MR elements 100 adjacent to each other in circuit configuration, and electrically connects the two MR elements 100. The upper connection layer 112 is in contact with the top surfaces of two MR elements 100 adjacent to each other in circuit configuration, and electrically connects the two MR elements 100.

Next, an example configuration of the magnetic field converter 42 of the soft magnetic structure 40 will be described with reference to FIG. 5. In this example, the magnetic field converter 42 includes: a lower yoke 42B1 and an upper yoke 42T1 associated with the resistor section Rz1; a lower yoke 42B2 and an upper yoke 42T2 associated with the resistor section Rz2; a lower yoke 42B3 and an upper yoke 42T3 associated with the resistor section Rz3; and a lower yoke 42B4 and an upper yoke 42T4 associated with the resistor section Rz4.

The lower yokes 42B1, 42B2, 42B3 and 42B4 and the upper yokes 42T1, 42T2, 42T3 and 42T4 each have a rectangular parallelepiped shape elongated in a direction perpendicular to the Z direction.

The lower yoke 42B1 and the upper yoke 42T1 are located near the resistor section Rz1. The lower yoke 42B1 is located closer to the top surface 51a of the substrate 51 than the resistor section Rz1. The upper yoke 42T1 is located farther from the top surface 51a of the substrate 51 than the resistor section Rz1. As viewed from above, the resistor section Rz1 lies between the lower yoke 42B1 and the upper yoke 42T1.

The lower yoke 42B2 and the upper yoke 42T2 are located near the resistor section Rz2. The lower yoke 42B2 is located closer to the top surface 51a of the substrate 51 than is the resistor section Rz2. The upper yoke 42T2 is located farther from the top surface 51a of the substrate 51 than the resistor section Rz2. As viewed from above, the resistor section Rz2 lies between the lower yoke 42B2 and the upper yoke 42T2.

The lower yoke 42B3 and the upper yoke 42T3 are located near the resistor section Rz3. The lower yoke 42B3 is located closer to the top surface 51a of the substrate 51 than the resistor section Rz3. The upper yoke 42T3 is located farther from the top surface 51a of the substrate 51 than the resistor section Rz3. As viewed from above, the resistor section Rz3 lies between the lower yoke 42B3 and the upper yoke 42T3.

The lower yoke 42B4 and the upper yoke 42T4 are located near the resistor section Rz4. The lower yoke 42B4 is located closer to the top surface 51a of the substrate 51 than the resistor section Rz4. The upper yoke 42T4 is located farther from the top surface 51a of the substrate 51 than the resistor section Rz4. As viewed from above, the resistor section Rz4 lies between the lower yoke 42B4 and the upper yoke 42T4.

The output magnetic field component outputted by the magnetic field converter 42 contains a magnetic field component that is generated by the lower yoke 42B1 and the upper yoke 42T1 and applied to the resistor section Rz1, a magnetic field component that is generated by the lower yoke 42B2 and the upper yoke 42T2 and applied to the resistor section Rz2, a magnetic field component that is generated by the lower yoke 42B3 and the upper yoke 42T3 and applied to the resistor section Rz3, and a magnetic field component that is generated by the lower yoke 42B4 and the upper yoke 42T4 and applied to the resistor section Rz4.

In FIG. 5, the four hollow arrows indicate the direction of the magnetic field components applied to the resistor sections Rz1, Rz2, Rz3 and Rz4 when the detection-target magnetic field Hz is in the Z direction. On the other hand, in FIG. 5 the four filled arrows indicate the magnetization directions of the magnetization pinned layers 102 of the MR elements 100 of the resistor sections Rz1, Rz2, Rz3 and Rz4, respectively. The magnetization directions of the magnetization pinned layers 102 of the MR elements 100 of the resistor sections Rz1 and Rz4 are the same as the directions of the magnetic field components that are applied to the resistor sections Rz1 and Rz4, respectively, when the detection-target magnetic field Hz is in the Z direction. The magnetization directions of the magnetization pinned layers 102 of the MR elements 100 of the resistor sections Rz2 and Rz3 are opposite to the directions of the magnetic field components that are applied to the resistor sections Rz2 and Rz3, respectively, when the detection-target magnetic field Hz is in the Z direction.

Now, the function of the magnetic sensor 30 will be described. When there is no detection-target magnetic field Hz, the magnetization direction of the free layer 104 of each MR element 100 in the resistor sections Rz1, Rz2, Rz3 and Rz4 is perpendicular to the magnetization direction of the magnetization pinned layer 102.

If the detection-target magnetic field Hz is in the Z direction, the magnetization direction of the free layer 104 of each MR element 100 in the resistor sections Rz1 and Rz4 tilts toward the magnetization direction of the magnetization pinned layer 102 from the direction perpendicular to the magnetization direction of the magnetization pinned layer 102. On the other hand, the magnetization direction of the free layer 104 of each MR element 100 in the resistor sections Rz2 and Rz3 tilts toward a direction opposite to the magnetization direction of the magnetization pinned layer 102 from the direction perpendicular to the magnetization direction of the magnetization pinned layer 102. As a result, the resistor sections Rz1 and Rz4 decrease in resistance while the resistor sections Rz2 and Rz3 increase in resistance, compared to when there is no detection-target magnetic field Hz.

In contrast to this, if the detection-target magnetic field Hz is in the −Z direction, the resistor sections Rz1 and Rz4 increase in resistance while the resistor sections Rz2 and Rz3 decrease in resistance, compared to when there is no detection-target magnetic field Hz.

The amount of change in the resistance of each of the resistor sections Rz1, Rz2, Rz3 and Rz4 depends on the strength of the detection-target magnetic field Hz.

Changes in the direction and strength of the detection-target magnetic field Hz cause the resistor sections Rz1, Rz2, Rz3 and Rz4 to change in resistance such that the resistor sections Rz1 and Rz4 increase in resistance while the second and third resistor sections Rz2 and Rz3 decrease in resistance, or such that the resistor sections Rz1 and Rz4 decrease in resistance while the resistor sections Rz2 and Rz3 increase in resistance. This causes a change in a potential difference between the output terminals Vz+ and Vz−. It is thus possible to detect the detection-target magnetic field Hz based on the potential difference.

Reference is now made to FIG. 6 to describe an example of configurations of the magnetic sensors 10, 20 and 30 and the soft magnetic structure 40. FIG. 6 shows a portion of each of the magnetic sensors 10, 20 and 30 and the soft magnetic structure 40. In this example, the magnetic sensors 10, 20 and 30 and the soft magnetic structure 40 are disposed on the substrate 51. The substrate 51 has the top surface 51a and the bottom surface 51b.

The magnetic sensor 10 includes insulating layers 66A, 67A and 68A each formed of an insulating material, in addition to the resistor sections Rx1, Rx2, Rx3 and Rx4. The insulating layer 66A lies on the top surface 51a of the substrate 51. The resistor sections Rx1, Rx2, Rx3 and Rx4 are disposed on the insulating layer 66A. FIG. 6 shows one of the MR elements 100 included in the resistor sections Rx1, Rx2, Rx3 and Rx4, and the upper and lower connection layers 112 and 111 connected to the MR element 100. The insulating layer 67A lies on the top surface 51a of the substrate 51 and surrounds the resistor sections Rx1, Rx2, Rx3 and Rx4. The insulating layer 68A covers the resistor sections Rx1, Rx2, Rx3 and Rx4 and the insulating layer 67A.

The magnetic sensor 20 has a configuration similar to that of the magnetic sensor 10. To be more specific, the magnetic sensor 20 includes insulating layers 66B, 67B and 68B each formed of an insulating material, in addition to the resistor sections Ry1, Ry2, Ry3 and Ry4. The insulating layer 66B lies on the top surface 51a of the substrate 51. The resistor sections Ry1, Ry2, Ry3 and Ry4 are disposed on the insulating layer 66B. FIG. 6 shows one of the MR elements 100 included in the resistor sections Ry1, Ry2, Ry3 and Ry4, and the upper and lower connection layers 112 and 111 connected to the MR element 100. The insulating layer 67B lies on the top surface 51a of the substrate 51 and surrounds the resistor sections Ry1, Ry2, Ry3 and Ry4. The insulating layer 68B covers the resistor sections Ry1, Ry2, Ry3 and Ry4 and the insulating layer 67B.

The magnetic sensor 30 includes insulating layers 61, 62, 63 and 64 each formed of an insulating material, in addition to the resistor sections Rz1, Rz2, Rz3 and Rz4. In the example shown in FIG. 6, the soft magnetic structure 40 includes the magnetic-field converter 42 and two soft magnetic layers 41 and 43.

The magnetic field converter 42 includes the upper yokes 42T1, 42T2, 42T3 and 42T4 and the lower yokes 42B1, 42B2, 42B3 and 42B4, all of which are shown in FIG. 5. In FIG. 6, the reference sign 42B represents one of the lower yokes 42B1, 42B2, 42B3 and 42B4, and the reference sign 42T represents a corresponding one of the upper yokes 42T1, 42T2, 42T3 and 42T4.

The soft magnetic layer 41 lies on the top surface 51a of the substrate 51. The lower yokes 42B1, 42B2, 42B3 and 42B4 are disposed on the soft magnetic layer 41. The insulating layer 61 lies on the soft magnetic layer 41 and surrounds the lower yokes 42B1, 42B2, 42B3 and 42B4.

The resistor sections Rz1, Rz2, Rz3 and Rz4 are disposed on the insulating layer 61. FIG. 6 shows one of the MR elements 100 included in the resistor sections Rz1, Rz2, Rz3 and Rz4, and the upper and lower connection layers 112 and 111 connected to the MR element 100. The insulating layer 62 lies on the lower yokes 42B1, 42B2, 42B3 and 42B4 and the insulating layer 61, and surrounds the resistor sections Rz1, Rz2, Rz3 and Rz4.

The upper yokes 42T1, 42T2, 42T3 and 42T4 are disposed on the insulating layer 62. The insulating layer 63 lies on the resistor sections Rz1, Rz2, Rz3 and Rz4 and the insulating layer 62, and surrounds the upper yokes 42T1, 42T2, 42T3 and 42T4.

The soft magnetic layer 43 lies on the upper yokes 42T1, 42T2, 42T3 and 42T4 and the insulating layer 63. The insulating layer 64 covers the soft magnetic layer 43.

The soft magnetic layers 41 and 43 have the function of absorbing a magnetic flux corresponding to a magnetic field other than the output magnetic field component outputted from the magnetic field converter 42, and thereby preventing the magnetic field from being applied to the magnetic sensor 30.

As viewed from above, the soft magnetic layers 41 and 43 extend across the entire area or almost the entire area of the magnetic sensor 30. Both of an area formed by vertically projecting the soft magnetic layer 41 onto the top surface 51a of the substrate 51, i.e., the reference plane RP, and an area formed by vertically projecting the soft magnetic layer 43 onto the reference plane RP coincide with the area A40. An area formed by vertically projecting the magnetic sensor 30 onto the reference plane RP coincides or almost coincides with the area A40.

In the example shown in FIG. 6, all the magnetic detection elements or MR elements 100 included in the magnetic sensors 10, 20 and 30 are located at equal distances from the top surface 51a of the substrate 51, i.e., the reference plane RP.

The magnetic field converter 42 may include only either the lower yokes 42B1, 42B2, 42B3 and 42B4 or the upper yokes 42T1, 42T2, 42T3 and 42T4. The soft magnetic structure 40 may include only either one of the soft magnetic layers 41 and 43.

In the present embodiment, the soft magnetic structure 40 is located near the magnetic sensors 10 and 20. The magnetic sensors 10 and 20 and the soft magnetic structure 40 are configured so that: when an external magnetic field including the detection-target magnetic field Hx is applied to the magnetic sensor 10, the external magnetic field is also applied to the soft magnetic structure 40; when an external magnetic field including the detection-target magnetic field Hy is applied to the magnetic sensor 20, the external magnetic field is also applied to the soft magnetic structure 40; and when the soft magnetic structure 40 has a magnetization, a magnetic field based on the magnetization of the soft magnetic structure 40 is applied to the magnetic sensors 10 and 20. At least part of the soft magnetic structure 40 has a stripe domain structure.

A stripe domain structure refers to a domain structure including first and second types of domains that are both slender and are alternately arranged as viewed in one direction. In a magnetic film having a stripe domain structure with no magnetic field applied thereto, the spontaneous magnetization of the first type of domains and that of the second type of domains contain components in mutually opposite directions.

The stripe domain structure that the at least part of the soft magnetic structure 40 has will hereinafter be referred to as the stripe domain structure of the soft magnetic structure 40. In particular, the stripe domain structure of the soft magnetic structure 40 is a domain structure including first and second types of domains that are both slender and are alternately arranged as viewed in a direction parallel to the Z direction, e.g., as viewed from above. In connection with the stripe domain structure of the soft magnetic structure 40, the direction in which the first and second types of domains extend as viewed from above will be referred to as a stripe direction. When no magnetic field is applied to the soft magnetic structure 40, the spontaneous magnetization of the first type of domains contains a component in the stripe direction and a component in the Z direction, and the spontaneous magnetization of the second type of domains contains a component in the stripe direction and a component in the −Z direction. In connection with the stripe domain structure of the soft magnetic structure 40, the first type of domains will be referred to as first domains, the magnetization of the first domains will be referred to as first magnetization, the second type of domains will be referred to as second domains, and the magnetization of the second domains will be referred to as second magnetization.

The soft magnetic structure 40 may include a plurality of portions having stripe domain structures of mutually different stripe directions. The soft magnetic structure 40 may include a portion or portions having a stripe domain structure and a portion or portions having no stripe domain structure. In such a case, the ratio of the volume of the portion(s) having a stripe domain structure to the volume of the entire soft magnetic structure 40 is preferably 50% or more.

Characteristics of a hysteresis loop of the soft magnetic structure 40 and behavior of the stripe domain structure will now be qualitatively described with reference to FIG. 7. The strength of a magnetic field applied to the soft magnetic structure 40 in a direction parallel to a predetermined direction will be referred to as an applied field strength. A value corresponding to a component of the magnetization of the soft magnetic structure 40, the component being in the direction parallel to the predetermined direction, will be referred to as a magnetization-corresponding value. In an orthogonal coordinate system having two orthogonal axes for representing the applied field strength and the magnetization-corresponding value, one of loops traced by a path of coordinates representing the applied field strength and the magnetization-corresponding value as the applied field strength is varied will be referred to as a major loop, the major loop being the largest among the foregoing loops in terms of area of the region enclosed by it.

In the present embodiment, the whole or part of the soft magnetic structure 40 is taken as the portion to be evaluated for magnetization (hereinafter referred to as the magnetization-evaluation subject portion), and the product of a component of the volume magnetization of the magnetization-evaluation subject portion in a direction parallel to a predetermined direction and the volume of the magnetization-evaluation subject portion is taken as the magnetization-corresponding value. In particular, in the present embodiment, the product of a component of the volume magnetization of the magnetization-evaluation subject portion in a direction parallel to the X direction and the volume of the magnetization evaluation subject portion will be referred to as an X-direction magnetization-corresponding value Mx. The product of a component of the volume magnetization of the magnetization-evaluation subject portion in a direction parallel to the Y direction and the volume of the magnetization-evaluation subject portion will be referred to as a Y-direction magnetization-corresponding value My.

Figure 7:
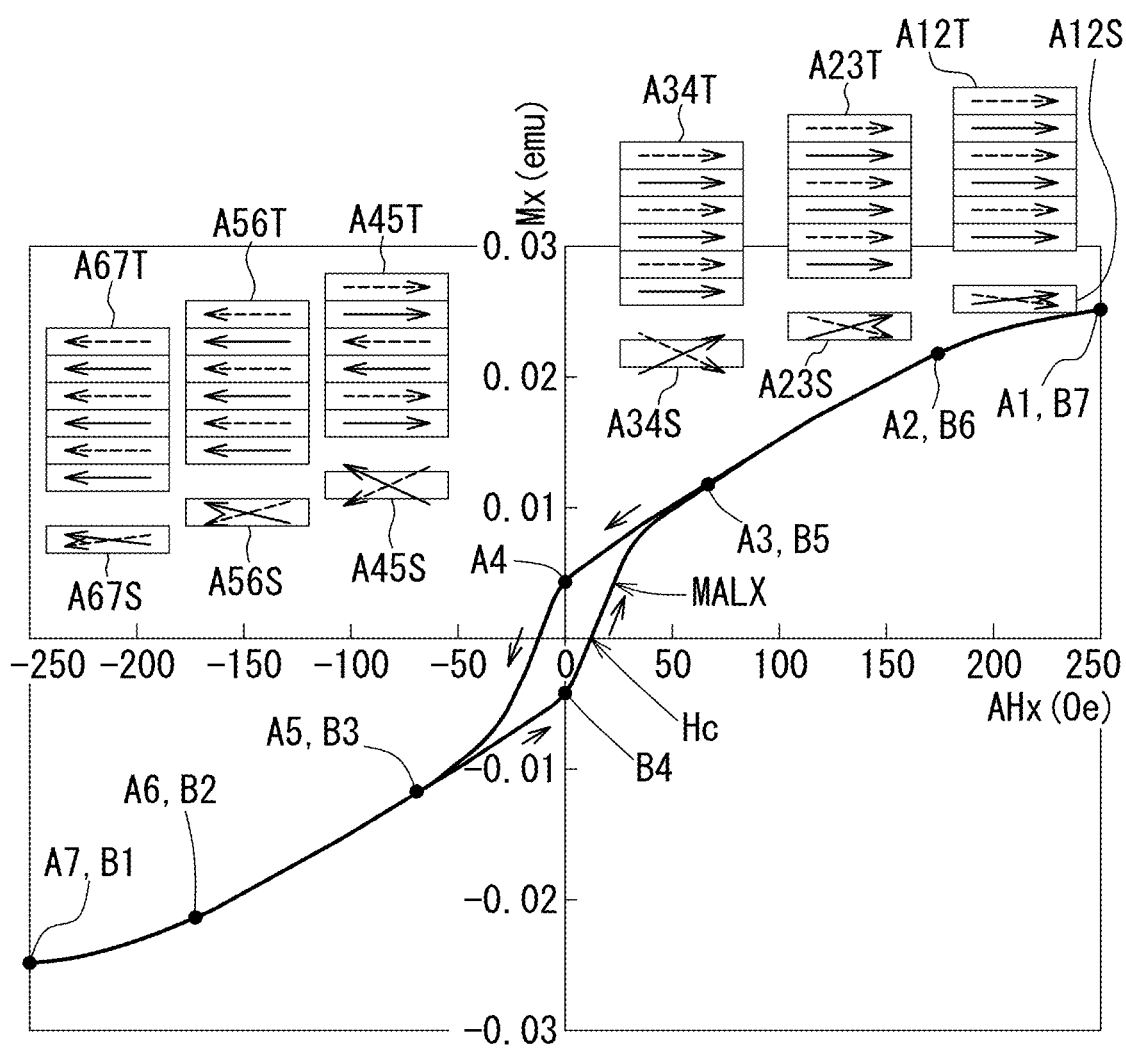
FIG. 7 is an explanatory diagram for qualitatively explaining the characteristics of a hysteresis loop of the soft magnetic structure and the behavior of a stripe domain structure in the embodiment of the invention.

FIG. 7 shows an example of the major loop of the soft magnetic structure 40. In this example, the stripe direction of the stripe domain structure of the soft magnetic structure 40 is parallel to the X direction, and the direction of the magnetic field applied to the soft magnetic structure 40 is also parallel to the X direction. The strength of the magnetic field applied to the soft magnetic structure 40 in the direction parallel to the X direction will be referred to as an X-direction applied field strength AHx. FIG. 7 shows an orthogonal coordinate system having two orthogonal axes for representing the X-direction applied field strength AHx and the X-direction magnetization-corresponding value Mx. In this orthogonal coordinate system, the coordinates representing the X-direction applied field strength AHx and the X-direction magnetization-corresponding value Mx will be referred to as coordinates (AHx, Mx). In FIG. 7, the horizontal axis represents the X-direction applied field strength AHx (Oe), and the vertical axis represents the X-direction magnetization-corresponding value Mx (emu). In FIG. 7, the curve denoted by the symbol MALX is the major loop. The X-direction applied field strength AHx in FIG. 7 is expressed as a positive value if the magnetic field applied to the soft magnetic structure 40 is in the X direction, and as a negative value if the magnetic field applied to the soft magnetic structure 40 is in the −X direction. The X-direction magnetization-corresponding value Mx in FIG. 7 is expressed as a positive value if the magnetization of the soft magnetic structure 40 is in the X direction, and as a negative value if the magnetization of the soft magnetic structure 40 is in the −X direction. The arrows shown near the major loop MALX indicate the direction of movement of the coordinates (AHx, Mx) on the major loop MALX.

In FIG. 7, a point A1 on the major loop MALX corresponds to a state where the X-direction magnetization-corresponding value Mx is saturated at a positive value. As the X-direction applied field strength AHx is decreased from the state of the point A1, the coordinates (AHx, Mx) on the major loop MALX go through points A2, A3, A4, A5, and A6 in order and reach a point A7. The point A2 corresponds to a state where the X-direction magnetization-corresponding value Mx is almost saturated at a positive value. The point A4 corresponds to a state where the X-direction applied field strength AHx is 0. The point A6 corresponds to a state where the X-direction magnetization-corresponding value Mx is almost saturated at a negative value. The point A7 corresponds to a state where the X-direction magnetization-corresponding value Mx is saturated at a negative value.

In FIG. 7, a point B1 is the same as the point A7. As the X-direction applied field strength AHx is increased from the state of the point B1, the coordinates (AHx, Mx) on the major loop MALX go through points B2, B3, B4, B5, and B6 in order and reach a point B7. The point B2 is the same as the point A6. The point B3 is the same as the point A5. The point B4 corresponds to a state where the X-direction applied field strength AHx is 0. The point B5 is the same as the point A3. The point B6 is the same as the point A2. The point B7 is the same as the point A1.

In FIG. 7, reference signs A12T, A23T, A34T, A45T, A56T, and A67T represent schematic views of part of the stripe domain structure as viewed from above. Reference signs A12S, A23S, A34S, A45S, A56S, and A67S represent schematic views of part of the stripe domain structure as viewed in the Y direction. The schematic views A12T and A12S correspond to a state between the points A1 and A2. The schematic views A23T and A23S correspond to a state between the points A2 and A3. The schematic views A34T and A34S correspond to a state between the points A3 and A4. The schematic views A45T and A45S correspond to a state between the points A4 and A5. The schematic views A56T and A56S correspond to a state between the points A5 and A6. The schematic views A67T and A67S correspond to a state between the points A6 and A7.

In the schematic views A12T, A23T, A34T, A45T, A56T, and A67T, rectangles containing solid-lined arrows represent the first domains, and rectangles containing broken-lined arrows represent the second domains. In all the schematic views, the solid-lined arrows indicate the direction of the first magnetization, and the broken-lined arrows indicate the direction of the second magnetization.

Between the points A1 and A2, both the first magnetization and the second magnetization are substantially in the X direction.

Between the points A2 and A4, the first magnetization contains a component in the X direction and a component in the Z direction, and the second magnetization contains a component in the X direction and a component in the −Z direction. Between the points A2 and A4, as the X-direction applied field strength AHx decreases, the component in the X direction of the first magnetization and the component in the X direction of the second magnetization decrease, whereas the component in the Z direction of the first magnetization and the component in the −Z direction of the second magnetization increase. Between the points A2 and A4, the foregoing behavior of the first magnetization and the second magnetization causes the X-direction magnetization-corresponding value Mx to decrease as the X-direction applied field strength AHx decreases. At the point A4, the X-direction magnetization-corresponding value Mx has a positive value.

Between the points A4 and A5, some of the first domains change from the state where the first magnetization contains the component in the X direction and the component in the Z direction to a state where the first magnetization contains a component in the −X direction and the component in the Z direction, or into the second domains having the second magnetization containing a component in the −X direction and the component in the −Z direction. Between the points A4 and A5, some of the second domains change from the state where the second magnetization contains the component in the X direction and the component in the −Z direction to a state where the second magnetization contains the component in the −X direction and the component in the −Z direction, or into the first domains having the first magnetization containing the component in the −X direction and the component in the Z direction. The numbers of the first and the second domains to undergo the above-described changes increase as the X-direction applied field strength AHx decreases. All or almost all of the first and second domains at the point A4 have completed such changes at the point A5. Between the points A4 and A5, the foregoing behavior of the stripe domain structure causes the X-direction magnetization-corresponding value Mx to decrease as the X-direction applied field strength AHx decreases. Between the points A4 and A5, the ratio of the amount of change in the X-direction magnetization-corresponding value Mx to the amount of change in the X-direction applied field strength AHx is higher in absolute value, compared to that between the points A2 and A4.

Between the points A5 and A6, the first magnetization contains the component in the −X direction and the component in the Z direction, whereas the second magnetization contains the component in the −X direction and the component in the −Z direction. Between the points A5 and A6, as the X-direction applied field strength AHx decreases, the component in the −X direction of the first magnetization and the component in the −X direction of the second magnetization increase, whereas the component in the Z direction of the first magnetization and the component in the −Z direction of the second magnetization decrease. Between the points A5 and A6, the foregoing behavior of the first magnetization and the second magnetization causes the X-direction magnetization-corresponding value Mx to decrease as the X-direction applied field strength AHx decreases. Between the points A5 and A6, the ratio of the amount of change in the X-direction magnetization-corresponding value Mx to the amount of change in the X-direction applied field strength AHx is lower in absolute value, compared to that between the points A4 and A5.

Between the points A6 and A7 and between the points B1 and B2, both the first magnetization and the second magnetization are substantially in the −X direction.

Between the points B2 and B4, the first magnetization contains the component in the −X direction and the component in the Z direction, whereas the second magnetization contains the component in the −X direction and the component in the −Z direction. Between the points B2 and B4, as the X-direction applied field strength AHx increases, the component in the −X direction of the first magnetization and the component in the −X direction of the second magnetization decrease, whereas the component in the Z direction of the first magnetization and the component in the −Z direction of the second magnetization increase. Between the points B2 and B4, the foregoing behavior of the first magnetization and the second magnetization causes the X-direction magnetization-corresponding value Mx to increase as the X-direction applied field strength AHx increases. At the point B4, the X-direction magnetization-corresponding value Mx has a negative value.

Between the points B4 and B5, some of the first domains change from the state where the first magnetization contains the component in the −X direction and the component in the Z direction to a state where the first magnetization contains the component in the X direction and the component in the Z direction, or into the second domains having the second magnetization containing the component in the X direction and the component in the −Z direction. Between the points B4 and B5, some of the second domains change from the state where the second magnetization contains the component in the −X direction and the component in the −Z direction to a state where the second magnetization contains the component in the X direction and the component in the −Z direction, or into the first domains having the first magnetization containing the component in the X direction and the component in the Z direction. The numbers of the first and the second domains to undergo the above-described changes increase as the X-direction applied field strength AHx increases. All or almost all of the first and second domains at the point B4 have completed such changes at the point B5. Between the points B4 and B5, the foregoing behavior of the stripe domain structure causes the X-direction magnetization-corresponding value Mx to increase as the X-direction applied field strength AHx increases. Between the points B4 and B5, the ratio of the amount of change in the X-direction magnetization-corresponding value Mx to the amount of change in the X-direction applied field strength AHx is higher in absolute value, compared to that between the points B2 and B4.

The value of the X-direction applied field strength AHx at which the X-direction magnetization-corresponding value Mx becomes 0 between the points B4 and B5 is a coercivity Hc.

Between the points B5 and B6, the first magnetization contains the component in the X direction and the component in the Z direction, and the second magnetization contains the component in the X direction and the component in the −Z direction. Between the points B5 and B6, as the X-direction applied field strength AHx increases, the component in the X direction of the first magnetization and the component in the X direction of the second magnetization increase, whereas the component in the Z direction of the first magnetization and the component in the −Z direction of the second magnetization decrease. Between the points B5 and B6, the foregoing behavior of the first magnetization and the second magnetization causes the X-direction magnetization-corresponding value Mx to increase as the X-direction applied field strength AHx increases. Between the points B5 and B6, the ratio of the amount of change in the X-direction magnetization-corresponding value Mx to the amount of change in the X-direction applied field strength AHx is lower in absolute value, compared to that between the points B4 and B5.

Between the points B6 and B7, both the first magnetization and the second magnetization are substantially in the X direction.

The description so far has dealt with changes in the X-direction magnetization-corresponding value Mx and the behavior of the stripe domain structure in response to changes in the X-direction applied field strength AHx in the case where the stripe direction of the stripe domain structure of the soft magnetic structure 40 is parallel to the X direction and the direction of the magnetic field applied to the soft magnetic structure 40 is also parallel to the X direction. The foregoing description applies also to a case where the stripe direction is parallel to the Y direction and the direction of the magnetic field applied to the soft magnetic structure 40 is also parallel to the Y direction. Here, the strength of the magnetic field applied to the soft magnetic structure 40 in a direction parallel to the Y direction will be referred to as a Y-direction applied field strength AHy. If the X direction, the −X direction, the X-direction applied field strength AHx and the X-direction magnetization-corresponding value Mx in the foregoing description are replaced with the Y direction, the −Y direction, the Y-direction applied field strength AHy and the Y-direction magnetization-corresponding value My, respectively, the resulting description applies to changes in the Y-direction magnetization-corresponding value My and the behavior of the stripe domain structure in response to changes in the Y-direction applied field strength AHy in the case where the stripe direction is parallel to the Y direction and the direction of the magnetic field applied to the soft magnetic structure 40 is also parallel to the Y direction. A major loop traced in an orthogonal coordinate system having two orthogonal axes for representing the Y-direction applied field strength AHy and the Y-direction magnetization-corresponding value My will be denoted by the symbol MALY. The coordinates representing the Y-direction applied field strength AHy and the Y-direction magnetization-corresponding value My in this orthogonal coordinate system will be referred to as coordinates (AHy, My).

In the present embodiment, the strength of the external magnetic field varies within a predetermined variable range. As the strength of the external magnetic field varies within the variable range, the strengths of the detection-target magnetic fields Hx, Hy, and Hz all vary within a variable range not exceeding the variable range of the strength of the external magnetic field. It is desirable that as the strength of the external magnetic field varies within the variable range, the coordinates representing the applied field strength and the magnetization-corresponding value in the orthogonal coordinate system having two orthogonal axes for representing the applied field strength and the magnetization-corresponding value should move within a region enclosed by the major loop.

If the external magnetic field consists only of the detection-target magnetic field Hx, in other words, if the direction of the external magnetic field is parallel to the X direction, it is desirable that in the orthogonal coordinate system shown in FIG. 7, the coordinates (AHx, Mx) move within the region enclosed by the major loop MALX as the strength of the external magnetic field varies within the variable range.

If the external magnetic field consists only of the detection-target magnetic field Hy, in other words, if the direction of the external magnetic field is parallel to the Y direction, it is desirable that in the orthogonal coordinate system having two orthogonal axes for representing the Y-direction applied field strength AHy and the Y-direction magnetization-corresponding value My, the coordinates (AHy, My) move within the region enclosed by the major loop MALY as the strength of the external magnetic field varies within the variable range.

The direction of the external magnetic field may be other than the directions parallel to the X and Y directions. In such a case also, it is desirable that in an orthogonal coordinate system having two orthogonal axes for representing the applied field strength and the magnetization-corresponding value, the coordinates representing the applied field strength and the magnetization-corresponding value move within a region enclosed by a major loop as the strength of the external magnetic field varies within the variable range.

Next, a brief description will be given of a method of forming the soft magnetic structure 40 at least part of which has a stripe domain structure. For example, NiFe is used as the material of the soft magnetic structure 40. NiFe here preferably contains 82 to 87 weight % of Ni.

The constituents of the soft magnetic structure 40, that is, the soft magnetic layers 51 and 43, the upper yokes and the lower yokes, each preferably have a thickness within the range of 500 nm to 10 μm.

For example, the soft magnetic structure 40 may be formed by plating. Alternating-current demagnetization may be applied to the soft magnetic structure 40. The alternating-current demagnetization is performed by subjecting the soft magnetic structure 40 to an alternating-current magnetic field that alternates in direction and decreases gradually in the absolute value of strength.

The soft magnetic structure 40 having a stripe domain structure at least in part can be formed without alternating-current demagnetization. In such a case, the soft magnetic structure 40 as initially formed can include a plurality of portions having stripe domain structures of mutually different stripe directions. If a magnetic field is applied to the soft magnetic structure 40 formed, the stripe directions of the stripe domain structures can change into directions parallel to the direction of the applied magnetic field. The ratio of the area of domains including a component magnetized in the direction of the applied magnetic field to that of domains including a component magnetized in the direction opposite to the direction of the applied magnetic field as viewed from above depends on the strength of the applied magnetic field.

By applying alternating-current demagnetization to the soft magnetic structure 40, it is possible to align the stripe directions of the stripe domain structures in most part of the soft magnetic structure 40. The alternating-current demagnetization also allows most part of the soft magnetic structure 40 to be the same in ratio between the area of domains including a component magnetized in a predetermined direction and the area of domains including a component magnetized in a direction opposite to the predetermined direction as viewed from above.

If, for example, alternating-current demagnetization is performed by using an alternating-current magnetic field whose direction alternates between the X and −X directions, the stripe direction of the stripe domain structure becomes parallel to the X direction. Such alternating-current demagnetization will hereinafter be referred to as X-direction alternating-current demagnetization. On the other hand, if alternating-current demagnetization is performed by using an alternating-current magnetic field whose direction alternates between the Y and −Y directions, the stripe direction of the stripe domain structure becomes parallel to the Y direction. Such alternating-current demagnetization will hereinafter be referred to as Y-direction alternating-current demagnetization. The stripe domain structure immediately after alternating-current demagnetization will be referred to as an initial stripe domain structure.

In the present embodiment, the path traced by the coordinates representing the applied field strength and the magnetization-corresponding value as the applied field strength to the soft magnetic structure 40 after alternating-current demagnetization is varied from 0 will be referred to as an initial magnetization curve. According to the present embodiment, in the orthogonal coordinate system having two orthogonal axes for representing the applied magnetic field strength and the corresponding magnetization value, the coordinates representing the applied field strength and the magnetization-corresponding value move along, for example, a minor loop that is formed within the region enclosed by the major loop and not in contact with the major loop as the strength of the external magnetic field varies within the variable range. The minor loop may start at a point on the initial magnetization curve.

When the external magnetic field consists only of the detection-target magnetic field Hx, as the strength of the external magnetic field varies within the variable range, the coordinates (AHx, Mx) in the orthogonal coordinate system shown in FIG. 7 move along, for example, a minor loop that is formed within the region enclosed by the major loop MALX and not in contact with the major loop MALX. This minor loop may start at a point on the initial magnetization curve. On the other hand, when the external magnetic field consists only of the detection-target magnetic field Hy, as the strength of the external magnetic field varies within the variable range, the coordinates (AHy, My) in the orthogonal coordinate system having two orthogonal axes for representing the Y-direction applied field strength AHy and the Y-direction magnetization-corresponding value My move along, for example, a minor loop that is formed within the region enclosed by the major loop MALY in this orthogonal coordinate system and not in contact with the major loop MALY. This minor loop may start at a point on the initial magnetization curve.

The major loops MALX and MALY have almost the same shape regardless of the stripe direction of the initial stripe domain structure. The reason is as follows. In measuring the major loop MALX or MALY, a magnetic field having such a strength as to saturate the magnetization of the soft magnetic structure 40 is applied to the soft magnetic structure 40 in a predetermined direction. This makes the stripe direction of the stripe domain structure of the soft magnetic structure 40 parallel to the foregoing predetermined direction regardless of the stripe direction of the initial stripe domain structure. The predetermined direction is a direction parallel to the X direction or a direction to the Y direction. Even if the magnetic field in the direction parallel to the predetermined direction is subsequently changed in strength, the stripe direction remains unchanged. The same applies regardless of whether the predetermined direction is a direction parallel to the X direction or a direction parallel to the Y direction. The major loops MALX and MALY thus have almost the same shape.

The stripe domain structure of the soft magnetic structure 40 can vary depending on the direction and strength of the magnetic field applied to the soft magnetic structure 40 after alternating-current demagnetization. This will be described in detail below. A first, a second, a third and a fourth case will be described here.

The first case is a case where a magnetic field in a direction parallel to the X direction is applied to the soft magnetic structure 40 formed by alternating-current demagnetization in the X direction. The second case is a case where a magnetic field in a direction parallel to the Y direction is applied to the soft magnetic structure 40 formed by alternating-current demagnetization in the Y direction. The third case is a case where a magnetic field in a direction parallel to the X direction is applied to the soft magnetic structure 40 formed by alternating-current demagnetization in the Y direction. The fourth case is a case where a magnetic field in a direction parallel to the Y direction is applied to the soft magnetic structure 40 formed by alternating-current demagnetization in the X direction.

To begin with, examples of respective specific methods for alternating-current demagnetization in the X direction and the Y direction will be described. In an example of a specific method for alternating-current demagnetization in the X direction, an alternating-current magnetic field whose direction alternates between the X direction and the −X direction and whose strength decreases gradually in absolute value is applied to the soft magnetic structure 40. The alternating-current magnetic field is a magnetic field whose strength decreases to 80% in absolute value each time the direction is switched. The initial direction of the alternating-current magnetic field is the X direction, and the absolute value of strength is 100 Oe. An example of a specific method for alternating-current demagnetization in the Y direction is the same as the example of the specific method for alternating-current demagnetization in the X direction except that the X and −X directions are replaced with the Y and −Y directions, respectively.

The first case will now be described. In the first case, although not shown in the drawings, the stripe direction of the initial stripe domain structure is parallel to the X direction. The direction of a magnetization component parallel to the XY plane in each domain is either the X direction or the −X direction. The magnetization component parallel to the XY plane will hereinafter be referred to as an in-plane magnetization component. A magnetization component perpendicular to the XY plane will be referred to as a perpendicular magnetization component.

In the initial stripe domain structure in the first case, the first and second domains are alternately arranged in the Y direction. A bundle of a plurality of domains in which the in-plane magnetization components are in the same direction will be referred to as a domain bundle. The initial stripe domain structure in the first case includes first domain bundles and second domain bundles alternately arranged in the Y direction. The first domain bundle is a bundle of a plurality of domains in which the in-plane magnetization components are in the X direction. The second domain bundle is a bundle of a plurality of domains in which the in-plane magnetization components are in the −X direction. In the initial stripe domain structure in the first case, magnetic walls extending in the X direction are formed between every adjacent first and second domain bundles.

In the first case, the stripe direction of the stripe domain structure remains unchanged even if a magnetic field in a direction parallel to the X direction is applied to the soft magnetic structure 40 formed by alternating-current demagnetization in the X direction. When the X-direction applied field strength AHx is changed, the stripe domain structure exhibits the same behavior as that described with reference to FIG. 7.

Figure 8:
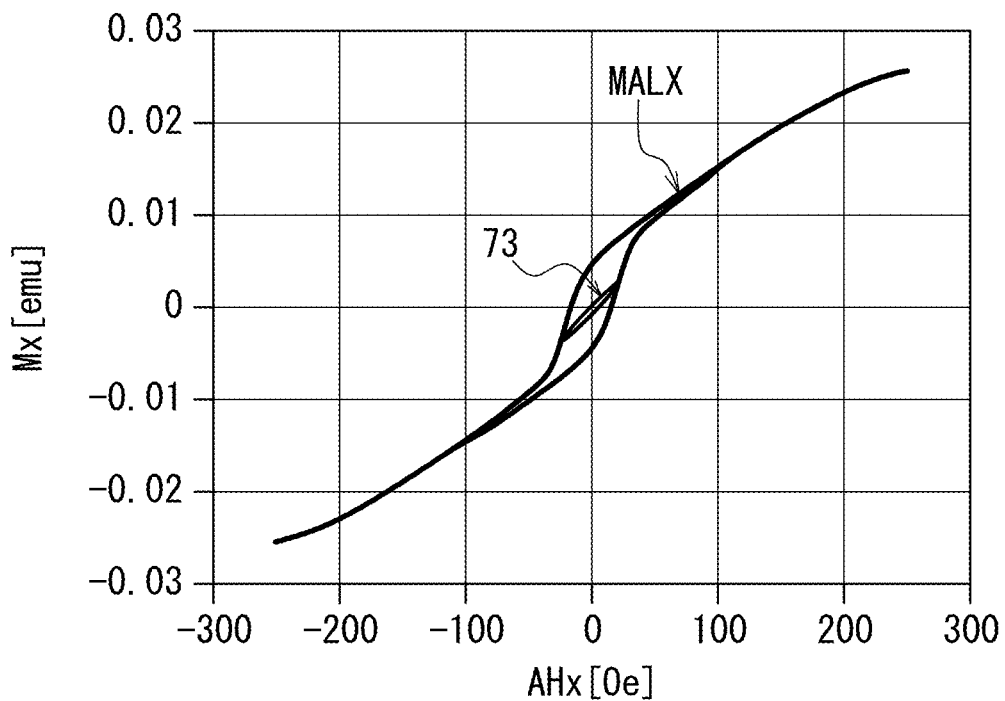
FIG. 8 is a characteristic chart showing an example of major and minor loops in a first case.
Figure 9:
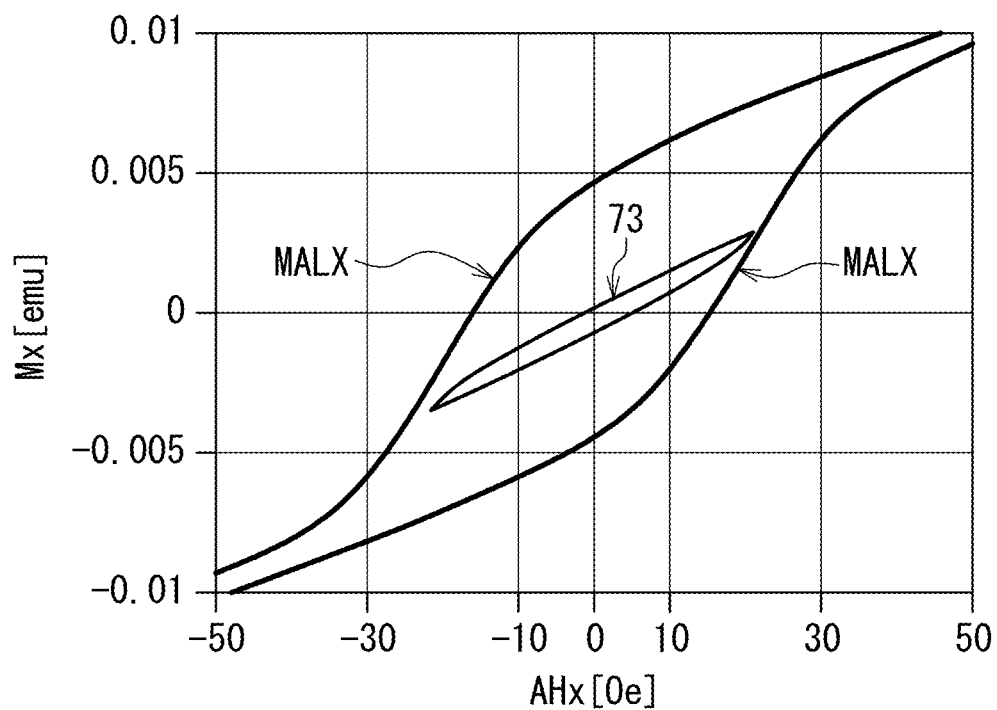
FIG. 9 is a characteristic chart showing a portion of FIG. 8 on an enlarged scale.

Next, the major and minor loops in the first case will be described. FIG. 8 is a characteristic chart showing an example of the major and minor loops in the first case. FIG. 9 is a characteristic chart showing a portion of FIG. 8 on an enlarged scale. In FIGS. 8 and 9, the horizontal axis represents the X-direction applied field strength AHx (Oe), and the vertical axis represents the X-direction magnetization-corresponding value Mx (emu).

Here, a measurement method for the major and minor loops employed in the present embodiment will be described briefly. The measurement method uses a sample composed of a plurality of elements arranged such that a number of the plurality of elements align in each of the X and Y directions. As viewed from above, each element has a square shape with a side of approximately 260 µm in length. Each element has a thickness of approximately 2 µm. In the sample, the spacing between every two adjacent elements is set at 100 µm or more to thereby prevent magnetic coupling between adjacent elements. As viewed from above, the entire sample has a square shape with a side of approximately 10 mm in length. The magnetic field applied to the sample is generated by using a Helmholtz coil. The magnetization-corresponding value of the sample is measured by using a vibrating sample magnetometer.

In FIGS. 8 and 9, the curve denoted by the symbol MALX is the major loop MALX. The major loop MALX is a path traced by the coordinates (AHx, Hx) when the X-direction applied field strength AHx is set to 250 Oe, then gradually reduced to −250 Oe, and then gradually increased to 250 Oe.

In FIGS. 8 and 9, the hysteresis loop denoted by the reference numeral 73 is an example of the minor loop. This hysteresis loop 73 is a path traced by the coordinates (AHx, Mx) when the X-direction applied field strength AHx is set to 21.6 Oe, then gradually reduced to −21.6 Oe, and then gradually increased to 21.6 Oe. The hysteresis loop 73 is a minor loop that is formed within the region enclosed by the major loop MALX and not in contact with the major loop MALX. This minor loop starts at a point on the initial magnetization curve.

Next, the second case will be described. In the second case, although not shown in the drawings, the stripe direction of the initial stripe domain structure is parallel to the Y direction. The direction of the in-plane magnetization component in each domain is either the Y direction or the −Y direction.

In the initial stripe domain structure in the second case, the first and second domains are alternately arranged in the X direction. The initial stripe domain structure in the second case includes third domain bundles and fourth domain bundles alternately arranged in the X direction. The third domain bundle is a bundle of a plurality of domains in which the in-plane magnetization components are in the Y direction. The fourth domain bundle is a bundle of a plurality of domains in which the in-plane magnetization components are in the −Y direction. In the initial stripe domain structure in the second case, magnetic walls extending in the Y direction are formed between every adjacent third and fourth domain bundles.

In the second case, the stripe direction of the stripe domain structure remains unchanged even if a magnetic field in a direction parallel to the Y direction is applied to the soft magnetic structure 40 formed by alternating-current demagnetization in the Y direction. When the Y-direction applied field strength AHy is changed, the stripe domain structure exhibits the same behavior as that exhibited by the stripe domain structure when the X-direction applied field strength AHx is changed.

Figure 10:
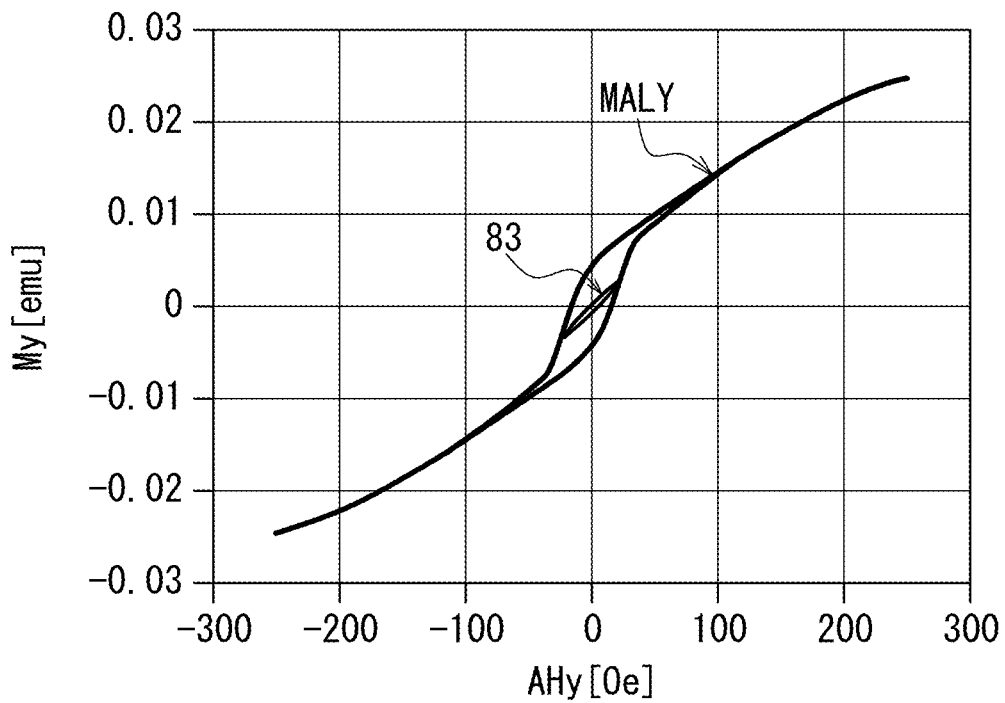
FIG. 10 is a characteristic chart showing an example of major and minor loops in a second case.
Figure 11:
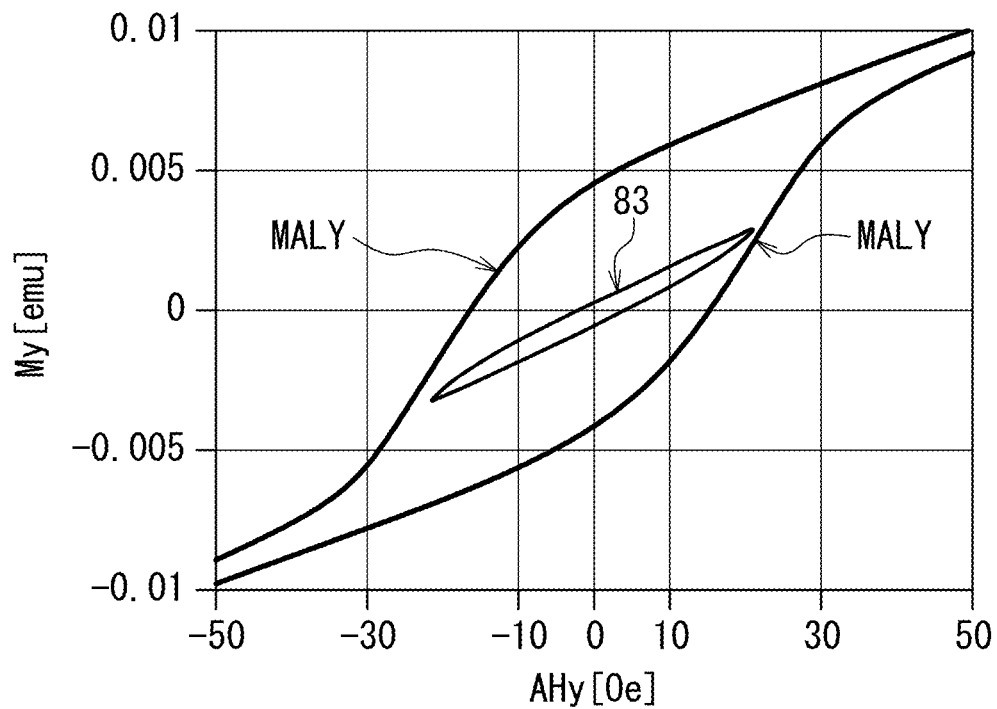
FIG. 11 is a characteristic chart showing a portion of FIG. 10 on an enlarged scale.

Next, the major and minor loops in the second case will be described. FIG. 10 is a characteristic chart showing an example of the major and minor loops in the second case. FIG. 11 is a characteristic chart showing a portion of FIG. 10 on an enlarged scale. In FIGS. 10 and 11, the horizontal axis represents the Y-direction applied field strength AHy (Oe), and the vertical axis represents the Y-direction magnetization-corresponding value My (emu). The Y-direction applied field strength AHy in FIGS. 10 and 11 is expressed as a positive value if the magnetic field applied to the soft magnetic structure 40 is in the Y direction, and as a negative value if the magnetic field applied to the soft magnetic structure 40 is in the −Y direction. The Y-direction magnetization-corresponding value My in FIGS. 10 and 11 is expressed as a positive value if the magnetization of the soft magnetic structure 40 is in the Y direction, and as a negative value if the magnetization of the soft magnetic structure 40 is in the −Y direction.

In FIGS. 10 and 11, the curve denoted by the symbol MALY is the major loop MALY. The major loop MALY is a path traced by the coordinates (AHy, My) when the Y-direction applied field strength AHy is set to 250 Oe, then gradually reduced to −250 Oe, and then gradually increased to 250 Oe.

In FIGS. 10 and 11, the hysteresis loop denoted by the reference numeral 83 is an example of the minor loop. The hysteresis loop 83 is a path traced by the coordinates (AHy, My) when the Y-direction applied field strength AHy is set to 21.6 Oe, then gradually reduced to −21.6 Oe, and then gradually increased to 21.6 Oe. The hysteresis loop 83 is a minor loop that is formed within the region enclosed by the major loop MALY and not in contact with the major loop MALY. The minor loop starts at a point on the initial magnetization curve.

Next, the third case will be described. Although not shown in the drawings, the initial stripe domain structure in the third case is the same as the initial stripe domain structure in the second case. The stripe direction of the initial stripe domain structure is parallel to the Y direction. The initial stripe domain structure in the third case will be described in detail later.

In the third case, if a magnetic field in a direction parallel to the X direction is applied to the soft magnetic structure 40 formed by alternating-current demagnetization in the Y direction and the X-direction applied field strength AHx is increased from 0, the stripe direction of the stripe domain structure rotates from the direction parallel to the Y direction to the direction parallel to the X direction when the X-direction applied field strength AHx reaches or exceeds a certain strength. The strength of the magnetic field at which such a rotation of the stripe direction occurs will be referred to as a critical strength.

A detailed description will be given later as to the behavior of the stripe domain structure when the magnetic field in the direction parallel to the X direction is applied to the soft magnetic structure 40 in the third case.

Figure 12:
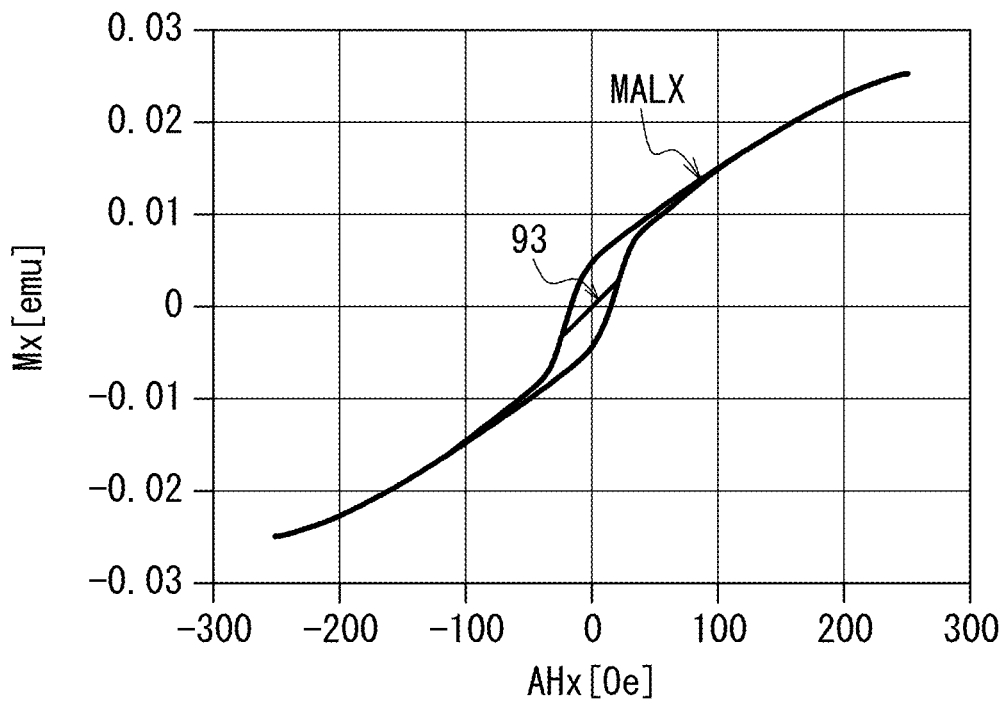
FIG. 12 is a characteristic chart showing an example of major and minor loops in a third case.
Figure 13:
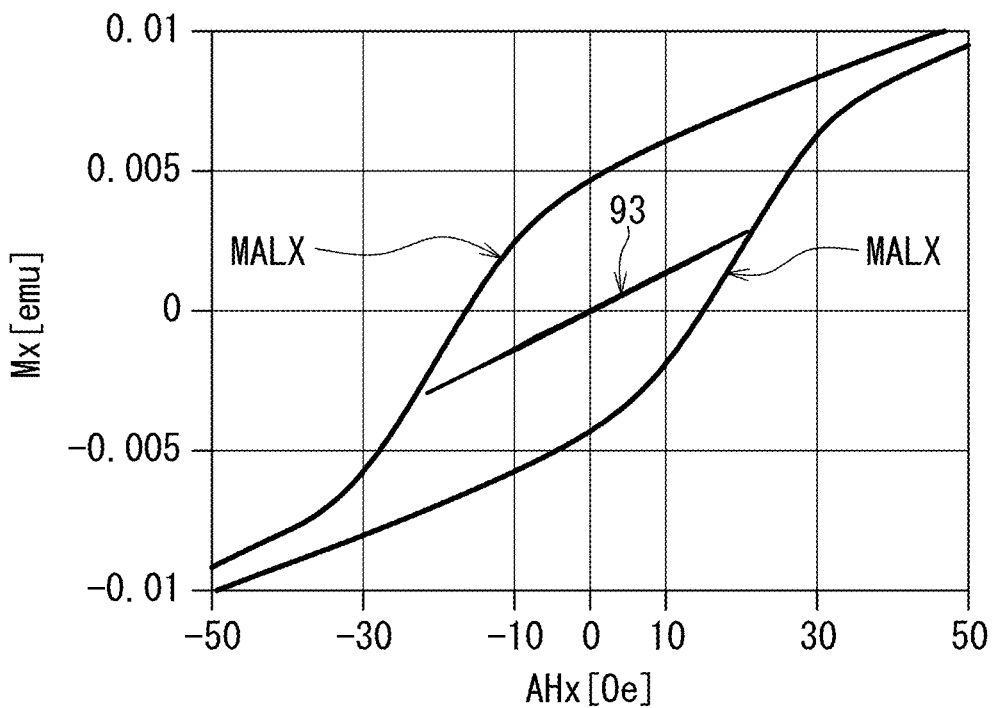
FIG. 13 is a characteristic chart showing a portion of FIG. 12 on an enlarged scale.

Next, the major and minor loops in the third case will be described. FIG. 12 is a characteristic chart showing an example of the major and minor loops in the third case. FIG. 13 is a characteristic chart showing a portion of FIG. 12 on an enlarged scale. In FIGS. 12 and 13, the horizontal axis represents the X-direction applied field strength AHx (Oe), and the vertical axis represents the X-direction magnetization-corresponding value Mx (emu).

In FIGS. 12 and 13, the curve denoted by the symbol MALX is the major loop MALX. The major loop MALX is a path traced by the coordinates (AHx, Hx) when the X-direction applied field strength AHx is set to 250 Oe, then gradually reduced to −250 Oe, and then gradually increased to 250 Oe.

In FIGS. 12 and 13, the hysteresis loop denoted by the reference numeral 93 is an example of the minor loop. This hysteresis loop 93 is a path traced by the coordinates (AHx, Mx) when the X-direction applied field strength AHx is set to 21.6 Oe, then gradually reduced to −21.6 Oe, and then gradually increased to 21.6 Oe. The hysteresis loop 93 is a minor loop that is formed within the region enclosed by the major loop MALX and not in contact with the major loop MALX. This minor loop starts at a point on the initial magnetization curve.

Figure 14:
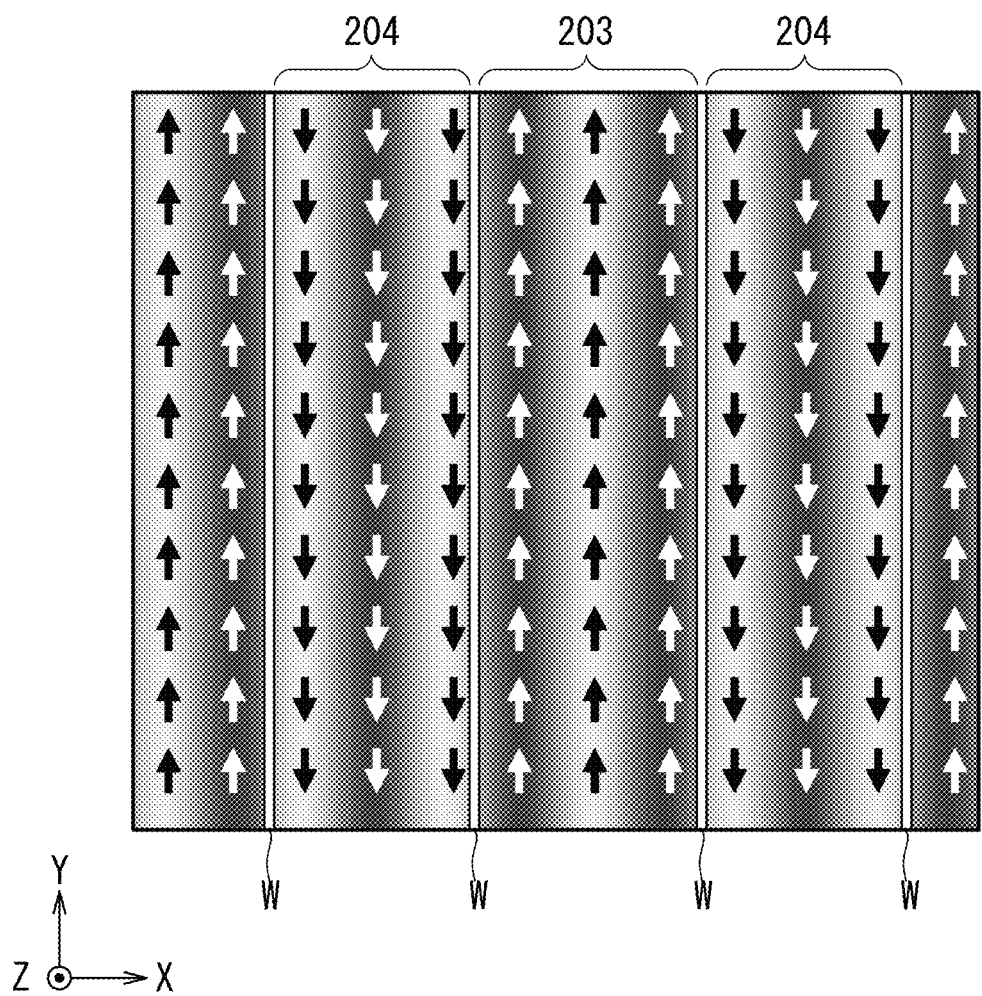
FIG. 14 is an explanatory diagram showing an initial stripe domain structure in the third case.

Next, the initial stripe domain structure in the third case will be described with reference to FIG. 14. FIG. 14 shows the initial stripe domain structure in the third case. FIG. 14 schematically illustrates the first and second domains by white and black gradations. In FIG. 14, regions closer to white than an intermediate gradation value correspond to the first domains, and regions closer to black than the intermediate gradation value correspond to the second domains.

A single domain includes a plurality of magnetic dipoles having a spin magnetic moment in substantially the same direction. A component of the spin magnetic moment parallel to the XY plane will be referred to as an in-plane spin component. A component of the spin magnetic moment perpendicular to the XY plane will be referred to as a perpendicular spin component. In a domain, the direction of the in-plane magnetization component is the same as that of in-plane spin components of the plurality of magnetic dipoles in the domain. The direction of the perpendicular magnetization component is the same as that of the perpendicular spin components of the plurality of magnetic dipoles in the domain.

FIG. 14 schematically illustrates the directions and magnitudes of the perpendicular spin components in the domains by black and white gradations. In FIG. 14, regions closer to white than the intermediate gradation value indicate that the perpendicular spin components are in the Z direction, and that the closer to white, the greater the perpendicular spin components. Regions closer to black than the intermediate gradation value indicate that the perpendicular spin components are in the −Z direction, and that the closer to black, the greater the perpendicular spin components.

FIG. 14 also shows the directions of the in-plane and perpendicular spin components of the magnetic dipoles by arrows. In FIG. 14, the directions of the arrows indicate the directions of the in-plane spin components. Black arrows indicate that the perpendicular spin components are in the Z direction. White arrows indicate that the perpendicular spin components are in the −Z direction.

As shown in FIG. 14, in the third case, the stripe direction of the initial stripe domain structure is parallel to the Y direction. The direction of the in-plane magnetization component in each domain and the direction of the in-plane spin component of each magnetic dipole are either the Y direction or the −Y direction. In the initial stripe domain structure in the third case, the first and second domains are alternately arranged in the X direction. In the initial stripe domain structure in the third case, the third and fourth domain bundles described in relation to the second case are formed to be alternately arranged in the X direction. The third domain bundles will hereinafter be denoted by the reference numeral 203, and the fourth domain bundles by the reference numeral 204. Magnetic walls W extending in the Y direction are formed between every adjacent third and fourth domain bundles 203 and 204. The directions of the spin magnetic moments change greatly inside the magnetic walls W.

In similar diagrams to FIG. 14 to be referred to for descriptions below, the first domains, second domains, spin magnetic moments and magnetic walls are illustrated in the same manner as in FIG. 14.

In the initial stripe domain structure in the third case, the number of magnetic dipoles having an in-plane spin component in the Y direction is almost the same as that of magnetic dipoles having an in-plane spin component in the −Y direction. In the initial stripe domain structure in the third case, the number of magnetic dipoles having a perpendicular spin component in the Z direction is almost the same as that of magnetic dipoles having a perpendicular spin component in the −Z direction. The initial stripe domain structure in the third case includes no or few magnetic dipoles having an in-plane spin component in the X or −X direction. Consequently, the magnetization component of the entire soft magnetic structure 40 parallel to the X direction is zero or almost zero.

Next, with reference to FIGS. 15 to 17, a description will be given of the behavior of the stripe domain structure when a magnetic field in a direction parallel to the X direction is applied to the soft magnetic structure 40 in the third case. By way of example, the following description deals with a case where a magnetic field in the X direction is applied to the soft magnetic structure 40 and the X-direction applied field strength AHx is increased from 0.

Figure 15:
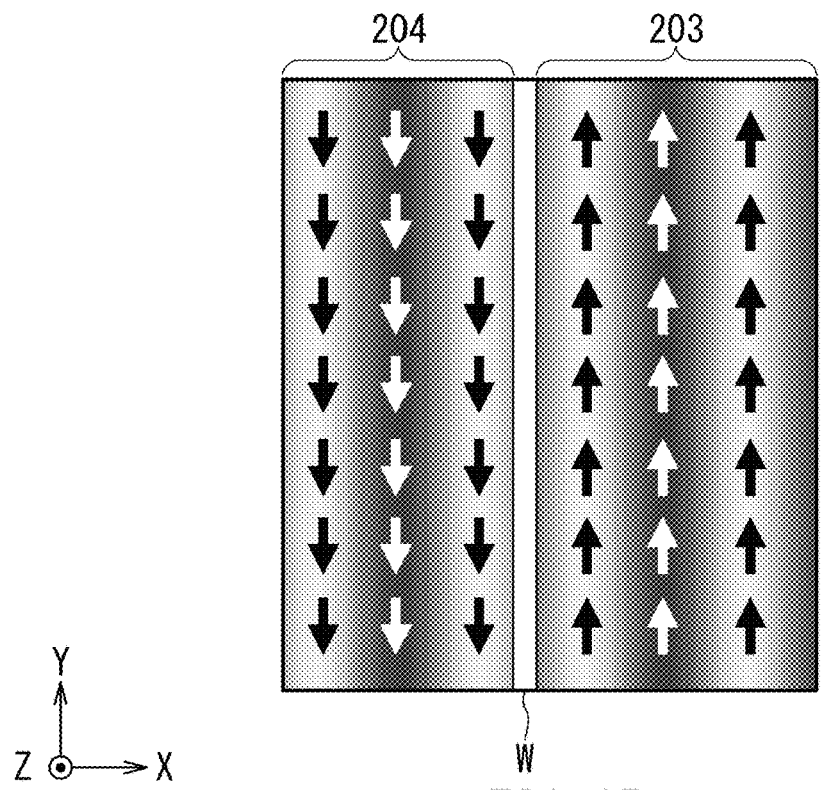
FIG. 15 is an explanatory diagram showing the stripe domain structure when an applied field strength is zero in the third case.

FIG. 15 shows the stripe domain structure when the X-direction applied field strength AHx is 0. While FIG. 15 shows a portion of FIG. 14 on an enlarged scale, the stripe domain structure shown in FIG. 15 is the same as the initial stripe domain structure shown in FIG. 14.

As the X-direction applied field strength AHx is increased from 0, the directions of the in-plane spin components tilt from the Y and −Y directions toward the X direction. The tilt amounts of the directions of the in-plane spin components increase as the X-direction applied field strength AHx increases. If the X-direction applied field strength AHx reaches or exceeds the critical strength, the magnetic walls W move to reduce magnetostatic energy. The magnetic dipoles are quickly rearranged accordingly, and the stripe direction rotates from the direction parallel to the Y direction to the direction parallel to the X direction.

Figure 16:
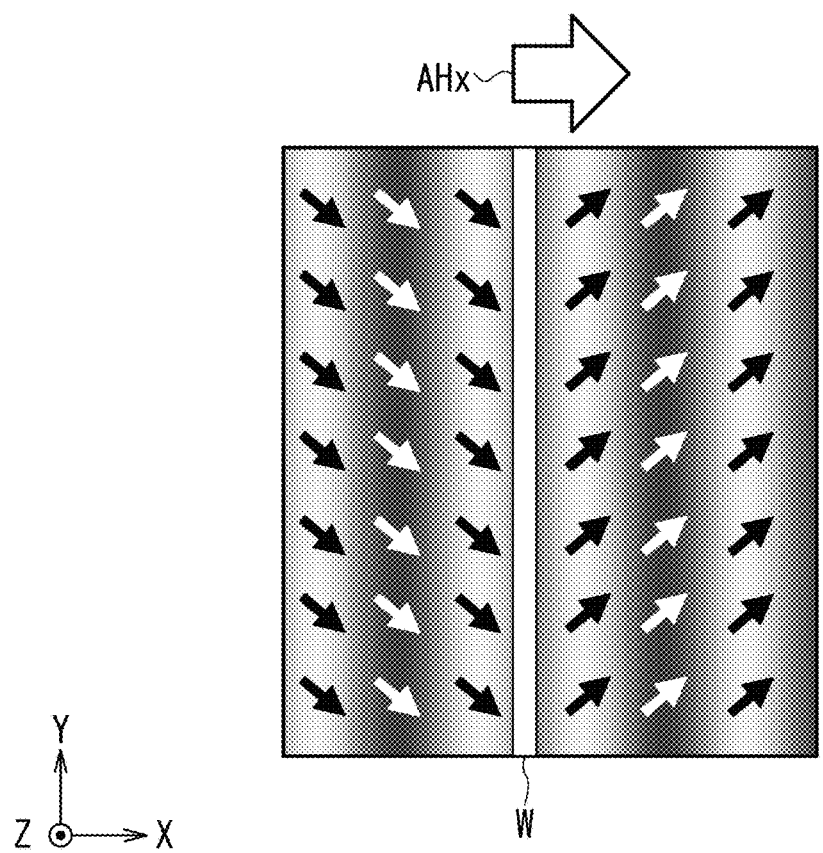
FIG. 16 is an explanatory diagram showing the stripe domain structure when the applied field strength is higher than zero and less than a critical strength in the third case.

FIG. 16 shows the stripe domain structure when the X-direction applied field strength AHx is greater than 0 and less than the critical strength. In FIG. 16 and other similar diagrams, the length of the arrow denoted by AHx schematically indicates the X-direction applied field strength AHx. As shown in FIG. 16, if the X-direction applied field strength AHx is greater than 0 and less than the critical strength, the directions of the in-plane spin components tilt from the Y and −Y directions toward the X direction. In the state shown in FIG. 16, the magnetic wall W has not yet moved, and the stripe direction remains parallel to the Y direction.

Figure 17:
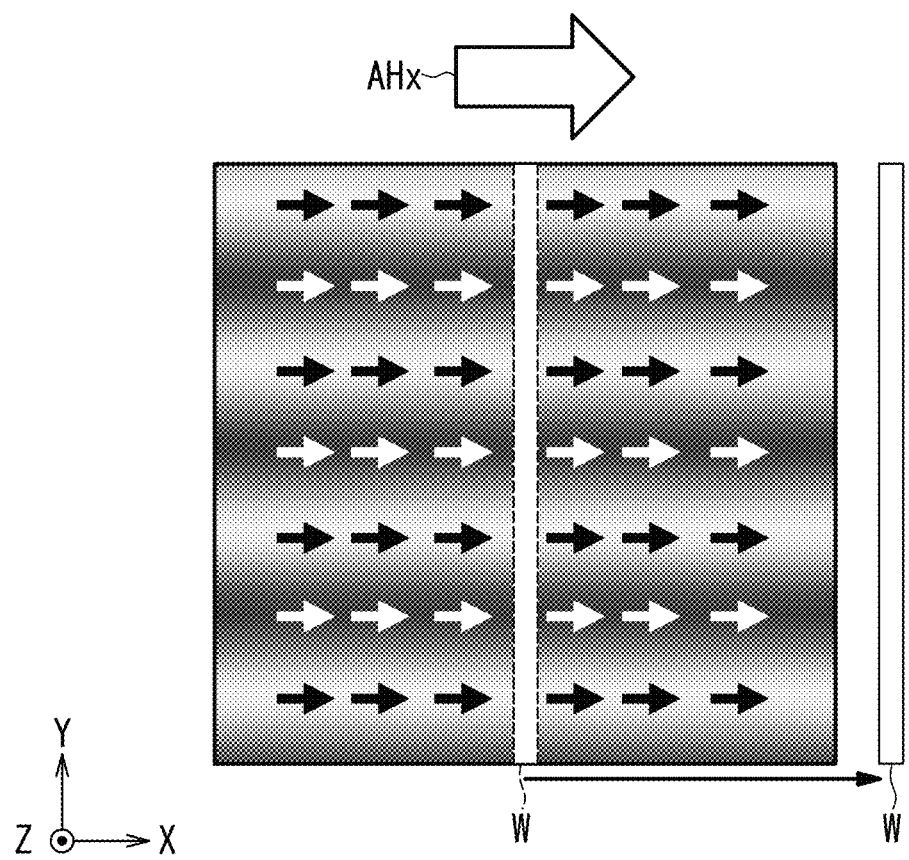
FIG. 17 is an explanatory diagram showing the stripe domain structure when the applied field strength is higher than or equal to the critical strength in the third case.

FIG. 17 shows the stripe domain structure when the X-direction applied field strength AHx is greater than or equal to the critical strength. As shown in FIG. 17, if the X-direction applied field strength AHx reaches or exceeds the critical strength, the magnetic wall W moves. The in-plane spin components become oriented in the X direction, and the stripe direction becomes parallel to the X direction. In the state shown in FIG. 17, the first and second domains are alternately arranged in the Y direction. All the in-plane magnetization components are in the X direction.

If the X-direction applied field strength AHx is then increased until the X-direction magnetization-corresponding value Mx of the soft magnetic structure 40 is saturated, the spin magnetic moments become oriented in the X direction or substantially in the X direction.

Figure 18:
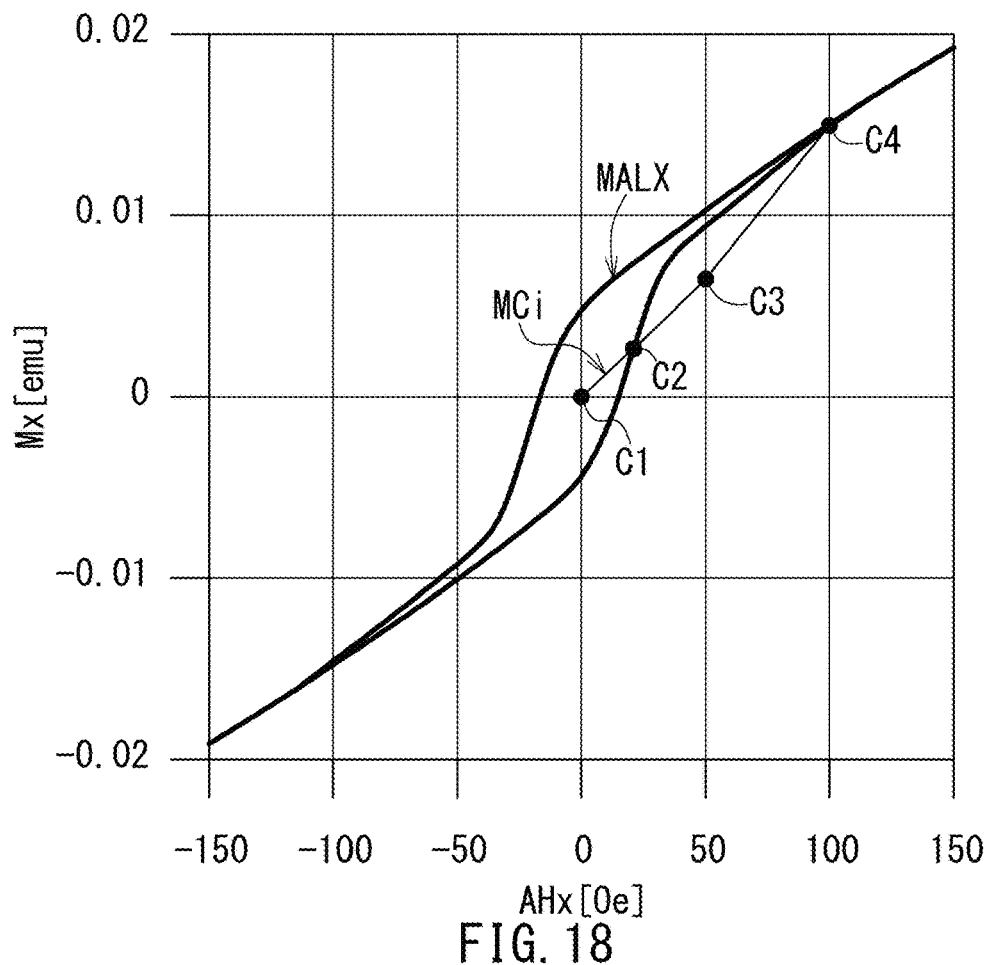
FIG. 18 is a characteristic chart showing the major loop and an initial magnetization curve in the third case.

FIG. 18 is a characteristic chart showing the major loop and the initial magnetization curve in the third case. In FIG. 18, the horizontal axis represents the X-direction applied field strength AHx (Oe), and the vertical axis represents the X-direction magnetization-corresponding value Mx (emu). In FIG. 18, the curve denoted by the symbol MALX is the major loop, and the curve denoted by the symbol MCi is the initial magnetization curve. The major loop MALX shown in FIG. 18 is the same as the major loop MALX shown in FIG. 12.

In FIG. 18, a point C1 on the initial magnetization curve MCi corresponds to a state where the X-direction applied field strength AHx is 0 after alternating-current demagnetization in the Y direction. A point C2 on the initial magnetization curve MCi corresponds to a state where the X-direction applied field strength AHx is greater than 0 and less than the critical strength. A point C3 on the initial magnetization curve MCi corresponds to a state where the X-direction applied field strength AHx is greater than or equal to the critical strength. A point C4 on the initial magnetization curve MCi corresponds to a state where the X-direction applied field strength AHx is sufficiently greater than the critical strength. The initial magnetization curve MCi joins the major loop MALX if the stripe direction becomes parallel to the X direction.

In the range of the X-direction applied field strength AHx corresponding to the range of the initial magnetization curve MCi between the points C2 and C4 (the points C2 and C4 excluded), the X-direction magnetization-corresponding value Mx on the initial magnetization curve MCi is smaller than that on the major loop MALX for the same X-direction applied field strength AHx. The reason is that, in such a range, the stripe direction is not fully parallel to the X direction. In the foregoing range, the initial magnetization curve MCi protrudes from the major loop MALX.

Next, the fourth case will be described. Although not shown in the drawings, the initial stripe domain structure in the fourth case is the same as the initial stripe domain structure in the first case. The stripe direction of the initial stripe domain structure is parallel to the X direction. In the fourth case, a magnetic field in a direction parallel to the Y direction is applied to the soft magnetic structure 40 formed by alternating-current demagnetization in the X direction, and the Y-direction applied field strength AHy is increased from 0. When the Y-direction applied field strength AHy reaches or exceeds the critical strength, the stripe direction of the stripe domain structure rotates from the direction parallel to the X direction to the direction parallel to the Y direction.

Next, a description will be given of the results of a first experiment, which studied the magnetic hysteresis characteristic of the soft magnetic structure 40 in the first and third cases. To enable a quantitative evaluation of the magnetic hysteresis characteristic of the soft magnetic structure 40, magnetic hysteresis parameters of the soft magnetic structure 40 are defined as described below. Different magnetic hysteresis parameters are defined for cases where the direction of the magnetic field applied to the soft magnetic structure 40 is parallel to the X direction and where the direction of the magnetic field applied to the soft magnetic structure 40 is parallel to the Y direction. The magnetic hysteresis parameter in the case where the direction of the magnetic field applied to the soft magnetic structure 40 is parallel to the X direction will be referred to as an X-direction magnetic hysteresis parameter HPHx. The magnetic hysteresis parameter in the case where the direction of the magnetic field applied to the soft magnetic structure 40 is parallel to the Y direction will be referred to as a Y-direction magnetic hysteresis parameter HPHy.

The X-direction magnetic hysteresis parameter HPHx is determined from the X-direction magnetization-corresponding value Mx obtained with the X-direction applied field strength AHx to the soft magnetic structure 40 varied after alternating-current demagnetization. In the present embodiment, the X-direction magnetic hysteresis parameter HPHx is a value determined as follows. The X-direction applied field strength AHx is set to a predetermined value MHx greater than 0, then decreased to −MHx, and then increased to the predetermined value MHx. The X-direction magnetization-corresponding value Mx at which the X-direction applied field strength AHx reaches 0 in the process of increasing is subtracted from the X-direction magnetization-corresponding value Mx at which the X-direction applied field strength AHx reaches 0 in the process of decreasing. The resulting value is the X-direction magnetic hysteresis parameter HPHx.

Similarly, the Y-direction magnetic hysteresis parameter HPHy is determined from the Y-direction magnetization-corresponding value My obtained with the Y-direction applied field strength AHy to the soft magnetic structure 40 varied after alternating-current demagnetization. In the present embodiment, the Y-direction magnetic hysteresis parameter HPHy is a value determined as follows. The Y-direction applied field strength AHy is set to a predetermined value MHy greater than 0, then decreased to −MHy, and then increased to the predetermined value MHy. The Y-direction magnetization-corresponding value My at which the Y-direction applied field strength AHx reaches 0 in the process of increasing is subtracted from the Y-direction magnetization-corresponding value My at which the Y-direction applied field strength AHy reaches 0 in the process of decreasing. The resulting value is the Y-direction magnetic hysteresis parameter HPHy.

To enable a quantitative evaluation of the hysteresis characteristics of the detection values of the magnetic sensors 10 and 20, the respective hysteresis parameters of the magnetic sensors 10 and 20 are defined as described below. The hysteresis parameter of the magnetic sensor 10 is determined from the detection value Sx obtained with the strength of the detection-target magnetic field Hx varied after subjecting the soft magnetic structure 40 to alternating-current demagnetization. Specifically, the hysteresis parameter of the magnetic sensor 10 is a value determined as follows. The strength of the detection-target magnetic field Hx is set to a predetermined value Px greater than 0, then decreased to −Px, and then increased to 0. The detection value Sx at which the strength of the detection-target magnetic field Hx reaches 0 in the process of increasing is subtracted from the detection value Sx at which the strength of the detection-target magnetic field Hx reaches 0 in the process of decreasing. The resulting value is the hysteresis parameter of the magnetic sensor 10.

Similarly, the hysteresis parameter of the magnetic sensor 20 is determined from the detection value Sy obtained with the strength of the detection-target magnetic field Hy varied after subjecting the soft magnetic structure 40 to alternating-current demagnetization. Specifically, the hysteresis parameter of the magnetic sensor 20 is a value determined as follows. The strength of the detection-target magnetic field Hy is set to a predetermined value Py greater than 0, then decreased to −Py, and then increased to 0. The detection value Sy at which the strength of the detection-target magnetic field Hy reaches 0 in the process of increasing is subtracted from the detection value Sy at which the strength of the detection-target magnetic field Hx reaches 0 in the process of decreasing. The resulting value is the hysteresis parameter of the magnetic sensor 20.

The greater the value of the X-direction magnetic hysteresis parameter HPHx, the greater the value of the hysteresis parameter of the magnetic sensor 10. The greater the value of the hysteresis parameter of the magnetic sensor 10, the more the detection accuracy of the magnetic sensor 10 can be said to drop. Similarly, the greater the value of the Y-direction magnetic hysteresis parameter HPHy, the greater the value of the hysteresis parameter of the magnetic sensor 20. The greater the value of the hysteresis parameter of the magnetic sensor 20, the more the detection accuracy of the magnetic sensor 20 can be said to drop. To minimize a drop in the detection accuracy of the magnetic sensors 10 and 20 due to the magnetic hysteresis characteristic of the soft magnetic structure 40, the smaller the better the values of the X- and Y-direction magnetic hysteresis parameters HPHx and HPHy.

In the experiment on each of the first and third cases, a hysteresis loop starting at a point on the initial magnetization curve obtained with varying X-direction applied field strength AHx was measured, and the X-direction magnetic hysteresis parameter HPHx was determined from the hysteresis loop. In the experiment, the value of MHx at which the absolute value of the X-direction applied field strength AHx was maximized in measuring the hysteresis loop was varied to measure respective hysteresis loops for different MHx values, and the relationship between MHx and the magnetic hysteresis parameter HPHx was determined.

In the experiment on the second case, a hysteresis loop starting at a point on the initial magnetization curve obtained with varying Y-direction applied field strength AHy was measured, and the Y-direction magnetic hysteresis parameter HPHy was determined from the hysteresis loop. In the experiment, the value of MHy at which the absolute value of the Y-direction applied field strength AHy was maximized in measuring the hysteresis loop was varied to measure respective hysteresis loops for different MHy values, and the relationship between MHy and the magnetic hysteresis parameter HPHy was determined.

FIGS. 19 to 24 are characteristic charts showing examples of the hysteresis loops in the first case. In FIGS. 19 to 24, the horizontal axis represents the X-direction applied field strength AHx (Oe), and the vertical axis represents the X-direction magnetization-corresponding value Mx (emu). In FIGS. 19 to 24, the curve denoted by the symbol MALX is the major loop MALX. The major loop MALX is the same as that shown in FIGS. 8 and 9.

Figure 19:
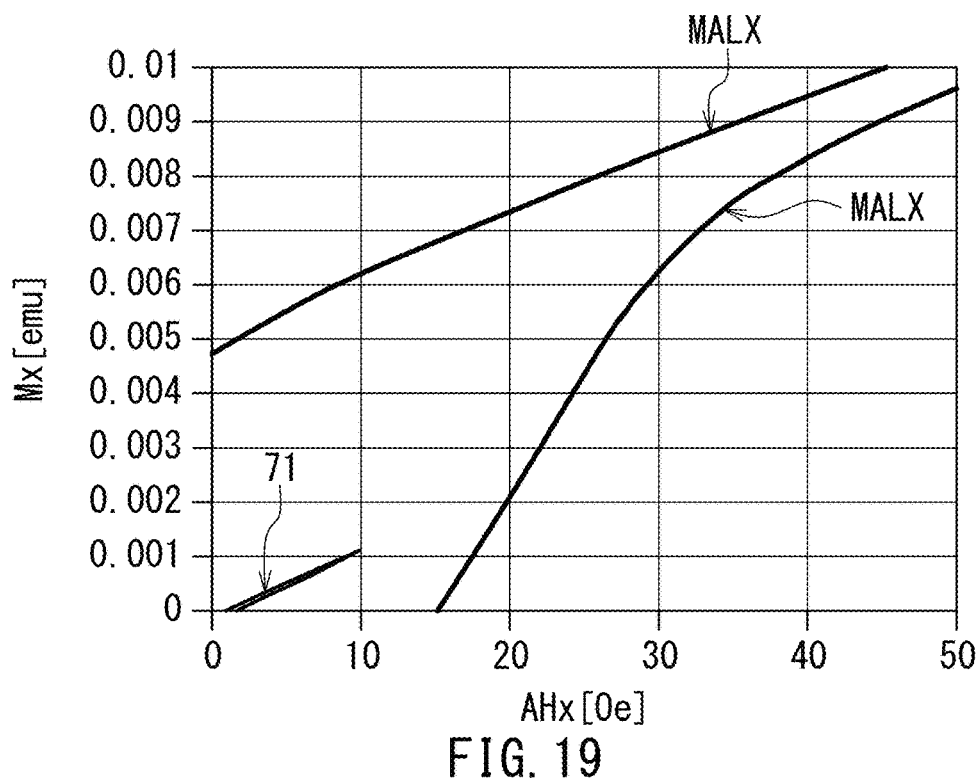
FIG. 19 is a characteristic chart showing an example of hysteresis loop when the maximum absolute value of the applied field strength is 10.2 Oe in the first case.
Figure 20:
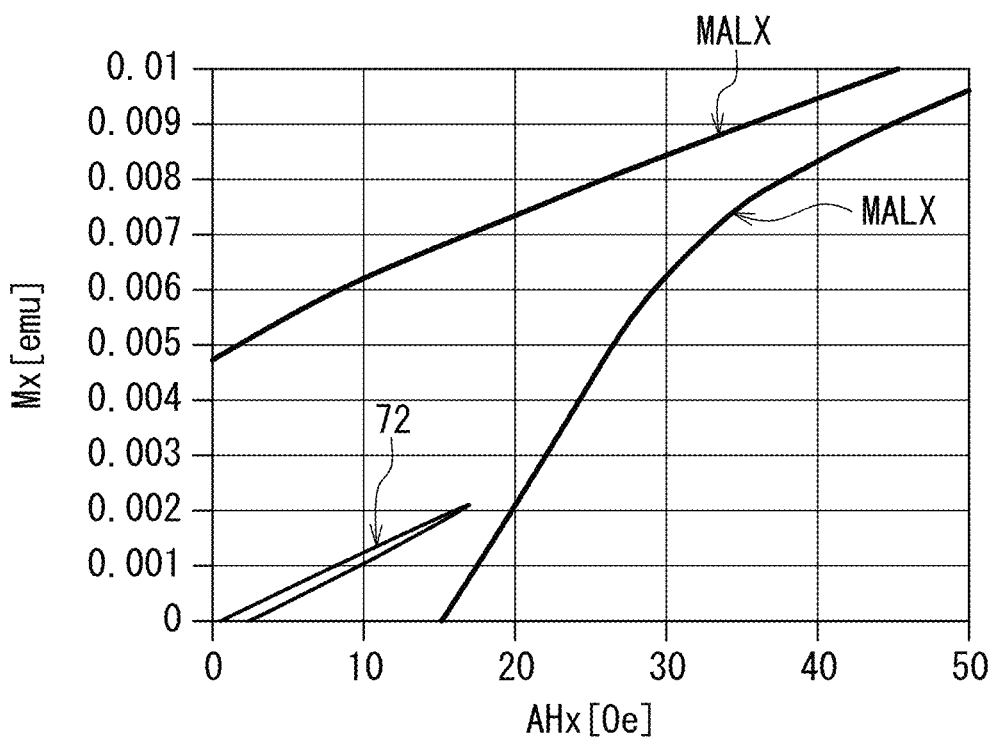
FIG. 20 is a characteristic chart showing an example of hysteresis loop when the maximum absolute value of the applied field strength is 17.4 Oe in the first case.
Figure 21:
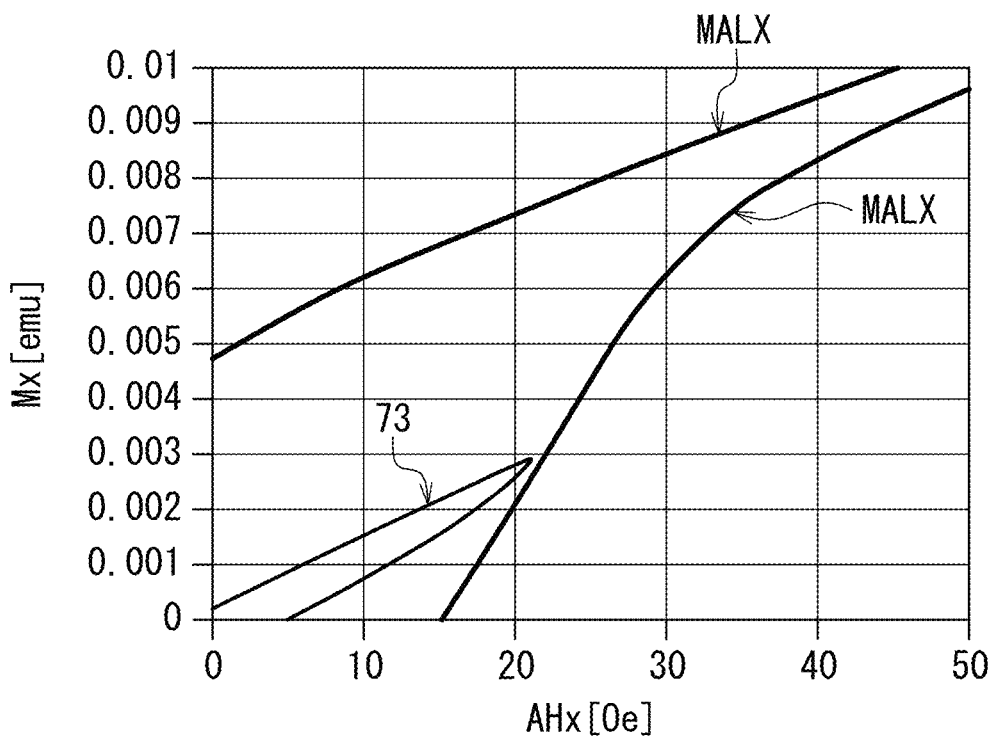
FIG. 21 is a characteristic chart showing an example of hysteresis loop when the maximum absolute value of the applied field strength is 21.6 Oe in the first case.
Figure 22:
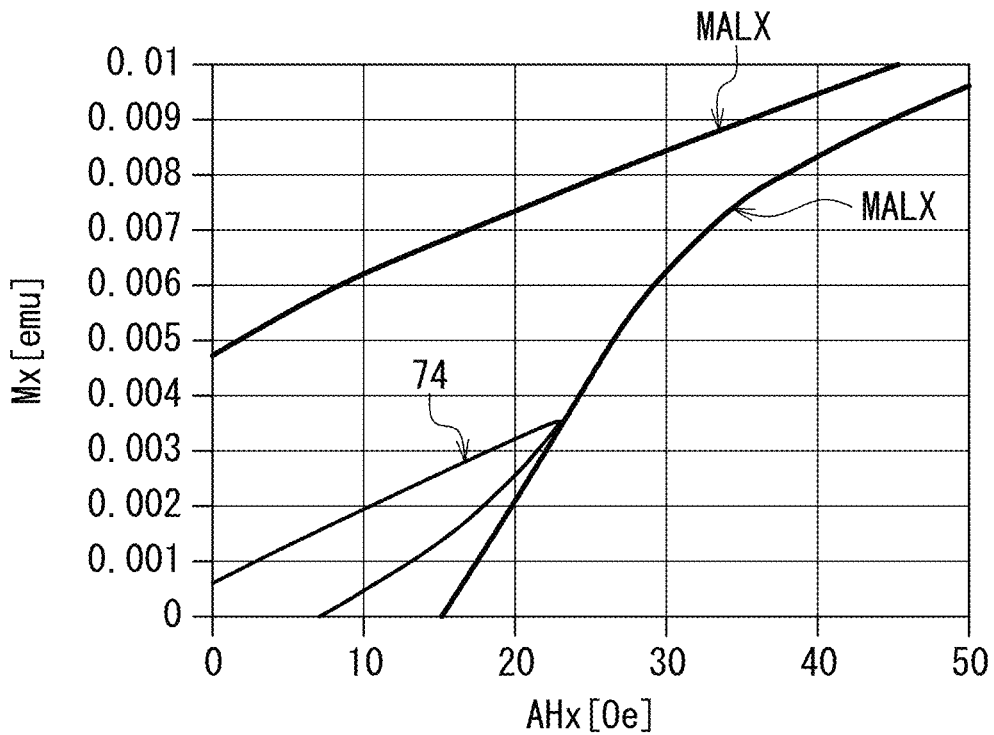
FIG. 22 is a characteristic chart showing an example of hysteresis loop when the maximum absolute value of the applied field strength is 23.6 Oe in the first case.
Figure 23:
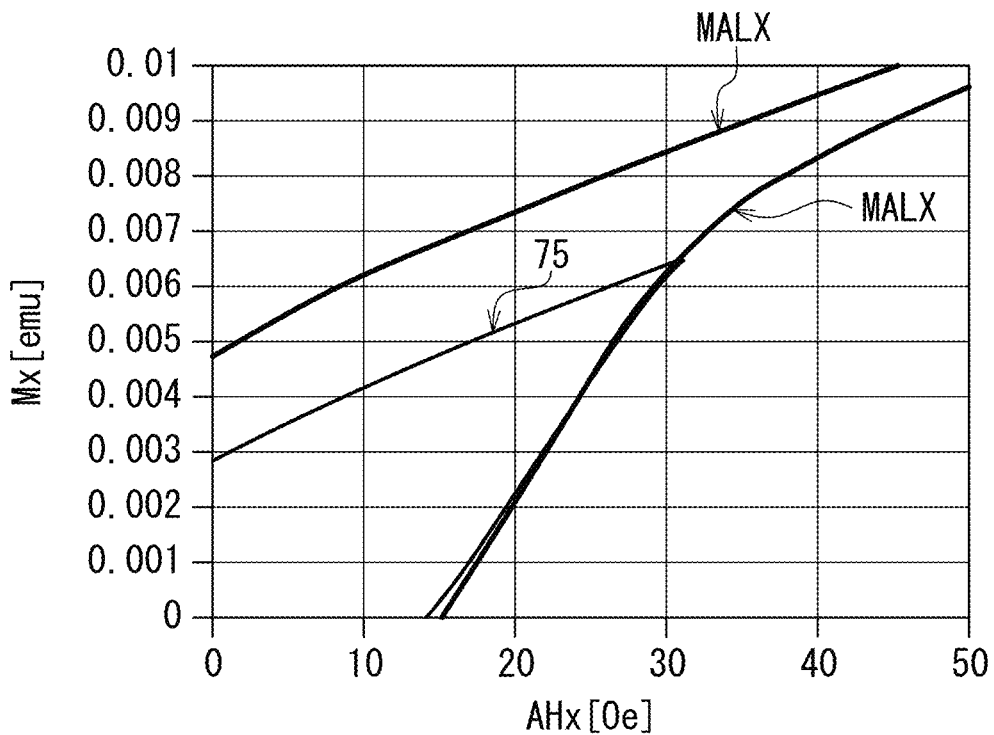
FIG. 23 is a characteristic chart showing an example of hysteresis loop when the maximum absolute value of the applied field strength is 31.6 Oe in the first case.
Figure 24:
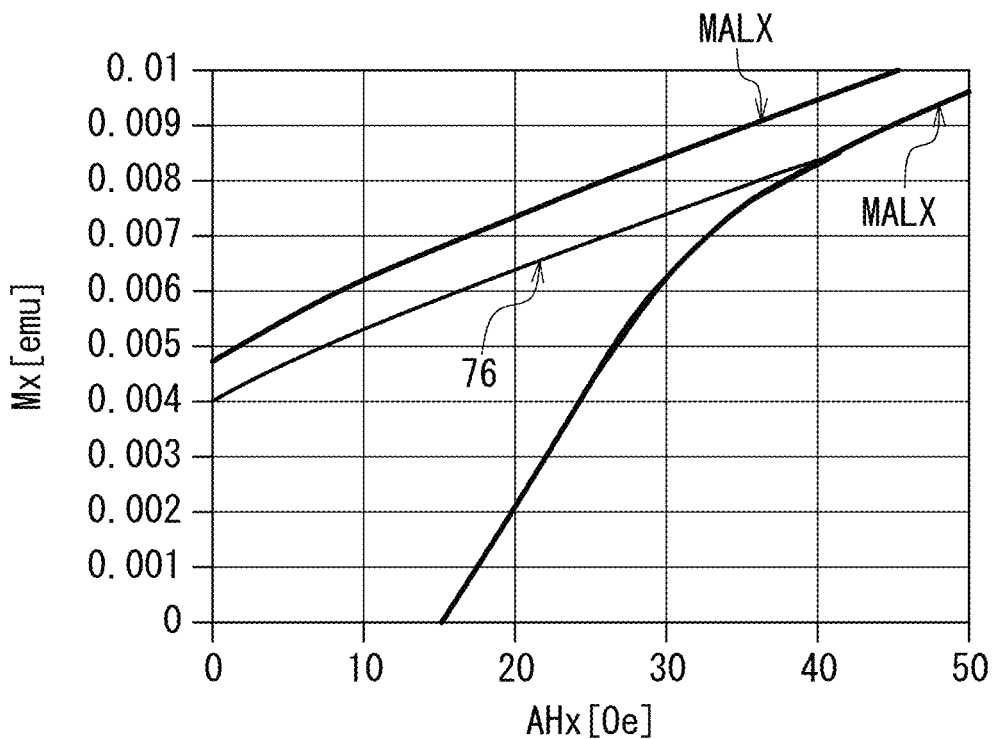
FIG. 24 is a characteristic chart showing an example of hysteresis loop when the maximum absolute value of the applied field strength is 42.3 Oe in the first case.

FIG. 19 shows an example of the hysteresis loop for an MHx of 10.2 Oe, denoted by the reference numeral 71. FIG. 20 shows an example of the hysteresis loop for an MHx of 17.4 Oe, denoted by the reference numeral 72. FIG. 21 shows an example of the hysteresis loop for an MHx of 21.6 Oe, denoted by the reference numeral 73. The hysteresis loop 73 is the same as the hysteresis loop 73 shown in FIGS. 8 and 9. FIG. 22 shows an example of the hysteresis loop for an MHx of 23.6 Oe, denoted by the reference numeral 74. FIG. 23 shows an example of the hysteresis loop for an MHx of 31.6 Oe, denoted by the reference numeral 75. FIG. 24 shows an example of the hysteresis loop for an MHx of 42.3 Oe, denoted by the reference numeral 76.

FIGS. 25 to 30 are characteristic charts showing examples of the hysteresis loops in the second case. In FIGS. 25 to 30, the horizontal axis represents the Y-direction applied field strength AHy (Oe), and the vertical axis represents the Y-direction magnetization-corresponding value My (emu). In FIGS. 25 to 30, the curve denoted by the symbol MALY is the major loop MALY. The major loop MALY is the same as that shown in FIGS. 10 and 11.

Figure 25:
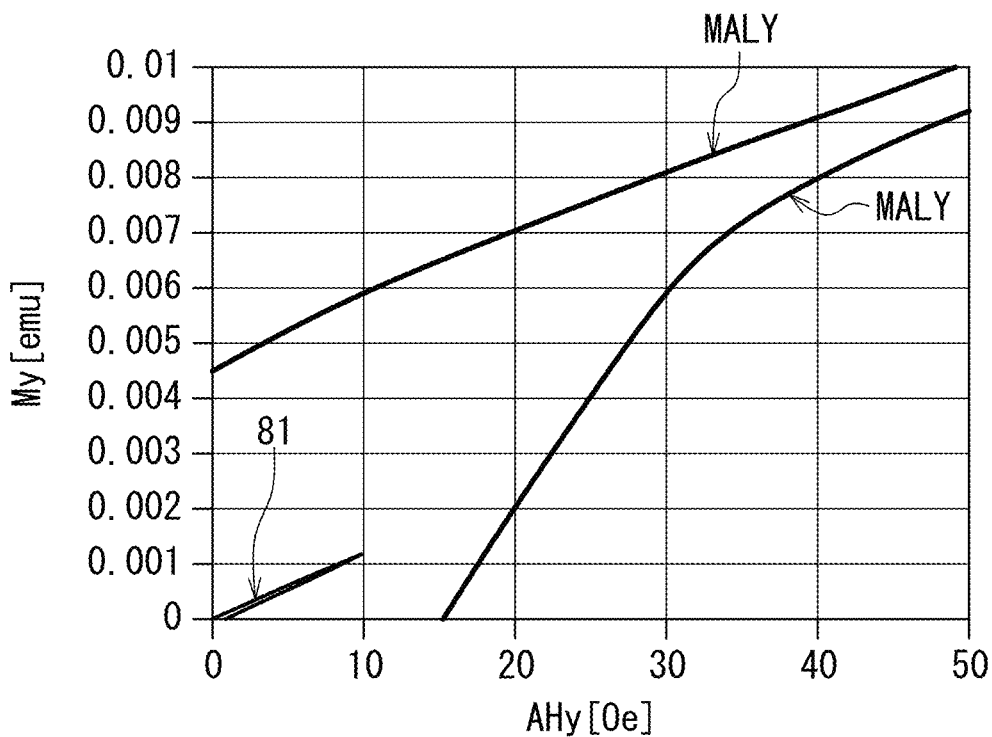
FIG. 25 is a characteristic chart showing an example of hysteresis loop when the maximum absolute value of the applied field strength is 10.2 Oe in the second case.
Figure 26:
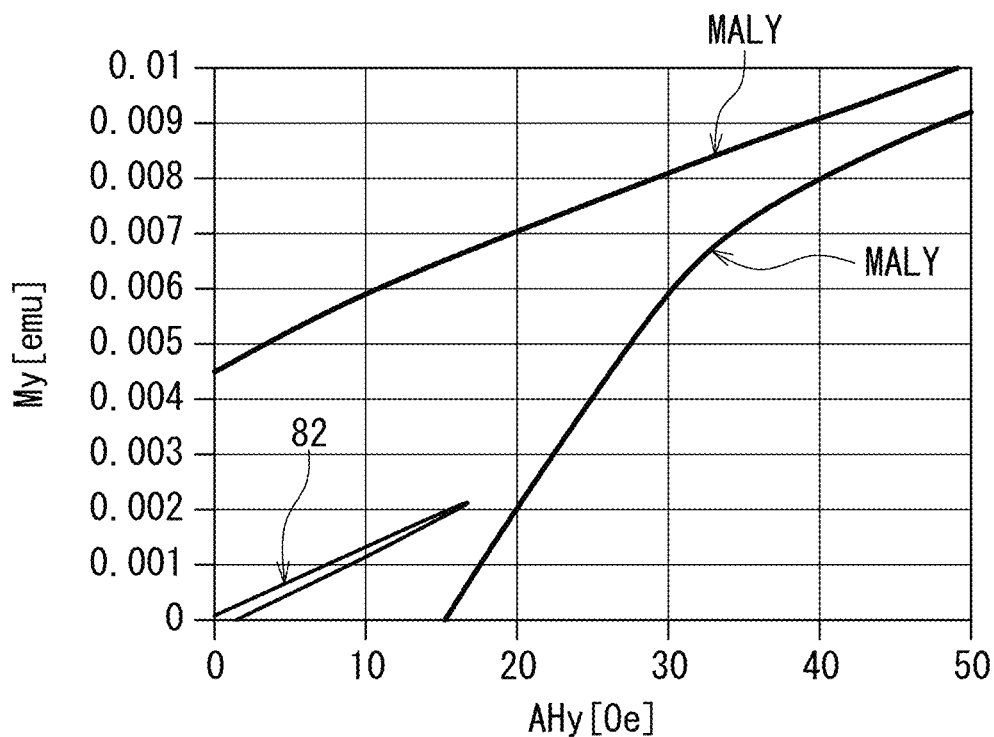
FIG. 26 is a characteristic chart showing an example of hysteresis loop when the maximum absolute value of the applied field strength is 17.4 Oe in the second case.
Figure 27:
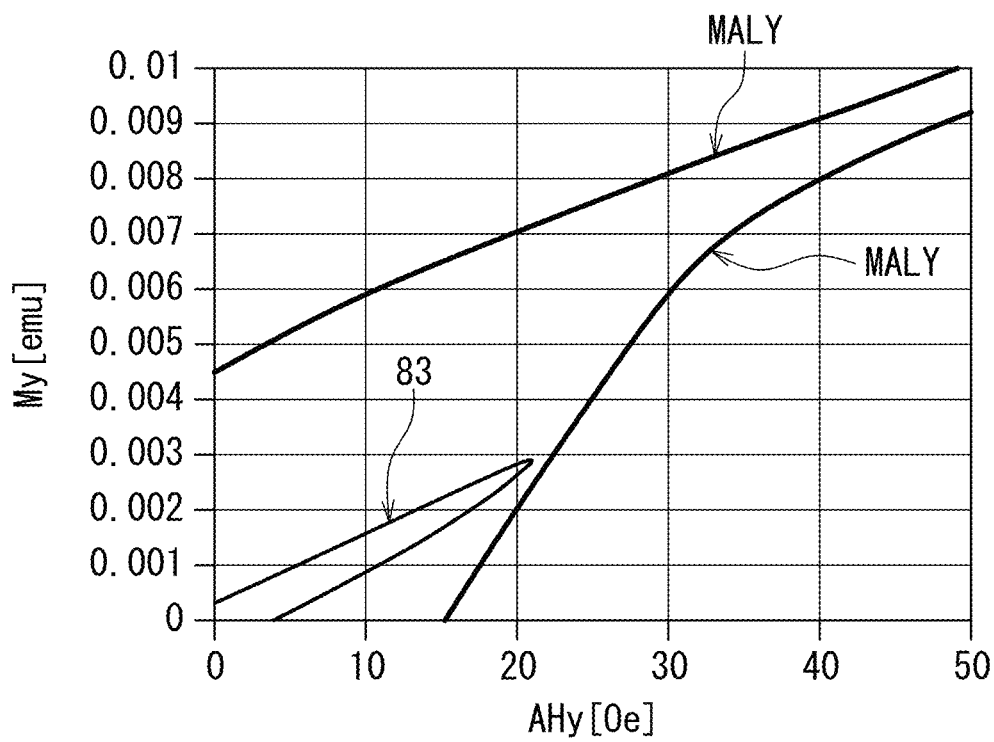
FIG. 27 is a characteristic chart showing an example of hysteresis loop when the maximum absolute value of the applied field strength is 21.6 Oe in the second case.
Figure 28:
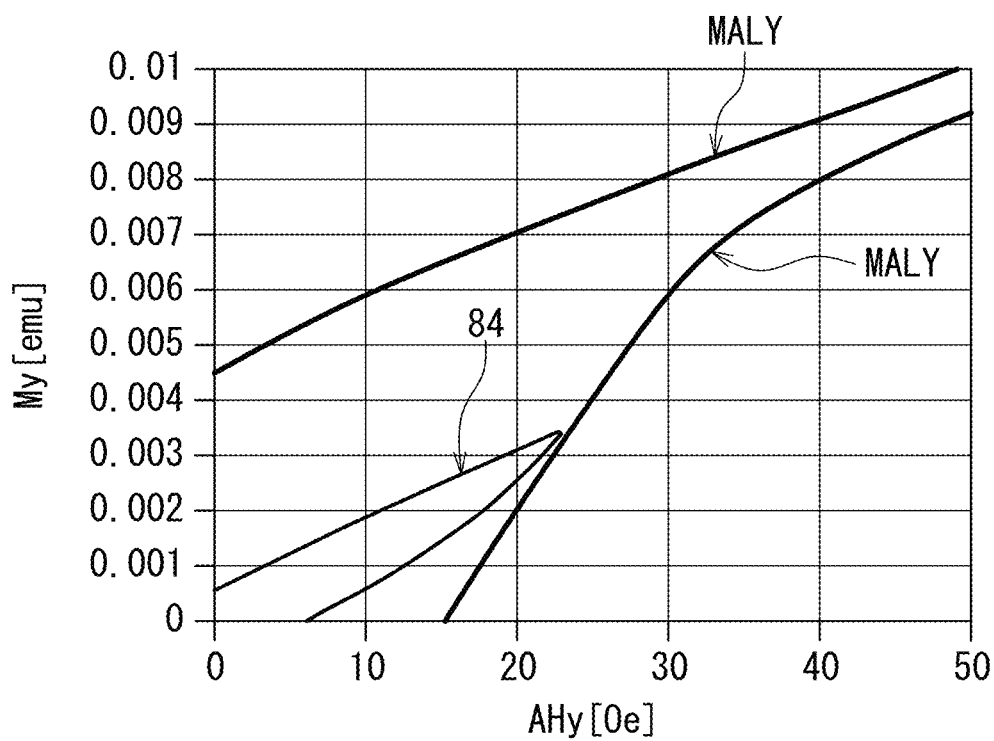
FIG. 28 is a characteristic chart showing an example of hysteresis loop when the maximum absolute value of the applied field strength is 23.6 Oe in the second case.
Figure 29:
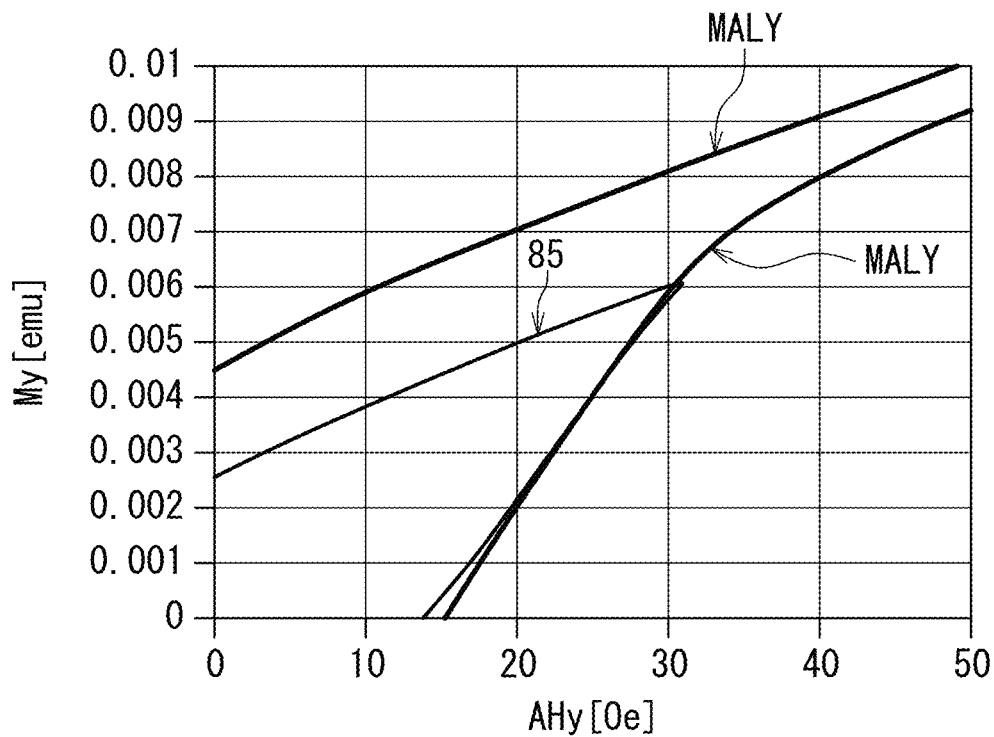
FIG. 29 is a characteristic chart showing an example of hysteresis loop when the maximum absolute value of the applied field strength is 31.6 Oe in the second case.
Figure 30:
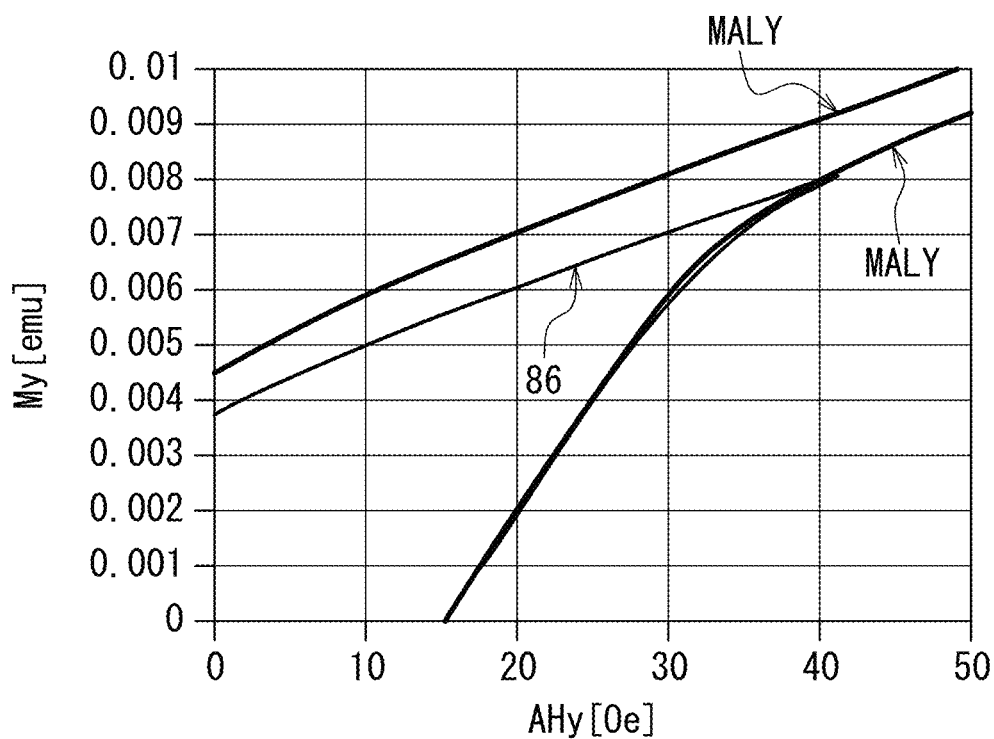
FIG. 30 is a characteristic chart showing an example of hysteresis loop when the maximum absolute value of the applied field strength is 42.1 Oe in the second case.

FIG. 25 shows an example of the hysteresis loop for an MHy of 10.2 Oe, denoted by the reference numeral 81. FIG. 26 shows an example of the hysteresis loop for an MHy of 17.4 Oe, denoted by the reference numeral 82. FIG. 27 shows an example of the hysteresis loop for an MHy of 21.6 Oe, denoted by the reference numeral 83. The hysteresis loop 83 is the same as the hysteresis loop 83 shown in FIGS. 10 and 11. FIG. 28 shows an example of the hysteresis loop for an MHy of 23.6 Oe, denoted by the reference numeral 84. FIG. 29 shows an example of the hysteresis loop for an MHy of 31.6 Oe, denoted by the reference numeral 85. FIG. 30 shows an example of the hysteresis loop for an MHy of 42.1 Oe, denoted by the reference numeral 86.

FIGS. 31 to 36 are characteristic charts showing examples of the hysteresis loops in the third case. In FIGS. 31 to 36, the horizontal axis represents the X-direction applied field strength AHx (Oe), and the vertical axis represents the X-direction magnetization-corresponding value Mx (emu). In FIGS. 31 to 36, the curve denoted by the symbol MALX is the major loop MALX. The major loop MALX is the same as that shown in FIGS. 12 and 13.

Figure 31:
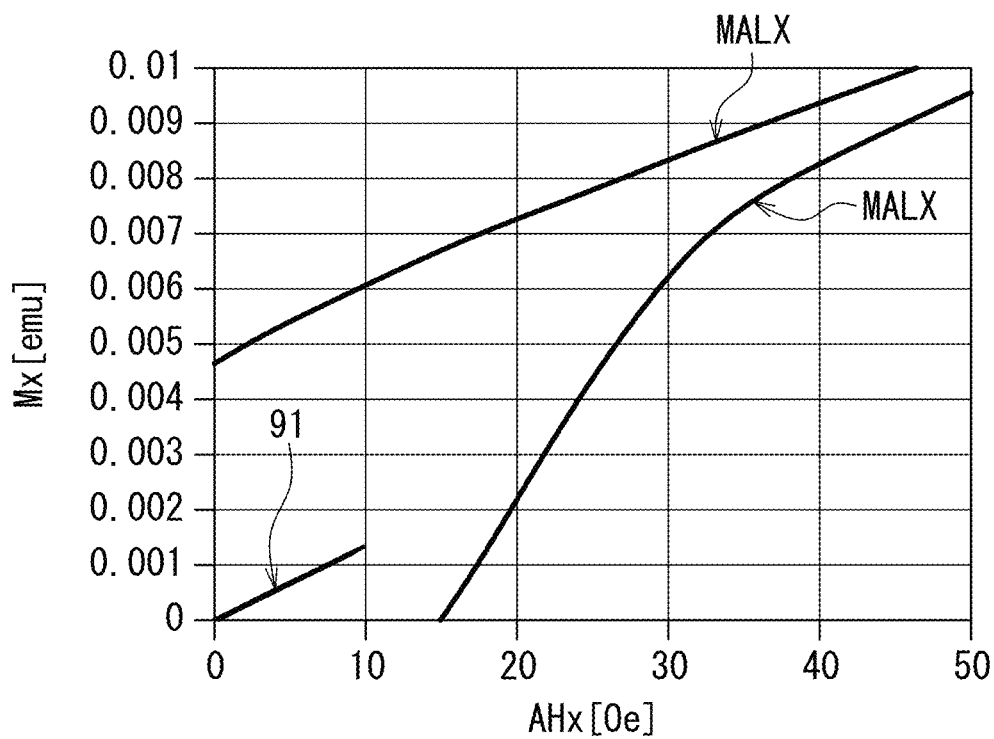
FIG. 31 is a characteristic chart showing an example of hysteresis loop when the maximum absolute value of the applied field strength is 10.3 Oe in the third case.
Figure 32:
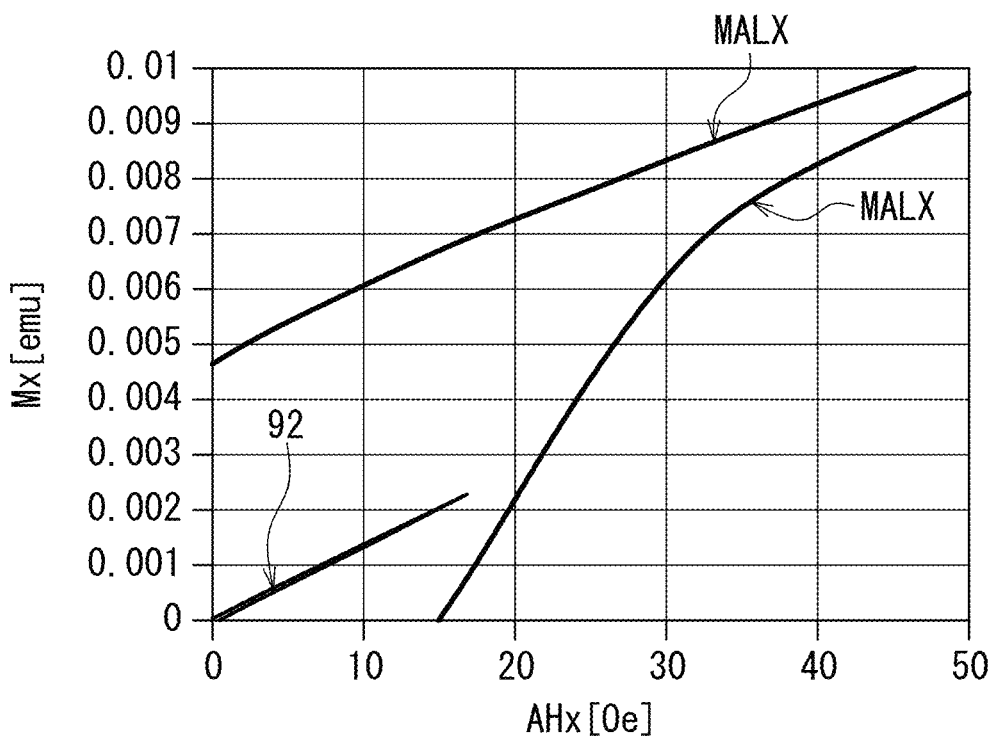
FIG. 32 is a characteristic chart showing an example of hysteresis loop when the maximum absolute value of the applied field strength is 17.5 Oe in the third case.
Figure 33:
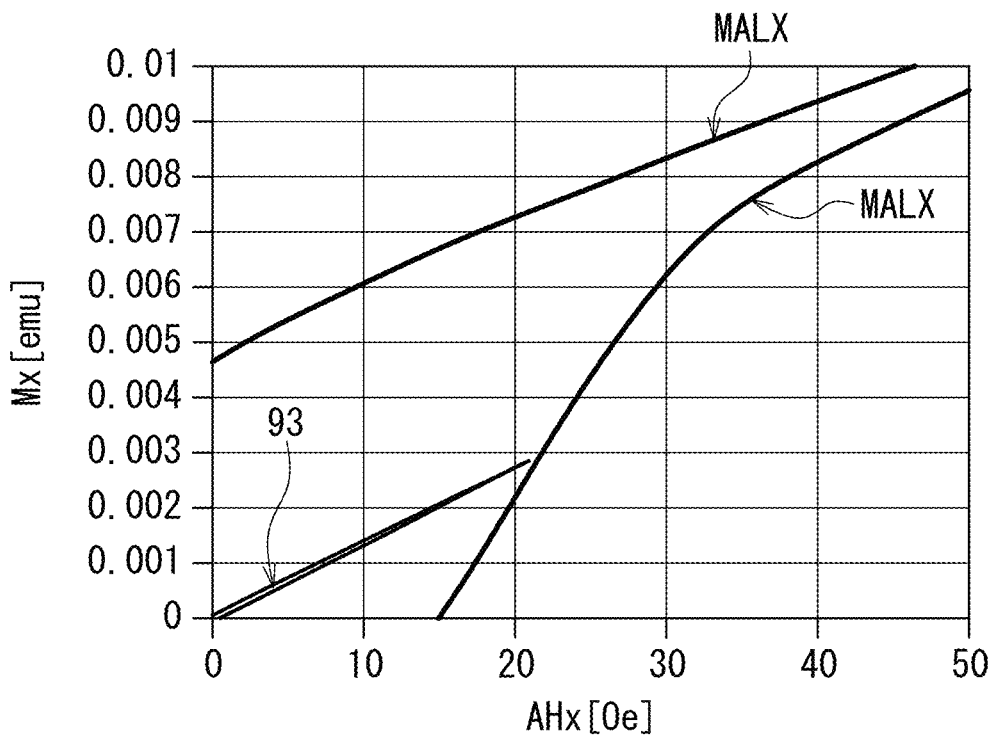
FIG. 33 is a characteristic chart showing an example of hysteresis loop when the maximum absolute value of the applied field strength is 21.6 Oe in the third case.
Figure 34:
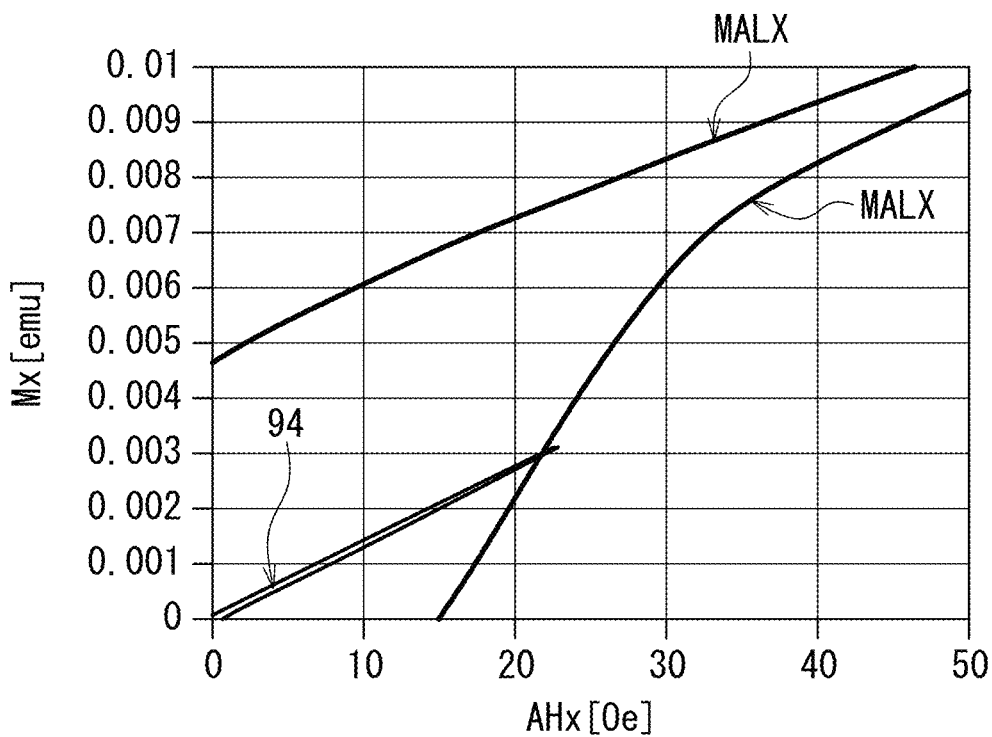
FIG. 34 is a characteristic chart showing an example of hysteresis loop when the maximum absolute value of the applied field strength is 23.7 Oe in the third case.
Figure 35:
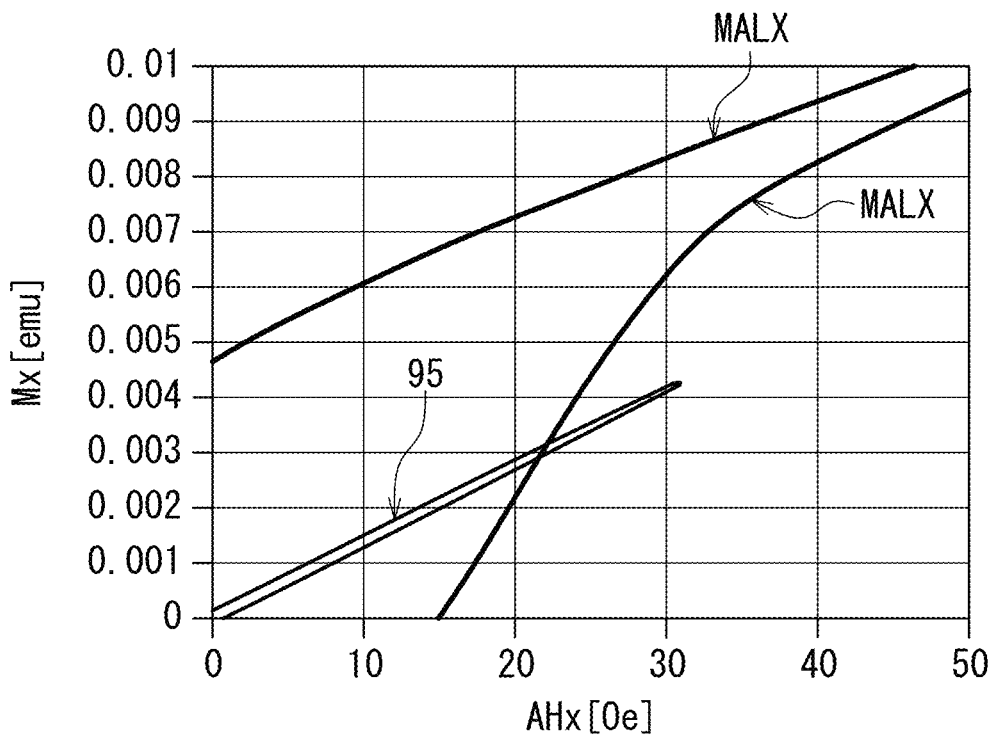
FIG. 35 is a characteristic chart showing an example of hysteresis loop when the maximum absolute value of the applied field strength is 31.6 Oe in the third case.
Figure 36:
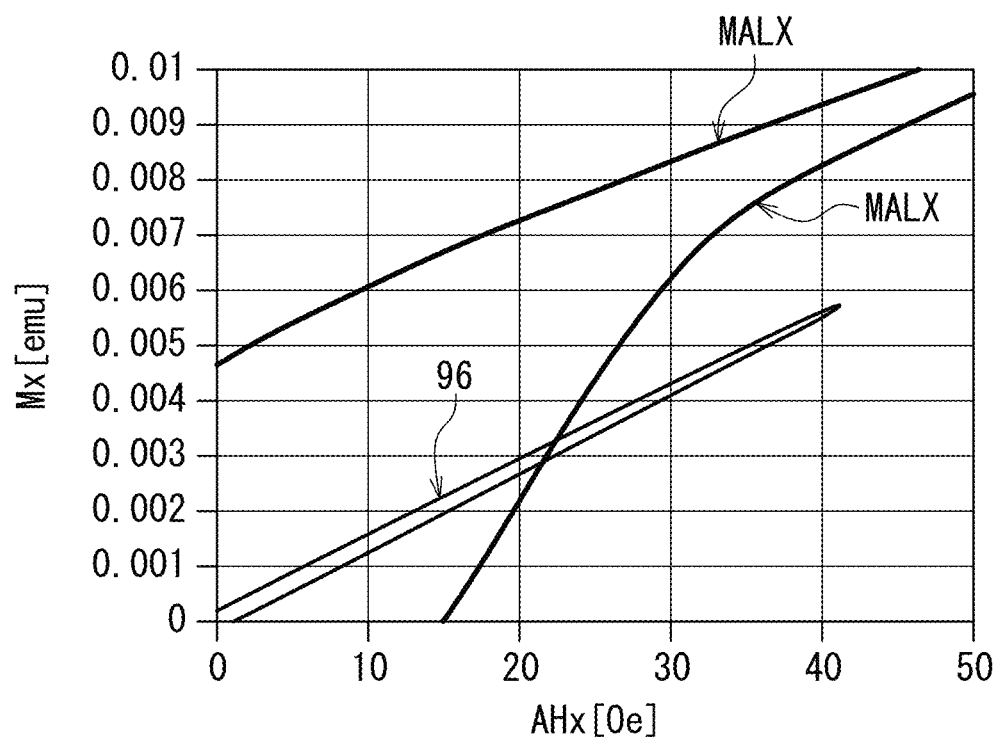
FIG. 36 is a characteristic chart showing an example of hysteresis loop when the maximum absolute value of the applied field strength is 42.1 Oe in the third case.

FIG. 31 shows an example of the hysteresis loop for an MHx of 10.3 Oe, denoted by the reference numeral 91. FIG. 32 shows an example of the hysteresis loop for an MHx of 17.5 Oe, denoted by the reference numeral 92. FIG. 33 shows an example of the hysteresis loop for an MHx of 21.6 Oe, denoted by the reference numeral 93. The hysteresis loop 93 is the same as the hysteresis loop 93 shown in FIGS. 12 and 13. FIG. 34 shows an example of the hysteresis loop for an MHx of 23.7 Oe, denoted by the reference numeral 94. FIG. 35 shows an example of the hysteresis loop for an MHx of 31.6 Oe, denoted by the reference numeral 95. FIG. 36 shows an example of the hysteresis loop for an MHx of 42.1 Oe, denoted by the reference numeral 96.

Figure 37:
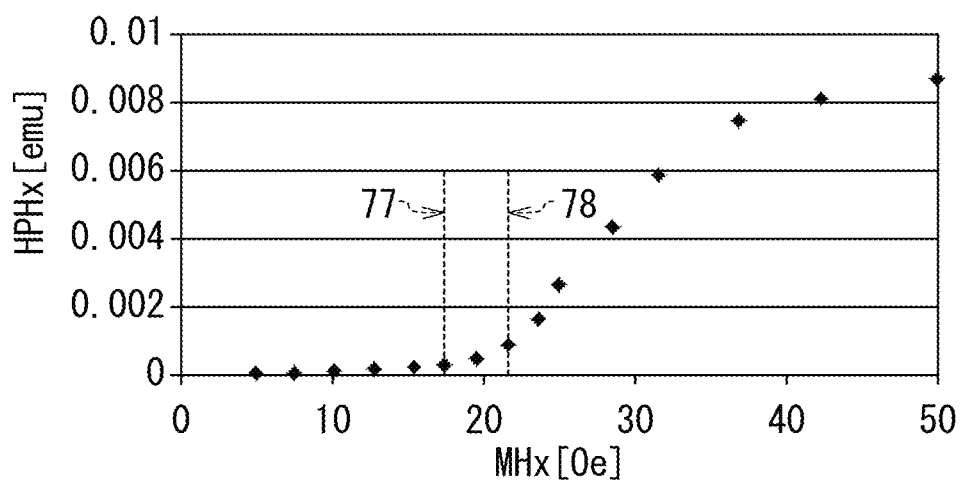
FIG. 37 is a characteristic chart showing a relationship between the maximum absolute value of the applied field strength and a magnetic hysteresis parameter in the first case.

FIG. 37 is a characteristic chart showing a relationship between MHx and the magnetic hysteresis parameter HPHx in the first case. In FIG. 37, the horizontal axis represents MHx (Oe), and the vertical axis represents the magnetic hysteresis parameter HPHx (emu). In FIG. 37, the broken line denoted by the reference numeral 77 indicates a position where MHx is 17.4 Oe. The broken line denoted by the reference numeral 78 indicates a position where MHx is 21.6 Oe.

Figure 38:
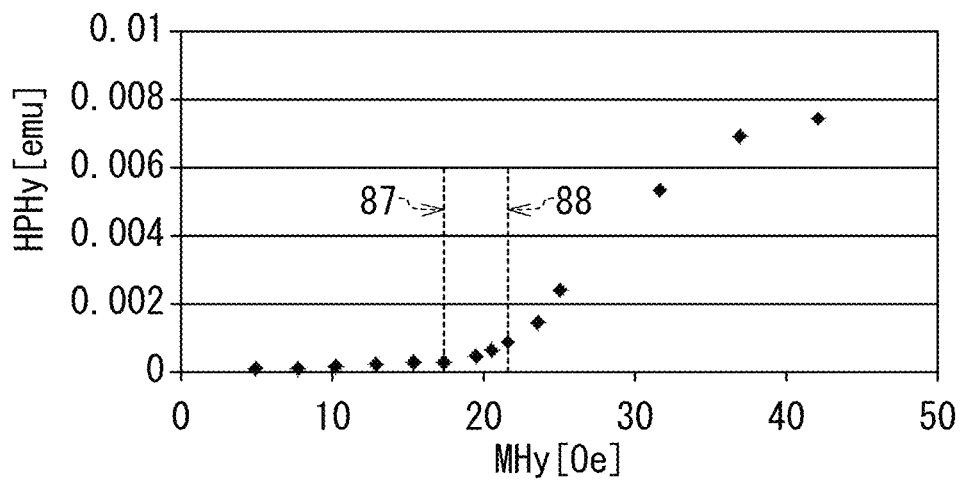
FIG. 38 is a characteristic chart showing a relationship between the maximum absolute value of the applied field strength and the magnetic hysteresis parameter in the second case.

FIG. 38 is a characteristic chart showing a relationship between MHy and the magnetic hysteresis parameter HPHy in the second case. In FIG. 38, the horizontal axis represents MHy (Oe), and the vertical axis represents the magnetic hysteresis parameter HPHy (emu). In FIG. 38, the broken line denoted by the reference numeral 87 indicates a position where MHy is 17.4 Oe. The broken line denoted by the reference numeral 88 indicates a position where MHy is 21.6 Oe.

Figure 39:
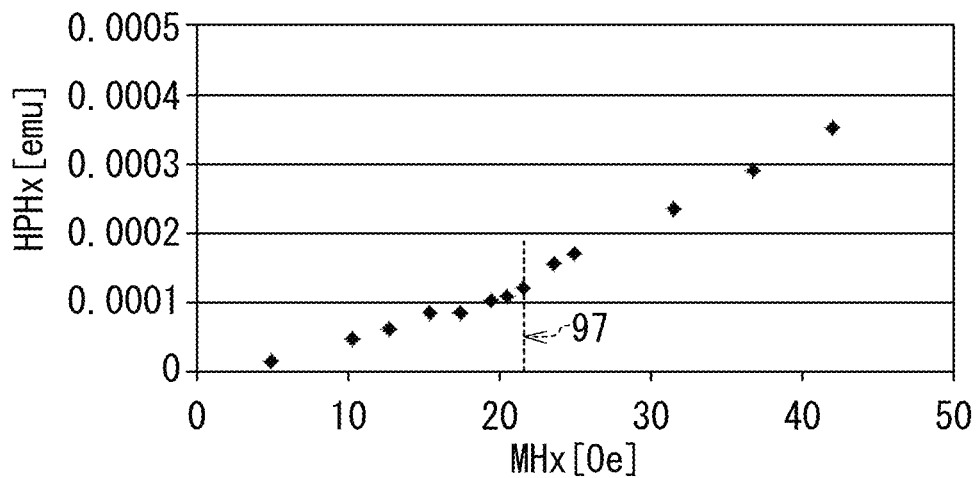
FIG. 39 is a characteristic chart showing a relationship between the maximum absolute value of the applied field strength and the magnetic hysteresis parameter in the third case.

FIG. 39 is a characteristic chart showing a relationship between MHx and the magnetic hysteresis parameter HPHx in the third case. In FIG. 39, the horizontal axis represents MHx (Oe), and the vertical axis represents the magnetic hysteresis parameter HPHx (emu). In FIG. 39, the broken line denoted by the reference numeral 97 indicates a position where MHx is 21.6 Oe.

Each of MHx and MHy will hereinafter be referred to as an upper limit value of the applied field strength. As shown in FIGS. 37 to 39, in all of the first to third cases the value of the magnetic hysteresis parameter tends to increase as the upper limit value of the applied field strength increases. In all of the first to third cases, the gradient of change in the value of the magnetic hysteresis parameter with respect to a change in the upper limit value of the applied field strength becomes large if the upper limit value of the applied field strength exceeds 21.6 Oe. In the third case, as shown in FIGS. 31 to 33, the hysteresis loop starting at a point on the initial magnetization curve is not in contact with the major loop MALX until the upper limit value of the applied field strength reaches 21.6 Oe. As shown in FIGS. 34 to 36, if the upper limit value of the applied field strength exceeds 21.6 Oe, the hysteresis loop starting at a point on the initial magnetization curve protrudes from the major loop MALX. Although not shown in the drawings, in the fourth case, the hysteresis loop starting at a point on the initial magnetization curve is not in contact with the major loop MALY, either, until the upper limit value of the applied field strength reaches 21.6 Oe. If the upper limit value of the applied field strength exceeds 21.6 Oe, the hysteresis loop starting at a point on the initial magnetization curve protrudes from the major loop MALY. In each of the first and second cases, the hysteresis loop starting at a point on the initial magnetization curve is not in contact with the major loop, either, until the upper limit value of the applied magnetic field strength reaches 21.6 Oe.

From the foregoing, it is considered that the value of the magnetic hysteresis parameter becomes especially large in all of the first to fourth cases if the upper limit value of the applied field strength reaches such a level that the hysteresis loop starting at a point on the initial magnetization curve comes into contact with or protrudes from the major loop in the third and fourth cases.

To reduce the value of the magnetic hysteresis parameter in all of the first to fourth cases, the upper limit value of the applied field strength is therefore preferably such that the hysteresis loop starting at a point on the initial magnetization curve makes no contact with the major loop in the third and fourth cases. Specifically, the upper limit value of the applied field strength is preferably less than or equal to 21.6 Oe.

From FIGS. 37 and 38, it is seen that the value of the magnetic hysteresis parameter is especially small if the upper limit value of the applied field strength is less than or equal to 17.4 Oe. The upper limit value of the applied field strength is therefore more preferably less than or equal to 17.4 Oe.

In the present embodiment, the upper limit value of the applied field strength corresponds to the upper limit value of the variable range of the strength of the external magnetic field. The upper limit value of the variable range is preferably such that the hysteresis loop starting at a point on the initial magnetization curve makes no contact with the major loop in the third and fourth cases. Specifically, the upper limit value of the variable range is preferably less than or equal to 21.6 Oe, more preferably less than or equal to 17.4 Oe. In other words, the variable range is preferably a range not more than 21.6 Oe in absolute value, more preferably a range not more than 17.4 Oe in absolute value.

If the external magnetic field consists only of the detection-target magnetic field Hx and the variable range satisfies the foregoing preferable condition, the coordinates (AHx, Mx) move within the region enclosed by the major loop MALX, along a minor loop not in contact with the major loop MALX. If the external magnetic field consists only of the detection-target magnetic field Hy and the variable range satisfies the foregoing preferable condition, the coordinates (AHy, My) moves within the region enclosed by the major loop MALY, along a minor loop not in contact with the major loop MALY.

Figure 40:
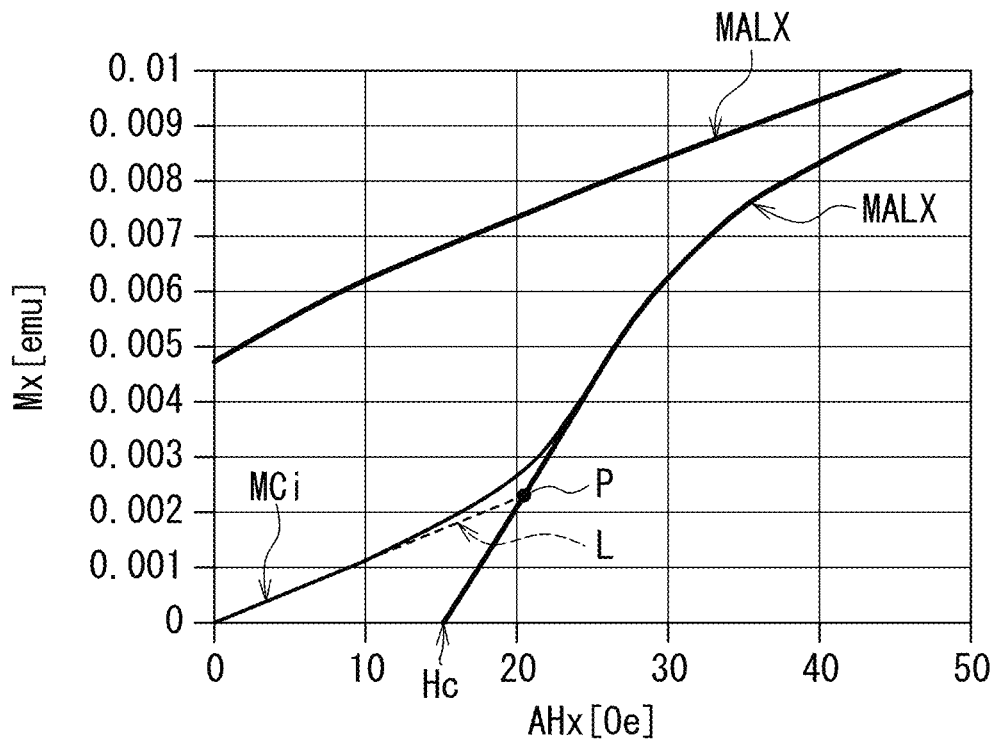
FIG. 40 is an explanatory diagram showing an example of methods for determining the upper limit value of the variable range of external magnetic field strength in the embodiment of the invention.

The upper limit value of the variable range of the strength of the external magnetic field may be determined by the following first method or second method. The first method will be described first, with reference to FIG. 40. In FIG. 40, the horizontal axis represents the X-direction applied field strength AHx (Oe), and the vertical axis represents the X-direction magnetization-corresponding value Mx (emu). The definition of positive and negative values of the X-direction applied field strength AHx and the definition of positive and negative values of the X-direction magnetization-corresponding value Mx are the same as in FIG. 7. In FIG. 40, the curve denoted by the symbol MALX represents the major loop. The curve denoted by the symbol MCi represents the initial magnetization curve in the first case.

In the first method, the initial magnetization curve MCi and the major loop MALX are obtained by varying the X-direction applied field strength AHx. Then, a tangent to the initial magnetization curve MCi at the point of origin is determined, and an intersection of the tangent and the major loop MALX is determined. In FIG. 40, the broken line denoted by the symbol L is the tangent to the initial magnetization curve MCi at the point of origin. The point denoted by the symbol P is the intersection of the tangent L and the major loop MALX. According to the first method, the X-direction applied field strength AHx at the intersection P is determined as the upper limit value of the variable range. As shown in FIG. 40, the upper limit value determined by the first method is close to the preferable value (21.6 Oe) of the upper limit value of the applied field strength obtained from the first experiment.

Next, the second method will be described with reference to FIG. 40. In the second method, a coercivity Hc obtained from the major loop MALX is determined as the upper limit value of the variable range. As shown in FIG. 40, the upper limit value determined by the second method is close to the more preferable value (17.4 Oe) of the upper limit value of the applied field strength obtained from the first experiment.

The effects of the magnetic sensor device 1 according to the present embodiment will now be described. In the magnetic sensor device 1 according to the present embodiment, when an external magnetic field including the detection-target magnetic field Hx is applied to the magnetic sensor 10, the external magnetic field is also applied to the soft magnetic structure 40. When an external magnetic field including the detection-target magnetic field Hy is applied to the magnetic sensor 20, the external magnetic field is also applied to the soft magnetic structure 40. When the soft magnetic structure 40 has a magnetization, a magnetic field based on the magnetization of the soft magnetic structure 40 is applied to the magnetic sensors 10 and 20.

In the present embodiment, if the soft magnetic structure 40 has a magnetic hysteresis characteristic, the magnetic hysteresis characteristic causes the detection values of the magnetic sensors 10 and 20 to have a hysteresis characteristic, and can thus cause a drop in the detection accuracy of the magnetic sensors 10 and 20. As described above, to minimize the drop in the detection accuracy of the magnetic sensors 10 and 20 due to the magnetic hysteresis characteristic of the soft magnetic structure 40, the values of the magnetic hysteresis parameters HPHx and HPHy are preferably as small as possible.

In the present embodiment, at least part of the soft magnetic structure 40 has a stripe domain structure. If the variable range of the strength of the external magnetic field is the foregoing preferable range, the magnetic hysteresis parameters HPHx and HPHy are smaller in value as compared with a case where the soft magnetic structure 40 has no stripe domains so that almost the entire soft magnetic structure 40 has a closure domain structure. This is because, in the stripe domain structure, if the applied field strength is somewhat small, a change in the magnetization-corresponding value in response to a change in the applied field strength involves no movement of the magnetic walls W or no rotation of the stripes.

Consequently, according to the present embodiment, a drop in the detection accuracy of the magnetic sensors 10 and 20 due to the magnetic hysteresis characteristic of the soft magnetic structure 40 can be reduced as compared with the case where the soft magnetic structure 40 has no stripe domains so that almost the entire soft magnetic structure 40 has a closure domain structure. Such an effect will be referred to as a first effect of the magnetic sensor device 1. The first effect is exhibited noticeably if the variable range of the strength of the external magnetic field is the foregoing preferable range.

Next, a second effect of the magnetic sensor device 1 will be described. To begin with, the sensitivities of the magnetic sensors 10 and 20 will be defined as follows. The sensitivity of the magnetic sensor 10 refers to the ratio of a change in the detection value Sx to an infinitesimal change in the strength of the detection-target magnetic field Hx. The sensitivity of the magnetic sensor 20 refers to the ratio of a change in the detection value Sy to an infinitesimal change in the strength of the detection-target magnetic field Hy. The sensitivity of the magnetic sensor 10 can vary depending on the strength of the detection-target magnetic field Hx. A change in the sensitivity of the magnetic sensor 10 in response to a change in the strength of the detection-target magnetic field Hx is preferably small. Similarly, the sensitivity of the magnetic sensor 20 can vary depending on the strength of the detection-target magnetic field Hy. A change in the sensitivity of the magnetic sensor 20 in response to a change in the strength of the detection-target magnetic field Hy is preferably small.

According to the present embodiment, if the variable range of the strength of the external magnetic field is the foregoing desirable range, a change in the sensitivity of the magnetic sensor 10 in response to a change in the strength of the detection-target magnetic field Hx and a change in the sensitivity of the magnetic sensor 20 in response to a change in the strength of the detection-target magnetic field Hy are made small. This is the second effect of the magnetic sensor device 1. The reason why the second effect can be obtained will be qualitatively described below.

As described above, if the variable range of the strength of the external magnetic field is the foregoing preferable range, in the orthogonal coordinate system having two orthogonal axes for representing the X-direction applied field strength AHx and the X-direction magnetization-corresponding value Mx, the coordinates (AHx, Mx) move along a minor loop not in contact with the major loop MALX. Here, the ratio of a change in the X-direction magnetization-corresponding value Mx to an infinitesimal change in the X-direction applied field strength AHx will be denoted by dMx/dAHx. The ratio dMx/dAHx corresponds to the gradient of the tangent to the minor loop at a point on the minor loop.

According to the present embodiment, when the soft magnetic structure 40 has a magnetization, a magnetic field based on the magnetization of the soft magnetic structure 40 is applied to the magnetic sensor 10. A change in the ratio dMx/dAHx thus affects the sensitivity of the magnetic sensor 10. More specifically, the greater the change in the ratio dMx/dAHx in response to a change in the strength of the detection-target magnetic field Hx, the greater the change in the sensitivity of the magnetic sensor 10 in response to the change in the strength of the detection-target magnetic field Hx.

In the present embodiment, the minor loop is closer to a straight line on the whole as compared with the major loop MALX. If a point on the minor loop moves, the gradient of the tangent to the minor loop at that point therefore does not change much. In other words, if the coordinates (AHx, Mx) move along the minor loop, the change in the ratio dMx/dAHx in response to a change in the strength of the detection-target magnetic field Hx is small. If the variable range of the strength of the external magnetic field is the foregoing preferable range, the change in the sensitivity of the magnetic sensor 10 in response to a change in the strength of the detection-target magnetic field Hx is smaller as compared with a case where the coordinates (AHx, Hx) move along the major loop MALX.

Similarly, if the variable range of the strength of the external magnetic field is the foregoing preferable range, a change in the sensitivity of the magnetic sensor 20 in response to a change in the strength of the detection-target magnetic field Hy is smaller as compared with a case where the coordinates (AHy, My) move along the major loop MALY.

Next, a description will be given of a relationship between the maximum absolute value MHx of the X-direction applied field strength AHx and an X-direction sensitivity change parameter, which was examined on the basis of the data on the first case obtained by the foregoing first experiment. The X-direction sensitivity change parameter will hereinafter be referred to as a parameter SVPx. The parameter SVPx indicates the magnitude of a change in the ratio dMx/dAHx when the coordinates (AHx, Mx) move along a minor loop.

For each MHx value in the first experiment, the value of the parameter SVPx was determined in the following manner. First, data on the coordinates (AHx, Mx) for an AHx of n Oe was extracted from the data on the hysteresis loop for each MHx value, where n is an integer greater than −MHx and less than MHx. For each pair of adjacent coordinates on the hysteresis loop with n values different by one, the absolute value of the difference in Mx was then determined. The absolute value of the difference in Mx corresponds to the ratio dMx/dAHx. A maximum value and a minimum value were then extracted from the absolute values of the differences in Mx of all the foregoing pairs, and a difference between the maximum and minimum values was determined as the value of the parameter SVPx.

Figure 41:
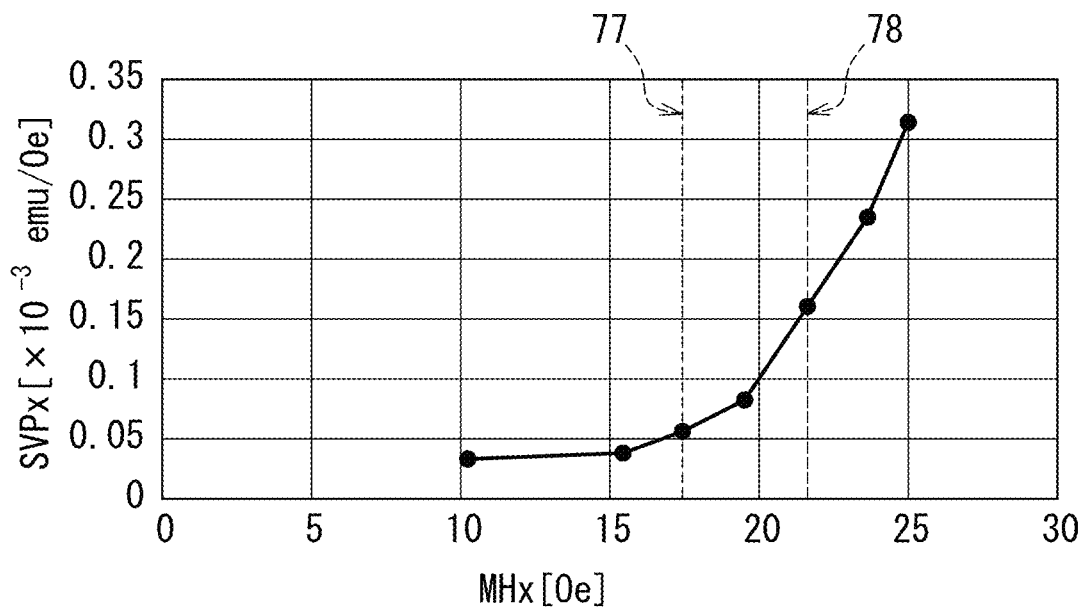
FIG. 41 is a characteristic chart showing a relationship between the maximum absolute value of the applied field strength and a sensitivity variation parameter in the first case.

FIG. 41 is a characteristic chart showing the relationship between MHx and the parameter SVPx. In FIG. 41, the horizontal axis represents MHx (Oe), and the vertical axis represents the parameter SVPx ($\times 10^{-3}$ emu/Oe). In FIG. 41, the broken line denoted by the reference numeral 77 indicates a position where MHx is 17.4 Oe. The broken line denoted by the reference numeral 78 indicates a position where MHx is 21.6 Oe.

Although not shown in FIG. 41, the value of the parameter SVPx for an MHx of 250 Oe is approximately $0.51 \times 10^{-3}$ emu/Oe. The value of the parameter SVPx for an MHx of 21.6 Oe is approximately 32% that of the parameter SVPx for an MHx of 250 Oe. The value of the parameter SVPx for an MHx of 17.4 Oe is approximately 11% that of the parameter SVPx for an MHx of 250 Oe.

From the foregoing results, it is seen that when the variable range of the strength of the external magnetic field is the foregoing preferable range, the value of the parameter SVPx is sufficiently smaller than in the case where the coordinates (AHx, Mx) move along the major loop MALX. From FIG. 41, it is seen that the value of the parameter SVPx is especially small if MHx is less than or equal to 17.4 Oe.

It is clear that if a Y-direction sensitivity change parameter is defined in the same manner as the X-direction sensitivity change parameter, a relationship between MHy and the Y-direction sensitivity change parameter in the second case is the same as the relationship between MHx and the parameter SVPx in the first case. Furthermore, from the shapes of the minor loops shown in FIGS. 31 to 36, it is clear that given the same MHx value, the value of the X-direction sensitivity change parameter in the third case is smaller than that in the first case. Similarly, it is clear that given the same MHy value, the value of the Y-direction sensitivity change parameter in the fourth case is smaller than that in the second case.

Next, the results of a second experiment will be described. The second experiment studied the first effect of the magnetic sensor device 1 according to the present embodiment. Prepared for the second experiment were a plurality of samples of each of first to third examples and a plurality of samples of a comparative example. All of these are samples of the magnetic sensor device 1. In the first to third examples, the soft magnetic structure 40 includes the soft magnetic layer 41 and does not include the soft magnetic layer 43. In the first to third examples, the soft magnetic layer 41 of the soft magnetic structure 40 is square in plane shape (the shape as viewed from above).

For the samples of the first to third examples, NiFe was used as the material of the soft magnetic layer 41. The Ni content was such that a stripe domain structure was formed. The Ni content was increased in order of the samples of the first example, the samples of the second example, and the samples of the third example. The samples of the first to third examples were subjected to alternating-current demagnetization in the X direction so that the stripe domain structure had a stripe direction parallel to the X direction.

The samples of the comparative example include a soft magnetic structure of the comparative example instead of the soft magnetic structure 40. The soft magnetic structure of the comparative example has the same configuration as that of the soft magnetic structure 40 in the samples of the first to third examples except the Ni content in the soft magnetic layer 41. In the samples of the comparative example, the Ni content of the soft magnetic layer 41 was made lower than in the samples of the first to third examples so that a closure domain structure was formed in the entire soft magnetic layer 41 without application of an external magnetic field. Because of its formation method, the soft magnetic layer 41 in the samples of the comparative example had an induced magnetic anisotropy with an easy axis of magnetization parallel to the X direction.

In the second experiment, the hysteresis parameters of the magnetic sensors 10 and 20 defined as described previously and a hysteresis parameter of the magnetic sensor 30 were determined. Specifically, in the second experiment, the hysteresis parameter of the magnetic sensor 10 was determined from the detection value Sx obtained with the strength of the detection-target magnetic field Hx varied after subjecting the soft magnetic structure 40 to alternating-current demagnetization in the X direction. The hysteresis parameter of the magnetic sensor 20 was determined from the detection value Sy obtained with the strength of the detection-target magnetic field Hy varied after subjecting the soft magnetic structure 40 to alternating-current demagnetization in the Y direction.

The hysteresis parameter of the magnetic sensor 30 was determined from the detection value Sz obtained with the strength of the detection-target magnetic field Hz varied after subjecting the soft magnetic structure 40 to alternating-current demagnetization. Specifically, the hysteresis parameter of the magnetic sensor 30 is a value determined as follows. The strength of the detection-target magnetic field Hz is set to a predetermined value Pz greater than 0, then decreased to −Pz, and then increased to 0. The detection value Sz at which the strength of the detection-target magnetic field Hz reaches 0 in the process of increasing is subtracted from the detection value Sz at which the strength of the detection-target magnetic field Hz reaches 0 in the process of decreasing. The resulting value is the hysteresis parameter of the magnetic sensor 30. In the second experiment, the direction of the alternating-current demagnetization in measuring the hysteresis parameter of the magnetic sensor 30 was set to be parallel to the direction of the output magnetic field component.

Hereinafter, the hysteresis parameter of the magnetic sensor 10 will be denoted by the symbol HPSx. The hysteresis parameter of the magnetic sensor 20 will be denoted by the symbol HPSy. The hysteresis parameter of the magnetic sensor 30 will be denoted by the symbol HPSz.

In the second experiment, the strengths of the external magnetic field and the detection-target magnetic fields Hx, Hy, and Hz were all varied without exceeding the preferable variable range of the strength of the external magnetic field. Specifically, in the second experiment, the hysteresis parameter HPSx was determined with the maximum absolute value Px of the strength of the detection-target magnetic field Hx in determining the hysteresis parameter HPSx set at 2 Oe, i.e., with the strength of the detection-target magnetic field Hx varied within the range of −2 Oe to 2 Oe. In the second experiment, the potential difference between the output terminals Vx+ and Vx− was converted into a numerical value representing a magnetic field strength, and the resulting value was used as the detection value Sx. Hereinafter, Oe will be used as the unit of the hysteresis parameter HPSx.

In the second experiment, the hysteresis parameter HPSy was determined with the maximum absolute value Py of the strength of the detection-target magnetic field Hy in determining the hysteresis parameter HPSy set at 2 Oe, i.e., with the strength of the detection-target magnetic field Hy varied within the range of −2 Oe to 2 Oe. In the second experiment, the potential difference between the output terminals Vy+ and Vy− was converted into a numerical value representing a magnetic field strength, and the resulting value was used as the detection value Sy. Hereinafter, Oe will be used as the unit of the hysteresis parameter HPSy.

In the second experiment, the hysteresis parameter HPSz was determined with the maximum absolute value Pz of the strength of the detection-target magnetic field Hz in determining the hysteresis parameter HPSz set at 2 Oe, i.e., with the strength of the detection-target magnetic field Hz varied within the range of −2 Oe to 2 Oe. In the second experiment, the potential difference between the output terminals Vz+ and Vz− was converted into a numerical value representing a magnetic field strength, and the resulting value was used as the detection value Sz. Hereinafter, Oe will be used as the unit of the hysteresis parameter HPSz.

Figure 42:
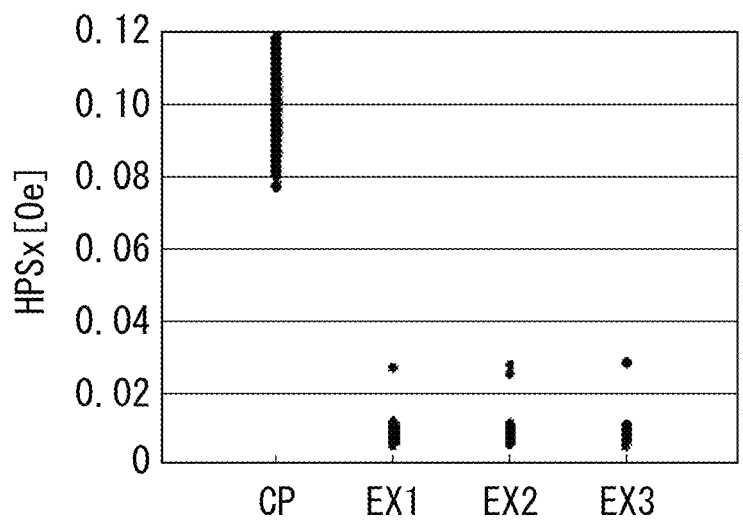
FIG. 42 is a characteristic chart showing experimental results on the magnetic sensor device according to the embodiment of the invention.
Figure 43:
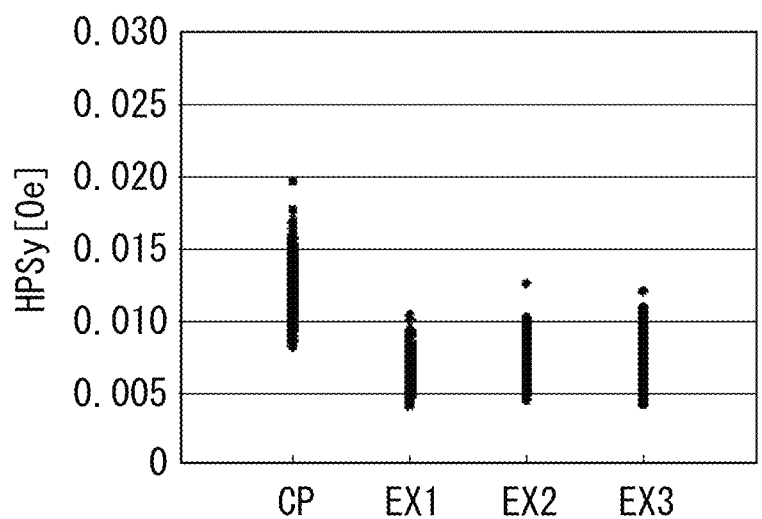
FIG. 43 is a characteristic chart showing experimental results on the magnetic sensor device according to the embodiment of the invention.
Figure 44:
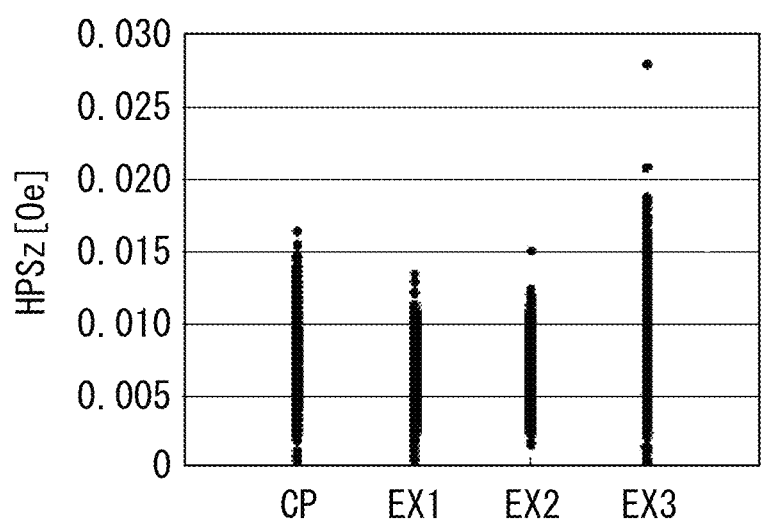
FIG. 44 is a characteristic chart showing experimental results on the magnetic sensor device according to the embodiment of the invention.

FIGS. 42 to 44 are characteristic charts showing the experimental results. The vertical axis in FIG. 42 represents the hysteresis parameter HPSx (Oe). The vertical axis in FIG. 43 represents the hysteresis parameter HPSy (Oe). The vertical axis in FIG. 44 represents the hysteresis parameter HPSz (Oe). In FIGS. 42 to 44, the reference symbol CP represents the samples of the comparative example, and the reference symbols EX1, EX2, and EX3 represent the samples of the first, second, and third examples, respectively.

As shown in FIG. 42, the distributions of the hysteresis parameters HPSx of the samples EX1, EX2, and EX3 of the first to third examples are closer to 0 than the distribution of the hysteresis parameters HPSx of the samples CP of the comparative example. It can thus be seen that the present embodiment is able to reduce a drop in the detection accuracy of the magnetic sensor 10 as compared with the case where the entire soft magnetic structure 40 has a closure domain structure.

Further, as shown in FIG. 43, the distributions of the hysteresis parameters HPSy of the samples EX1, EX2, and EX3 of the first to third examples are closer to 0 than the distribution of the hysteresis parameters HPSy of the samples CP of the comparative example. It can thus be seen that the present embodiment is able to reduce a drop in the detection accuracy of the magnetic sensor 20 as compared with the case where the entire soft magnetic structure 40 has a closure domain structure.

As shown in FIG. 44, there was no significant difference between the distributions of the hysteresis parameters HPSz of the samples EX1, EX2, and EX3 of the first to third examples and the distribution of the hysteresis parameters HPSz of the samples CP of the comparative example.

As shown in FIGS. 42 and 43, for the samples CP of the comparative example, the distribution of the hysteresis parameters HPSy is closer to 0 than the distribution of the hysteresis parameters HPSx. The reason is that in the samples CP of the comparative example, the magnetic hysteresis parameter in the direction of the hard axis of magnetization, i.e., in a direction parallel to the Y direction, is small in value. If the entire soft magnetic structure 40 has a closure domain structure and also a uniaxial magnetic anisotropy, the magnetic hysteresis parameter of the soft magnetic structure 40 in the direction of the hard axis of magnetization becomes small in value. On the other hand, the magnetic hysteresis parameter of the soft magnetic structure 40 in the direction of the easy axis of magnetization becomes large in value. Accordingly, as shown in FIG. 42, the hysteresis parameters HPSx of the samples CP of the comparative example are large. Thus, if the entire soft magnetic structure 40 has a closure domain structure, a drop in the detection accuracy of both of the magnetic sensors 10 and 20 could not be prevented by providing the soft magnetic structure 40 with a uniaxial magnetic anisotropy.

In contrast, in the first to third examples EX1, EX2, and EX3, both the hysteresis parameters HPSx and HPSy are small. Such a result indicates that according to the present embodiment, a drop in the detection accuracy of both of the magnetic sensors 10 and 20 can be prevented by the soft magnetic structure 40 having a stripe domain structure.

The present invention is not limited to the foregoing embodiment, and various modifications may be made thereto. The first magnetic sensor and the soft magnetic structure of the present invention may be any ones that satisfy the requirements of the appended claims. For example, the soft magnetic structure is not limited to one having the function relating to the magnetic sensor 30 such as the magnetic field converter 42 and the soft magnetic layers 41 and 43 of the embodiment, but may be one having a different function, or may be a structure that simply satisfies the requirements of the appended claims.

Obviously, many modifications and variations of the present invention are possible in the light of the above teachings. Thus, it is to be understood that, within the scope of the appended claims and equivalents thereof, the invention may be practiced in other embodiments than the foregoing most preferable embodiment.

What is claimed is:

1. A magnetic sensor device comprising:
    a first magnetic sensor configured to generate a first detection value corresponding to a first detection-target magnetic field, the first detection-target magnetic field being a component of an external magnetic field and is in a direction parallel to a first direction;
    a second magnetic sensor configured to generate a second detection value corresponding to a second detection-target magnetic field, the second detection-target magnetic field being a component of the external magnetic field and is in a direction parallel to a second direction; and
    a soft magnetic structure composed of a soft magnetic material, the soft magnetic structure being arranged not to overlap the first magnetic sensor but to overlap the second magnetic sensor as viewed in a direction parallel to the second direction,
    wherein the first magnetic sensor and the soft magnetic structure are configured so that when the soft magnetic structure has a magnetization, a magnetic field based on the magnetization of the soft magnetic structure is applied to the first magnetic sensor, and
    at least part of the soft magnetic structure has a stripe domain structure.

2. The magnetic sensor device according to claim 1, wherein the first direction and the second direction are orthogonal to each other.

3. The magnetic sensor device according to claim 1, wherein
    the soft magnetic structure includes a magnetic field converter configured to receive the second detection-target magnetic field and output an output magnetic field component that is in a direction intersecting the second direction,
    the output magnetic field component has a strength having a correspondence with a strength of the second detection-target magnetic field, and
    the second magnetic sensor is configured to detect the strength of the output magnetic field component.

4. The magnetic sensor device according to claim 3, wherein the soft magnetic structure further includes at least one soft magnetic layer.

5. The magnetic sensor device according to claim 1, further comprising a third magnetic sensor for generating a third detection value corresponding to a third detection-target magnetic field, wherein
    the third detection-target magnetic field is a component of the external magnetic field and is in a direction parallel to a third direction, and
    the third magnetic sensor and the soft magnetic structure are configured so that when the soft magnetic structure has a magnetization, a magnetic field based on the magnetization of the soft magnetic structure is applied to the third magnetic sensor.

6. The magnetic sensor device according to claim 5, wherein the first to third directions are orthogonal to each other.

7. The magnetic sensor device according to claim 1, wherein the first magnetic sensor and the soft magnetic structure are configured so that when an external magnetic field including the first detection-target magnetic field is applied to the first magnetic sensor, the external magnetic field is also applied to the soft magnetic structure, the external magnetic field has a strength varying within a predetermined variable range, and in an orthogonal coordinate system having two orthogonal axes for representing an applied field strength and a magnetization-corresponding value, coordinates representing the applied field strength and the magnetization-corresponding value move within a region enclosed by a major loop as the strength of the external magnetic field varies within the predetermined variable range, where the applied field strength is a strength of a magnetic field applied to the soft magnetic structure in a direction parallel to a predetermined direction, the magnetization-corresponding value is a value corresponding to a component of the magnetization of the soft magnetic structure, the component being in the direction parallel to the predetermined direction, and the major loop is, among loops traced by a path of the coordinates representing the applied field strength and the magnetization-corresponding value in the orthogonal coordinate system as the applied field strength is varied, a loop that is the largest in terms of area of the region enclosed by the loop.

8. The magnetic sensor device according to claim 7, wherein the predetermined variable range is a range not more than 21.6 Oe in absolute value.

9. A magnetic sensor device comprising:

a first magnetic sensor for generating a first detection value corresponding to a first detection-target magnetic field; and a soft magnetic structure formed of a soft magnetic material, wherein the first magnetic sensor and the soft magnetic structure are configured so that when the soft magnetic structure has a magnetization, a magnetic field based on the magnetization of the soft magnetic structure is applied to the first magnetic sensor, at least part of the soft magnetic structure has a stripe domain structure that includes first and second types of domains that are both slender and are alternately arranged, and in the soft magnetic structure with no magnetic field applied thereto, a spontaneous magnetization of the first type of domain and a spontaneous magnetization of the second type of domain contain components in mutually opposite directions.

* * * * *